United States Patent
Jang et al.

(10) Patent No.: US 9,343,475 B2
(45) Date of Patent: May 17, 2016

(54) VERTICAL MEMORY DEVICES AND METHODS OF MANUFACTURING THE SAME

(71) Applicants: Kyung-Tae Jang, Seoul (KR); Sang-Hoon Lee, Seongnam-si (KR); Ji-Youn Seo, Gunpo-si (KR); Hyun-Yong Go, Suwon-si (KR); Koong-Hyun Nam, Anyang-si (KR); Ju-Wan Kim, Seongnam-si (KR); Seung-Mok Shin, Yongin-si (KR); Myoung-Bum Lee, Seoul (KR); Ji-Woon Im, Seoul (KR); Tae-Jong Han, Seoul (KR)

(72) Inventors: Kyung-Tae Jang, Seoul (KR); Sang-Hoon Lee, Seongnam-si (KR); Ji-Youn Seo, Gunpo-si (KR); Hyun-Yong Go, Suwon-si (KR); Koong-Hyun Nam, Anyang-si (KR); Ju-Wan Kim, Seongnam-si (KR); Seung-Mok Shin, Yongin-si (KR); Myoung-Bum Lee, Seoul (KR); Ji-Woon Im, Seoul (KR); Tae-Jong Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/155,842

(22) Filed: Jan. 15, 2014

(65) Prior Publication Data

US 2015/0200203 A1 Jul. 16, 2015

(30) Foreign Application Priority Data

Jan. 15, 2013 (KR) ........................ 10-2013-0004193

(51) Int. Cl.
*H01L 21/336* (2006.01)
*H01L 27/115* (2006.01)
*H01L 21/28* (2006.01)

(52) U.S. Cl.
CPC .... *H01L 27/11582* (2013.01); *H01L 21/28282* (2013.01); *H01L 27/1157* (2013.01)

(58) Field of Classification Search
None
See application file for complete search history.

(56) References Cited

U.S. PATENT DOCUMENTS

| 7,994,011 B2 | 8/2011 | Park et al. |
| 2010/0059811 A1 | 3/2010 | Sekine et al. |
| 2011/0073866 A1 | 3/2011 | Kim et al. |
| 2011/0085377 A1 | 4/2011 | Mizukami et al. |
| 2011/0151667 A1 | 6/2011 | Hwang et al. |
| 2011/0186851 A1 | 8/2011 | Son et al. |
| 2011/0199813 A1 | 8/2011 | Yoo et al. |
| 2011/0233648 A1 | 9/2011 | Seol et al. |

*Primary Examiner* — Sonya D McCall Shepard
(74) *Attorney, Agent, or Firm* — Myers Bigel & Sibley, P.A.

(57) ABSTRACT

In a method of a vertical memory device, insulation layers and sacrificial layers are alternately and repeatedly formed on a substrate. A hole is formed through the insulation layers and the sacrificial layers that expose a top surface of the substrate. Then, an interior portion of the hole may be enlarged. A semiconductor pattern is formed to partially fill the enlarged portion of the hole. A blocking layer, a charge storage layer and a tunnel insulation layer may be formed on a sidewall of the hole and the semiconductor pattern. Then, the tunnel insulation layer, the charge storage layer and the blocking layer are partially removed to expose a top surface of the semiconductor pattern. A channel is formed on the exposed top surface of the semiconductor pattern and the tunnel insulation layer. The sacrificial layers are replaced with gate electrodes.

15 Claims, 39 Drawing Sheets

VERTICAL MEMORY DEVICES AND METHODS OF MANUFACTURING THE SAME

CROSS-REFERENCE TO RELATED APPLICATION

This application claims priority under 35 USC §119 to Korean Patent Application No. 10-2013-0004193 filed on Jan. 15, 2013 in the Korean Intellectual Property Office (KIPO), the disclosure of which is incorporated herein by reference in its entirety.

BACKGROUND

1. Field

The present inventive concepts relate to vertical memory devices and methods of manufacturing the same. More particularly, the inventive concepts relate to non-volatile memory devices including vertical channels and methods of manufacturing the same.

2. Description of the Related Art

In some processes for forming a vertical non-volatile memory device, an alternating stack of insulation layers and sacrificial layers may be formed on a substrate, and a hole may be formed through the insulation layers and the sacrificial layers. A lower portion of an oxide/nitride/oxide (ONO) layer on an inner wall of the hole may be etched to expose a top surface of the substrate, and a channel may be formed thereon. Due to the high aspect ratio of the hole, exposing the top surface of the substrate is not easy, and the channel may not be electrically connected to the substrate. Additionally, the sidewall of the ONO layer may be damaged when the lower portion thereof is etched. Thus, methods of forming a vertical non-volatile memory device in which a channel and a substrate are electrically connected to each other and an ONO layer is not damaged are needed.

SUMMARY

Example embodiments provide a method of manufacturing a vertical memory device having good characteristics.

Example embodiments provide a vertical memory device having good characteristics.

According to example embodiments, there is provided a method of manufacturing a vertical memory device. In the method, a plurality of alternating insulation layers and sacrificial layers may be formed on a substrate. A hole may be formed through the insulation layers and the sacrificial layers that expose a top surface of the substrate. An interior portion of the hole may be enlarged. A semiconductor pattern may be formed to partially fill the enlarged portion of the hole. A blocking layer, a charge storage layer and a tunnel insulation layer may be formed on a sidewall of the hole and the semiconductor pattern. The tunnel insulation layer, the charge storage layer and the blocking layer may be removed partially to expose a top surface of the semiconductor pattern. A channel may be formed on the exposed top surface of the semiconductor pattern and the tunnel insulation layer. The sacrificial layers may be replaced with a gate electrode.

In example embodiments, when the insulation layers and the sacrificial layers are formed, a first plurality of first insulation layers and first sacrificial layers may be formed alternately and repeatedly on the substrate, and at least one second insulation layer and at least one second sacrificial layer may be formed on an uppermost one of the first insulation layers and the first sacrificial layers. Additionally, a second plurality of first insulation layers and first sacrificial layers may be formed alternately and repeatedly on an uppermost one of the second insulation layer and the second sacrificial layer.

In example embodiments, the first insulation layers and the first sacrificial layers may comprise silicon oxide and silicon nitride, respectively, and the second insulation layer and the second sacrificial layer may comprise doped silicon oxide and doped silicon nitride, respectively.

In example embodiments, the first insulation layers may comprise one of plasma enhanced tetraethyl ortho silicate (PE-TEOS), a high density plasma (HDP) oxide and plasma enhanced oxide (PEOX), and the second insulation layer is formed to include one of boro tetraethyl orthosillicate (BTEOS), phosphorous tetraethyl orthosilicate (PTEOS), boro phospho tetraethyl orthosilicate (BPTEOS), boro silicate glass (BSG), phospho silicate glass (PSG) and boro phospho silicate glass (BPSG).

In example embodiments, the first and second insulation layers may comprise silicon oxide doped with impurities, and the second insulation layer may have a doping concentration higher than that of the first insulation layer.

In example embodiments, the first and second sacrificial layers may comprise silicon nitride, and the second sacrificial layer may have a nitride concentration higher than that of the first sacrificial layers.

In example embodiments, the first and second sacrificial layers may comprise silicon nitride doped with impurities, and the second sacrificial layer may have a doping concentration higher than that of the first sacrificial layers.

In example embodiments, the second insulation layer and the second sacrificial layer may be formed at temperatures lower than temperatures at which the first insulation layer and the first sacrificial layers are formed.

In example embodiments, an wet etch process may comprise enlarge the portion of the hole, and the first insulation layer and the first sacrificial layer may have wet etching rates higher than wet etching rates of the second insulation layer and the second sacrificial layer, respectively.

In example embodiments, when the tunnel insulation layer, the charge storage layer and the blocking layer may be partially removed to expose the top surface of the semiconductor pattern, a first channel layer, an etch stop layer and a spacer layer may be formed sequentially on the tunnel insulation layer, and the spacer layer may be etched anisotropically to form a spacer. The etch stop layer and the first channel layer may be etched using the spacer as an etch mask to expose a portion of the tunnel insulation layer, and the exposed portion of the tunnel insulation layer and a portion of the charge storage layer therebeneath may be wet etched to expose a portion of the blocking layer. Additionally, the exposed portion of the blocking layer may be wet etched to expose the top surface of the semiconductor pattern.

In example embodiments, when the exposed portion of the tunnel insulation layer and the portion of the charge storage layer therebeneath are wet etched, the spacer may be removed to expose the etch stop layer, and when the exposed portion of the blocking layer is wet etched, the exposed etch stop layer may be removed to expose the first channel layer.

In example embodiments, when the channel is formed on the exposed top surface of the semiconductor pattern and the tunnel insulation layer, a second channel layer including a material substantially the same as that of the first channel layer may be formed on the exposed top surface of the semiconductor pattern and the exposed first channel layer.

In example embodiments, when the insulation layers and the sacrificial layers are formed on the substrate, a first plurality of first insulation layers and first sacrificial layers may be formed alternately and repeatedly on the substrate, a second insulation layer may be formed on an uppermost one of the first sacrificial layers, and a second plurality of first sacrificial layers and first insulation layers may be formed alternately and repeatedly on the second insulation layer.

In example embodiments, when the semiconductor pattern is formed, a selective epitaxial growth (SEG) process may be performed using the exposed top surface of the substrate as a seed to form the semiconductor pattern having a top surface located in the enlarged portion of the hole.

According to other example embodiments, there is provided a vertical memory device. The vertical memory device comprises insulation layer patterns, gate electrodes, a semiconductor pattern, a blocking layer pattern, a charge storage layer pattern, a tunnel insulation layer pattern, and a channel. The insulation layer patterns and the gate electrodes may be alternately and repeatedly stacked on a substrate. The semiconductor pattern may be formed in a lower portion of a hole that extends through the insulation layer patterns and the gate electrodes, the hole may have a portion that extends horizontally, and the semiconductor pattern may have a top surface located in the horizontally extended portion of the hole. The blocking layer pattern, the charge storage layer pattern and the tunnel insulation layer pattern may be sequentially stacked on a portion of the top surface of the semiconductor pattern and a sidewall of the hole. The channel may be on the tunnel insulation layer pattern, and may contact a portion of the top surface of the semiconductor pattern in the hole.

According to other example embodiments, there is provided a method of manufacturing a vertical memory device. In the method, a plurality of alternating insulation layers and sacrificial layers may be formed on a substrate. A hole may be formed through the insulation layers and the sacrificial layers exposing a top surface of the substrate. An interior portion of the hole may be enlarged. A semiconductor pattern may be formed in the enlarged portion of the hole. An insulation layer may be formed on a sidewall of the hole and the semiconductor pattern. The insulation layer may be removed partially to expose a top surface of the semiconductor pattern. A semiconductor region may be formed on the exposed top surface of the semiconductor pattern and the insulation layer.

BRIEF DESCRIPTION OF THE DRAWINGS

Example embodiments will be more clearly understood from the following detailed description taken in conjunction with the accompanying drawings.

FIG. 1 is a perspective diagram illustrating a vertical memory device in accordance with example embodiments, FIG. 2 is a vertical cross-sectional view of the semiconductor device in FIG. 1, and FIG. 3 is a local perspective diagram of the semiconductor device in FIG. 1;

FIGS. 4 to 22 are vertical cross-sectional views illustrating methods of manufacturing a vertical memory device in accordance with example embodiments;

FIG. 23 is a vertical cross-sectional view illustrating a vertical memory device in accordance with example embodiments;

FIGS. 24 to 26 are vertical cross-sectional views illustrating methods of manufacturing a vertical memory device in accordance with example embodiments;

FIG. 27 is a vertical cross-sectional view illustrating a vertical memory device in accordance with example embodiments;

FIG. 28 is a vertical cross-sectional view illustrating methods of manufacturing a vertical memory device in accordance with example embodiments;

FIG. 29 is a vertical cross-sectional view illustrating a vertical memory device in accordance with example embodiments;

FIG. 30 is a vertical cross-sectional view illustrating methods of manufacturing a vertical memory device in accordance with example embodiments;

FIG. 31 is a vertical cross-sectional view illustrating a vertical memory device in accordance with example embodiments;

FIG. 32 is a vertical cross-sectional view illustrating methods of manufacturing a vertical memory device in accordance with example embodiments;

FIG. 33 is a vertical cross-sectional view illustrating a vertical memory device in accordance with example embodiments;

FIG. 34 is a vertical cross-sectional view illustrating methods of manufacturing a vertical memory device in accordance with example embodiments;

FIG. 35 is a vertical cross-sectional view illustrating a vertical memory device in accordance with example embodiments;

FIG. 36 is a vertical cross-sectional view illustrating methods of manufacturing a vertical memory device in accordance with example embodiments;

FIG. 37 is a vertical cross-sectional view illustrating a vertical memory device in accordance with example embodiments;

FIG. 38 is a vertical cross-sectional view illustrating methods of manufacturing a vertical memory device in accordance with example embodiments;

FIG. 39 is a vertical cross-sectional view illustrating a vertical memory device in accordance with example embodiments, and;

FIG. 40 is a vertical cross-sectional view illustrating methods of manufacturing a vertical memory device in accordance with example embodiments;

DETAILED DESCRIPTION

Figure 1:
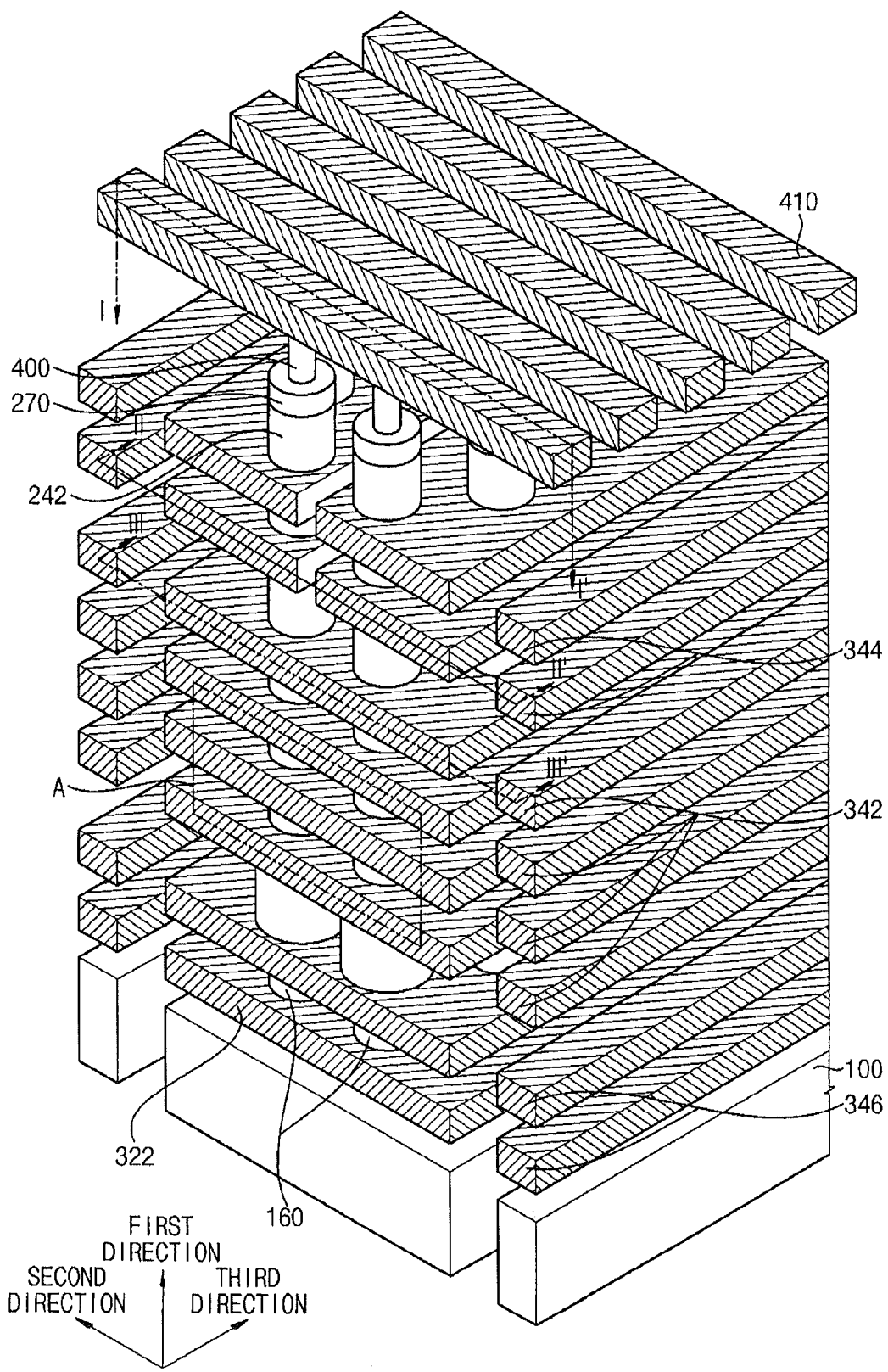
FIGS. 1-40 represent non-limiting, example embodiments as described herein.

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 2:
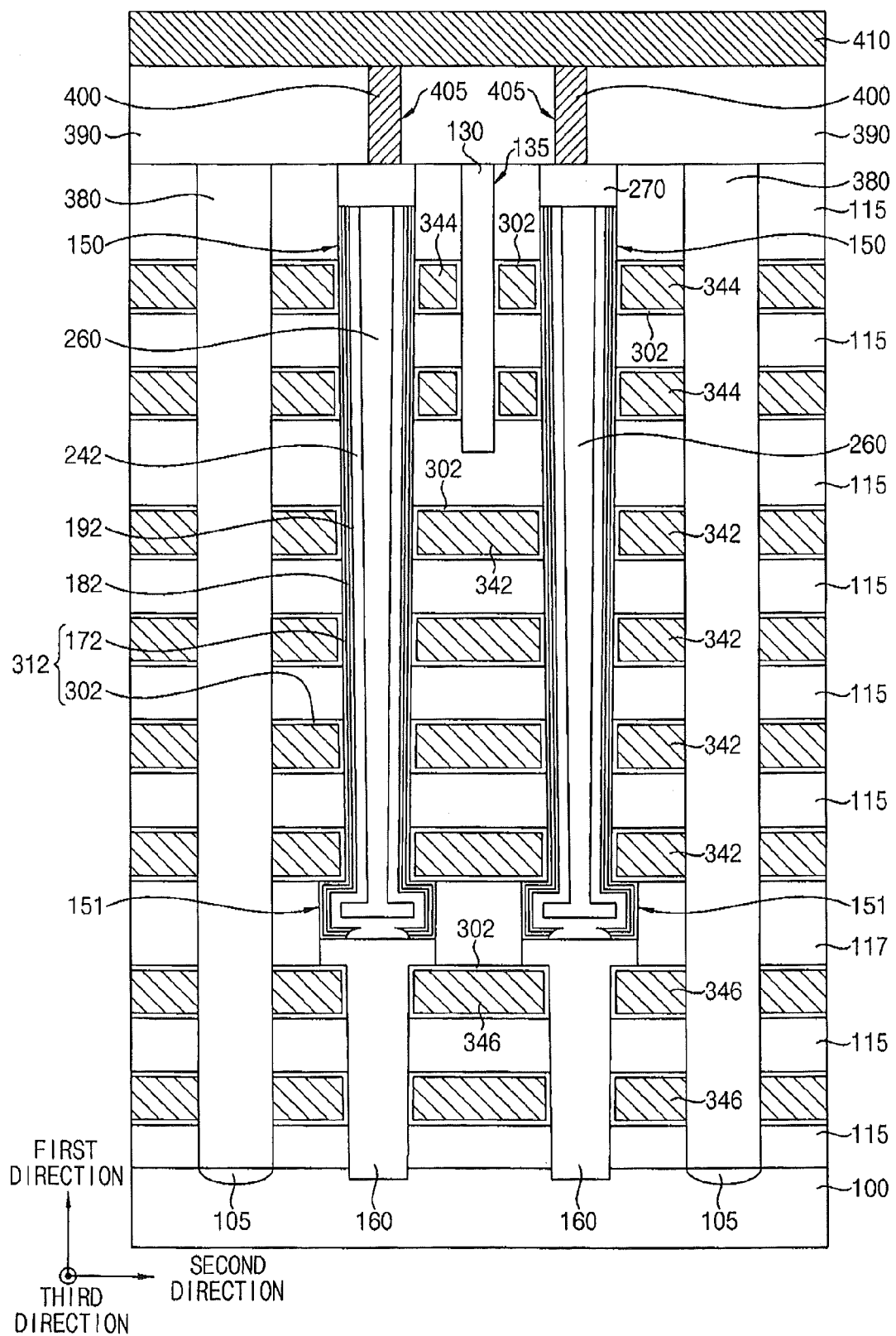
Figure 3:
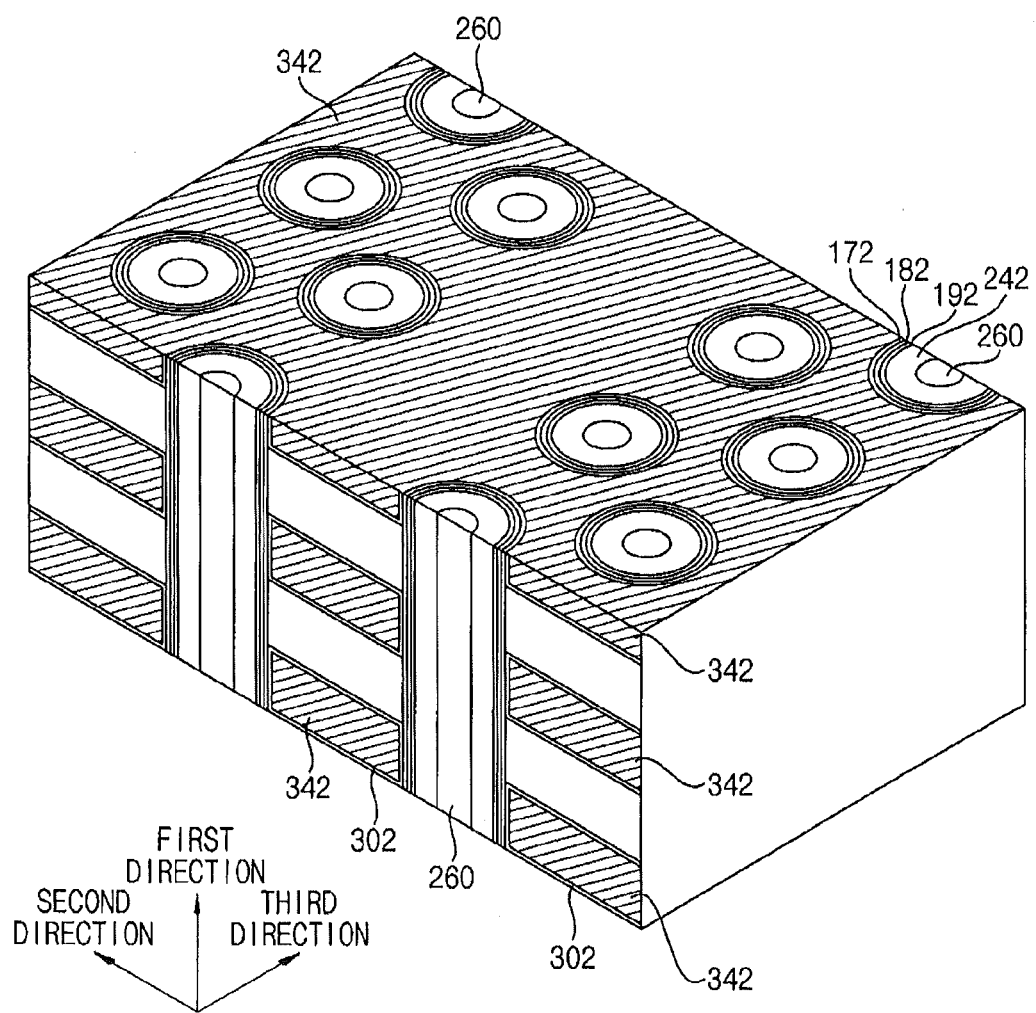

FIG. 1 is a perspective diagram illustrating a vertical memory device in accordance with example embodiments, FIG. 2 is a vertical cross-sectional view of the vertical memory device in FIG. 1, and FIG. 3 is a local perspective diagram of the vertical memory device. In particular, FIG. 2 is a cross-sectional view of the semiconductor device cut along the line I-I' in FIG. 1, and FIG. 3 is a local perspective diagram of a region A of the semiconductor device in FIG. 1.

For the convenience of the explanation, FIG. 1 does not show all elements of the semiconductor device, but only shows some elements thereof, e.g., a substrate, a semiconductor pattern, a channel, a gate electrode, a pad, a bit line contact, and a bit line, etc. In all figures in this specification, a direction substantially perpendicular to a top surface of the substrate is referred to as a first direction, and two directions substantially parallel to the top surface of the substrate and substantially perpendicular to each other are referred to as a second direction and a third direction. Additionally, a direction indicated by an arrow in the figures and a reverse direction thereto are considered as the same direction. The definition of the direction mentioned above is identical in all figures.

Referring to FIGS. 1 to 3, the vertical memory device may include a plurality of insulation layer patterns 115 and 117 and a plurality of gate electrodes 342, 344 and 346 alternately and repeatedly stacked on a substrate 100, a semiconductor pattern 160 filling a lower portion of a hole 150, which may be formed through the insulation layer patterns 115 and 117 and the gate electrodes 342, 344, and 346 and have a portion extended horizontally, i.e., a first hole extension 151, and having a top surface in the first hole extension 151, a first blocking layer pattern 172, a charge storage layer pattern 182 and a tunnel insulation layer pattern 192 sequentially stacked on a portion of a top surface of the semiconductor pattern 160 and a sidewall of the hole 150, and a channel 242 on the tunnel insulation layer pattern 192 contacting a portion of the top surface of the semiconductor pattern 160 in the hole 150.

The vertical memory device may further include a second blocking layer pattern 302 between an outer sidewall of the first blocking layer pattern 172 and the gate electrodes 342, 344 and 346, and a bit line 410.

The substrate 100 may include a semiconductor material, e.g., silicon, germanium, etc.

The insulation layer patterns 115 and 117 may include a first insulation layer pattern 115 and a second insulation layer pattern 117. In example embodiments, the first insulation layer pattern 115 may be arranged at a plurality of levels to be spaced apart to each other (e.g., one of each, each at a different height) on the substrate 100, and the second insulation layer pattern 117 may be formed at a single level or more than one level between the first insulation layer pattern 115. FIGS. 1 to 3 show the second insulation layer pattern 117 formed at a single level, and FIGS. 27, 28, etc. show the second insulation layer pattern 117 arranged at a plurality of levels, which will be illustrated later.

In example embodiments, the first insulation layer pattern 115 may include silicon oxide, and the second insulation layer pattern 117 may include a material having an etch rate different from that of the first insulation layer pattern 115. For example, the second insulation layer pattern 117 may include silicon oxide different from that of the first insulation layer pattern 115, or silicon oxide that is substantially the same as that of the first insulation layer pattern 115, however, further includes impurities, or silicon oxide doped with impurities that is substantially the same as that of the first insulation layer pattern 115, however, has a doping concentration higher than that of the first insulation layer pattern 115. Alternatively, the second insulation layer pattern 117 may include a material substantially the same as the first insulation pattern 115, however, may have an etch rate higher than that of the first insulation layer pattern 115 because the second insulation layer pattern 117 may be formed as a porous layer deposited at a relatively low temperature.

For example, when the first insulation layer pattern 115 includes plasma enhanced oxide (PEOX), the second insulation layer pattern 117 may include e.g., boro tetraethyl orthosillicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), etc., and when the first insulation layer pattern 115 includes plasma enhanced tetraethyl ortho silicate (PE-TEOS), the second insulation layer pattern 117 may include PEOX, BTEOS, PTEOS, BPTEOS, BSG, PSG, BPSG, etc. Additionally, when the first insulation layer pattern 115 includes a high density plasma (HDP) oxide, the second insulation layer pattern 117 may include PE-TEOS, PEOX, BTEOS, PTEOS, BPTEOS, BSG, PSG, BPSG, etc.

The gate electrodes 342, 344 and 346 may be formed in a gap (not shown) between the insulation layers patterns 115 and 117 formed at a plurality of levels in the first direction. In example embodiments, the gate electrodes 342, 344, and 346 may be extended in the third direction.

The gate electrodes 342, 344 and 346 may includes a ground selection line (GSL) 346, a word line 342 and a string selection line (SSL) 344 sequentially formed in the first direction. Each of the GSL 346, the word line 342 and the SSL 344 may be at a single level or more than one level. According to at least one example embodiment, the GSL 346 and the SSL 344 may be at 2 levels, respectively, and the word line 342 may be at 4 levels between the GSL 346 and the SSL 344. However, the GSL 346 and the SSL 344 may be formed at a single level, and the word line 342 may be formed at 2, 8, or 16 levels.

In example embodiments, the gate electrodes 342, 344, and 346 may include a metal and/or a metal nitride. For example, the gate electrodes 342, 344, and 346 may include a metal with a low electrical resistance e.g., tungsten, tantalum, platinum, etc, and a metal nitride e.g., titanium nitride, tantalum nitride, etc.

The hole 150 may be formed through the insulation layer patterns 115 and 117 and the gate electrodes 342, 344 and 346 to expose a top surface of the substrate 100, and may be extended in the first direction. The hole 150 may have a sidewall profile substantially perpendicular to the top surface of the substrate 100, or a sidewall profile that is becoming narrower from a top toward a bottom thereof, thereby being somewhat inclined rather than being perpendicular to the top surface of the substrate 100.

In example embodiments, a plurality of holes 150 may be formed in both of the second and third directions to define a hole array. In example embodiments, the hole array may have a first hole column including a plurality of first holes arranged in the third direction, and a second hole column including a plurality of second holes, which may be arranged in the third direction and spaced apart from the first hole column at a given distance. The first holes may be positioned in a fourth direction, which may be an acute angle to the second or third direction from the second holes. Accordingly, the first and second holes may be arranged in a zigzag pattern with respect to the third direction, and thus more holes 150 may be arranged in a given area.

Additionally, the hole array may include third and fourth hole columns that may be spaced apart from the first and second hole columns, respectively, at a given distance. In example embodiments, the third and fourth hole columns may be arranged symmetrically with respect to an imaginary face between the first and second hole columns defined by the first and third directions, e.g., an elongated face of a division layer pattern 130 along the first direction, and may include a plurality of third and fourth holes, respectively. Thus, a distance between the first and third hole columns may be shorter than a distance between the second and fourth hole columns.

The first to fourth hole columns may define a hole set with the division layer pattern 130 at a center thereof, and a plurality of hole sets may be repeatedly arranged in the second direction to form the hole array. The hole sets may be distinguished by a fourth insulation layer 380 formed in a first opening (not shown) through the insulation layer patterns 115 and 117 and the gate electrodes 342, 344 and 346. However, a layout of the hole array mentioned above is a non-limiting examples, and thus may be changed.

Each of the holes 150 may include the first hole extension 151. The first hole extension 151 may have a space horizontally extended when compared to other regions. In example embodiments, the first hole extension 151 may be formed adjacent to the second insulation layer pattern 117. In the present embodiment, as the second insulation layer pattern 117 is formed at a single level, the first hole extension 151 may have a vertical length corresponding to a thickness of one second insulation layer pattern 117.

In example embodiments, the semiconductor pattern 160 may include doped or undoped polysilicon, single crystalline polysilicon, doped or undoped polygermanium or single crystalline germanium. In example embodiments, the top surface of the semiconductor pattern 160 may be located in the first hole extension 151, and therefore may be larger than a bottom surface thereof.

In example embodiments, the first blocking layer pattern 172, the charge storage layer pattern 182, and the tunnel insulation layer pattern 192 may be formed on an edge top surface of the semiconductor pattern 160 and the sidewall of the hole 150, and thus may have a cup shape of which a central lower portion thereof may be opened. Each portion of the first blocking layer pattern 172, the charge storage layer pattern 182, and the tunnel insulation layer pattern 192 formed in the first hole extension 151 may have a diameter larger than that of each upper portion thereof, and each opened central lower portion of the first blocking layer pattern 172, the charge storage layer pattern 182, and the tunnel insulation layer pattern 192 may be so large that a portion of a top surface of the semiconductor pattern 160 exposed by the opened central lower portions of the first blocking layer pattern 172, the charge storage layer pattern 182 and the tunnel insulation layer pattern 192 may have an enlarged area.

In example embodiments, the tunnel insulation layer pattern 192 may include an oxide e.g., silicon oxide, and the charge storage layer pattern 182 may include a nitride e.g., silicon nitride, and the first blocking layer pattern 172 may include an oxide e.g., silicon oxide.

In example embodiments, the channel 242 may be formed conformally on the tunnel insulation layer pattern 192 and contact the portion of the top surface of the semiconductor pattern 160 exposed by the opened central lower portions of the first blocking layer pattern 172, the charge storage layer pattern 182 and the tunnel insulation layer pattern 192. Thus, the channel 242 may have a cup-like shape. However, a lower portion in the first extension 151 may have a larger diameter than that of an upper portion thereof. An inner space formed by the channel 242 may be filled by a third insulation layer pattern 260. Alternatively, the channel 242 may have a pillar shape filling a remaining portion of the hole 150, and in this case, the third insulation layer pattern 260 may be omitted.

In example embodiments, the channel 242 may include doped or undoped polysilicon, or single crystalline polysilicon.

The channel 242 may be formed in each of the holes 150, and therefore a plurality of channels 242 may be formed in each of the second and third directions to define a channel array. In other words, the channel array may be formed corresponding to the hole array.

The channel 242, the tunnel insulation layer pattern 192, the charge storage layer pattern 182 and the first blocking layer pattern 172 surrounding the channel 242, and the third division layer pattern 260 may define a first structure, and thus the first structure may be formed on the top surface of the semiconductor pattern 160 to contact a top surface of the substrate 100. In addition, a pad 270 may be formed on the first structure. In example embodiments, the pad 270 may include doped or undoped polysilicon, or single crystalline polysilicon.

The first structure, the semiconductor pattern 160 and the pad 270 may define a second structure, and a plurality of second structures may be formed corresponding to the array of the channels 242 included in the first structure. Each second structure may be surrounded by the plurality of insulation layer patterns 115 and 117 and the gate electrodes 342, 344 and 346 arranged at the plurality of levels on the substrate 100, and the insulation layer patterns 115 and 117 may be divided into a plurality of insulation layer pattern sets by the fourth insulation layer pattern 380. The fourth insulation layer pattern 380, for example, may include an insulating material e.g., silicon oxide.

The second blocking layer pattern 302 may surround a sidewall of the second structure exposed by the gap, i.e. an outer sidewall of the first blocking layer pattern 172, and further formed in an inner wall of the gap. Thus, top and bottom portions of the second blocking layer pattern 302 may be extended in both of the second and third directions. The second blocking layer pattern 302 may include a metal oxide, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide.

The second blocking layer pattern 302 may form a blocking layer pattern structure 312 together with the first blocking layer pattern 172.

The tunnel insulation layer pattern 192, the charge storage layer pattern 182, the blocking layer pattern structure 312 and the gate electrodes 342, 344, and 346 mentioned above may define a gate structure. In example embodiments, the gate structure may be formed at a plurality of levels in the first direction.

A portion of the gate structure may be separated from each other by the division layer pattern 130 which may be extended in the third direction and penetrate through a portion of the first insulation layer pattern 115.

In particular, the division layer pattern 130 may penetrate through the gate structures including the gate electrodes 344 and the first insulation layer patterns 115 on the gate structures, and further a portion of the insulation layer pattern 115 under the gate structures. The division layer pattern, for example, may include an oxide e.g., silicon oxide.

An impurity region 105 being extended in the third direction and serving as a common source line (CSL) may be formed at an upper portion of the substrate 100 beneath the third insulation layer pattern 380. In example embodiments, the impurity region 150 may include n-type impurities e.g., phosphorus, arsenic, etc. A metal silicide pattern (not shown) e.g., a cobalt silicide pattern or a nickel silicide pattern may be further formed on the impurity region 105.

The bit line 410 may be electrically connected to the pad 270 by a bit line contact 400, and thus may be electrically connected to the channels 242. The bit line 410 may include a metal, a metal nitride, doped polysilicon, etc. According to example embodiments, the bit line 410 may be extended in the second direction, and a plurality of bit lines 410 may be formed in the third direction.

The bit line contact 400 may fill a second opening 405 through a fifth insulation layer 390, and contact a top surface of the pad 270. The bit line contact 400 may include a metal, a metal nitride, doped polysilicon, etc.

The fifth insulation layer 390 may be formed on the first and fourth insulation layer patterns 115 and 380, the pad 270 and the division layer pattern 130. In example embodiments, the fifth insulation layer 390 may include an insulation material e.g., oxide.

In the vertical memory device as mentioned above, each portion of the first blocking layer pattern 172, the charge storage layer pattern 182, and the tunnel insulation layer pattern 192 formed in the first hole extension 151 may have a diameter larger than that of each upper portion thereof, and each opened central lower portion of the first blocking layer pattern 172, the charge storage layer pattern 182, and the tunnel insulation layer pattern 192 may be so large that the portion of the top surface of the semiconductor pattern 160 exposed by the opened central lower portions of the first blocking layer pattern 172, the charge storage layer pattern 182 and the tunnel insulation layer pattern 192 may have an enlarged area. Thus, the channel 242 formed on the tunnel insulation layer pattern 192 may contact the top surface of the semiconductor pattern 160 through the opened central lower portions of the first blocking layer pattern 172, the charge storage layer pattern 182 and the tunnel insulation layer pattern 192, so that the vertical memory device may have good electrical characteristics.

FIGS. 4 to 22 are vertical cross-sectional views illustrating stages of a method of manufacturing a vertical memory device in accordance with example embodiments. The figures may illustrate a method of manufacturing the vertical memory device of FIGS. 1 to 3, however, may not be limited thereto.

Figure 4:
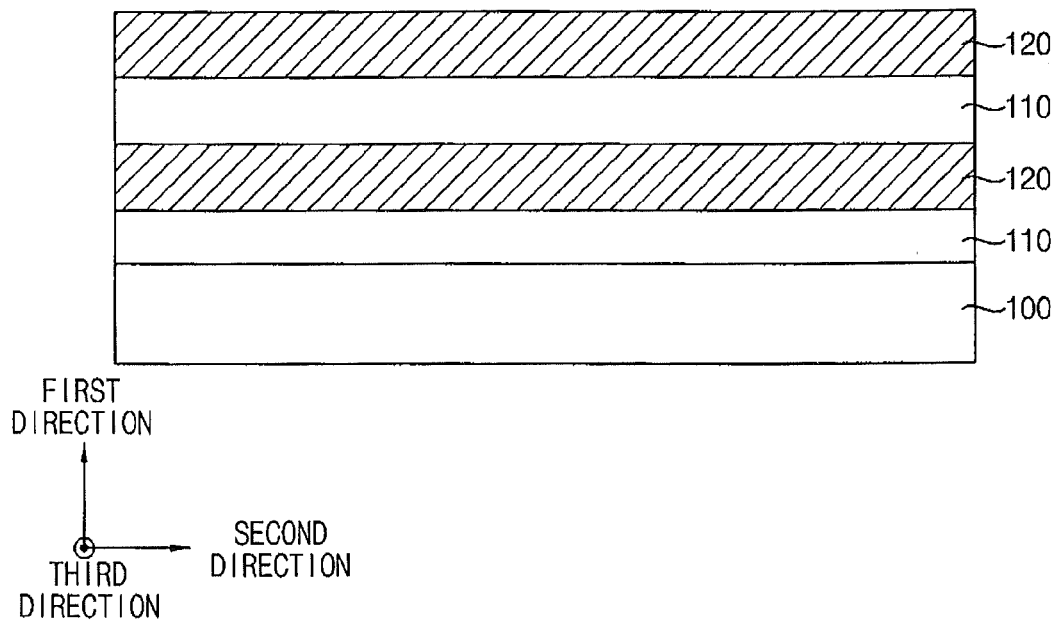

Referring to FIG. 4, a first insulation layer 110 and a sacrificial layer 120 may be alternately and repeatedly formed on a substrate 100, and thus a plurality of first insulation layers 110 and a plurality of sacrificial layers 120 may be alternately formed on each other at a plurality of levels in the first direction, respectively. In example embodiments, the first insulation layers 110 at 2 levels and the first sacrificial layer 120 at 2 levels may be formed alternately on the substrate 100.

The substrate 100 may include a semiconductor material, for example, silicon and/or germanium.

In example embodiments, the first insulation layers 110 and the sacrificial layers 120 may be formed by, for example, a chemical vapor deposition (CVD) process, a plasma enhanced chemical vapor deposition (PECVD) process, an atomic layer deposition process (ALD) process, etc. A lowermost first insulation layer 110, which may be formed directly on a top surface of the substrate 100, may be formed by, for example, a thermal oxidation process.

In example embodiments, the first insulation layer 110 may be formed to include a silicon oxide, for example, phosphorous tetraethyl orthosilicate (PE-TOES), high density plasma (HDP) oxide or plasma enhanced oxide (PEOX). In example embodiments, the first sacrificial layer 120 may be formed to include, for example, a material with an etch selectivity to the first insulation layer 110 (e.g., silicon nitride and/or silicon boronitirde).

Figure 5:
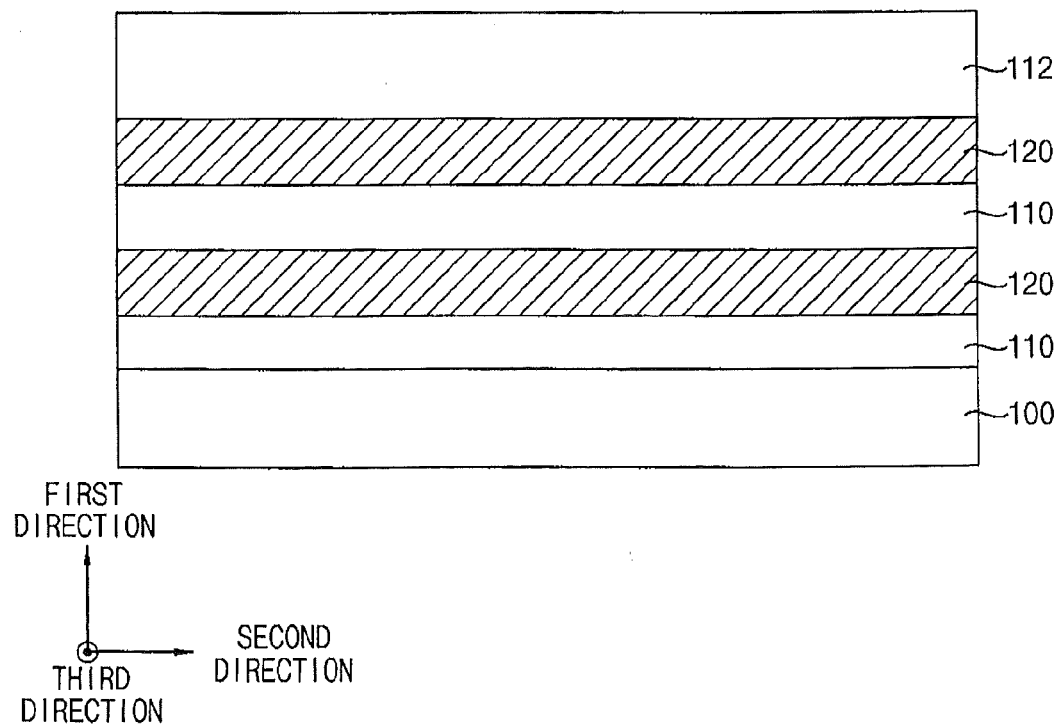

Referring to FIG. 5, at least one second insulation layer 112 and/or at least one sacrificial layer (not shown) may be formed on an uppermost among the first insulation layers 110 and the first sacrificial layers 120. Only one second insulation layer 112 is illustrated in the FIG. 4, however, the case in which a plurality of second insulation layers 112 and/or at least one second sacrificial layers 122 (refer to FIG. 24, etc.) are formed will be illustrated afterwards.

In example embodiments, the second insulation layer 112 may be formed by, for example, a CVD process, a PECVD process, an ALD process, etc. In example embodiments, the second insulation layer 112 may be formed to include silicon oxide with a high etch selectivity when compared to the first insulation layer 110. In other words, the second insulation layer 112 may be formed to include silicon oxide with a high etch selectivity to an etching solution, i.e. hydrofluic acid in a wet etch process. Thus, the second insulation layer 112 may be formed to include silicon oxide different from that of the first insulation layer 110, or silicon oxide that is substantially the same as that of the first insulation layer 110, however, further includes impurities, or silicon oxide doped with impurities that is substantially the same as that of the first insulation layer 110, however, has a doping concentration higher than that of the first insulation layer 110. Alternatively, the second insulation layer 112 may be formed to include a material substantially the same as the first insulation 110, however, may be formed to have an etch rate higher than the first insulation layer 110 by depositing the second insulation layer 112 at a relatively low temperature to form a porous layer.

For example, when the first insulation layer 110 includes PEOX, the second insulation layer 112 may be formed using e.g., BTEOS, BPTEOS, BSG, PSG, BPSG, etc., and when the first insulation layer 110 includes PE-TEOS, the second insulation layer may be formed using PEOX, BTEOS, PTEOS, BPTEOS, BSG, PSG, BPSG, etc. Additionally, when the first insulation layer 110 includes an HDP oxide, the second insulation layer 112 may be formed using PE-TEOS, PEOX, BTEOS, PTEOS, BPTEOS, BSG, PSG, BPSG, etc.

Figure 6:
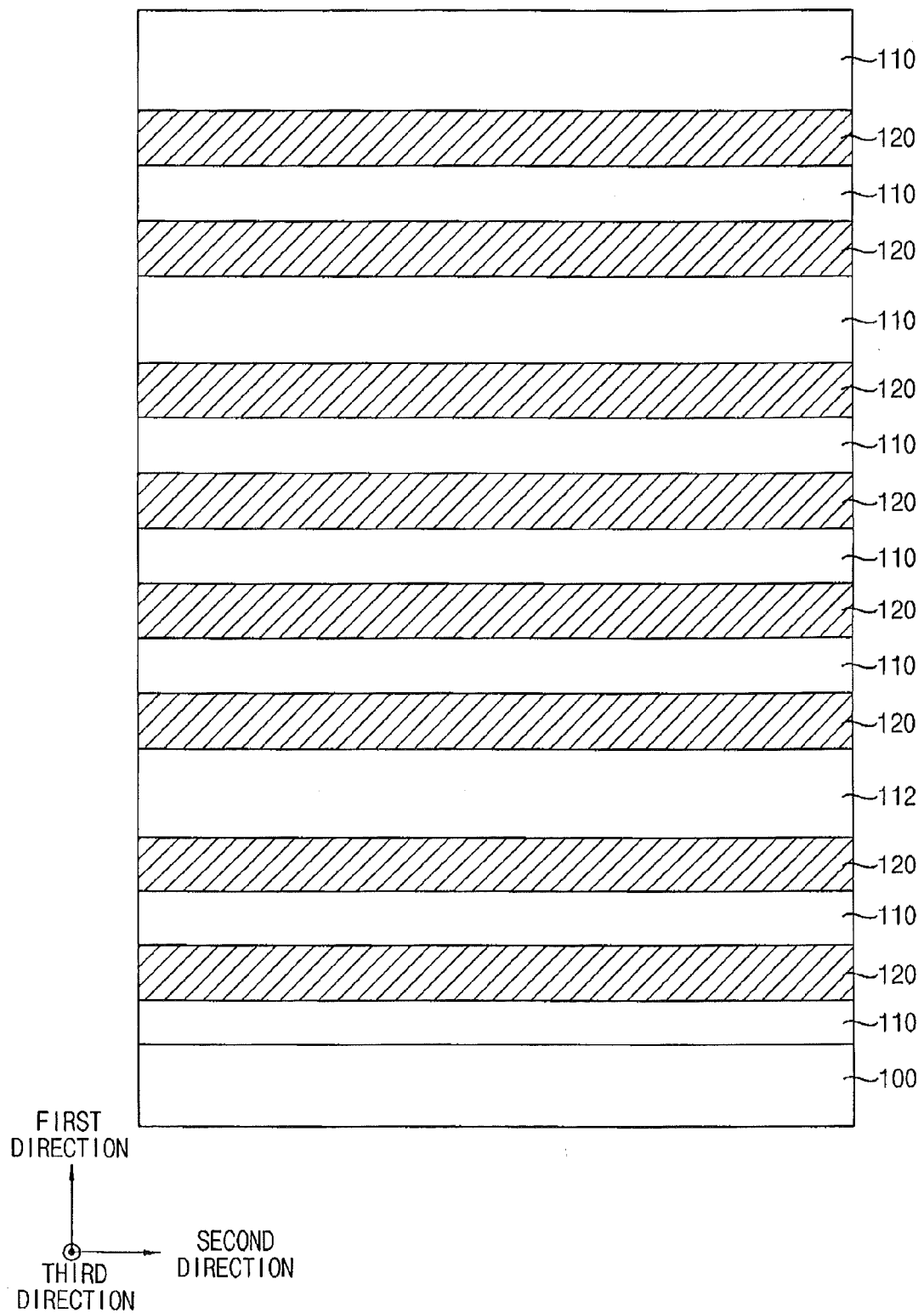

Referring to FIG. 6, the first insulation layer 110 and the sacrificial layer 120 may be formed alternately and repeatedly on the uppermost among the second insulation layers 112 and the first sacrificial layers 120. Only one second insulation layer 112 is shown in FIG. 6, and therefore the sacrificial layer 120 and the first insulation layer 110 may be formed alternately and repeatedly on the second insulation layer 112.

The first insulation layer 110 and the sacrificial layer 120 may be formed by processes substantially the same as or similar to those illustrated with reference to FIG. 4.

Figure 21:
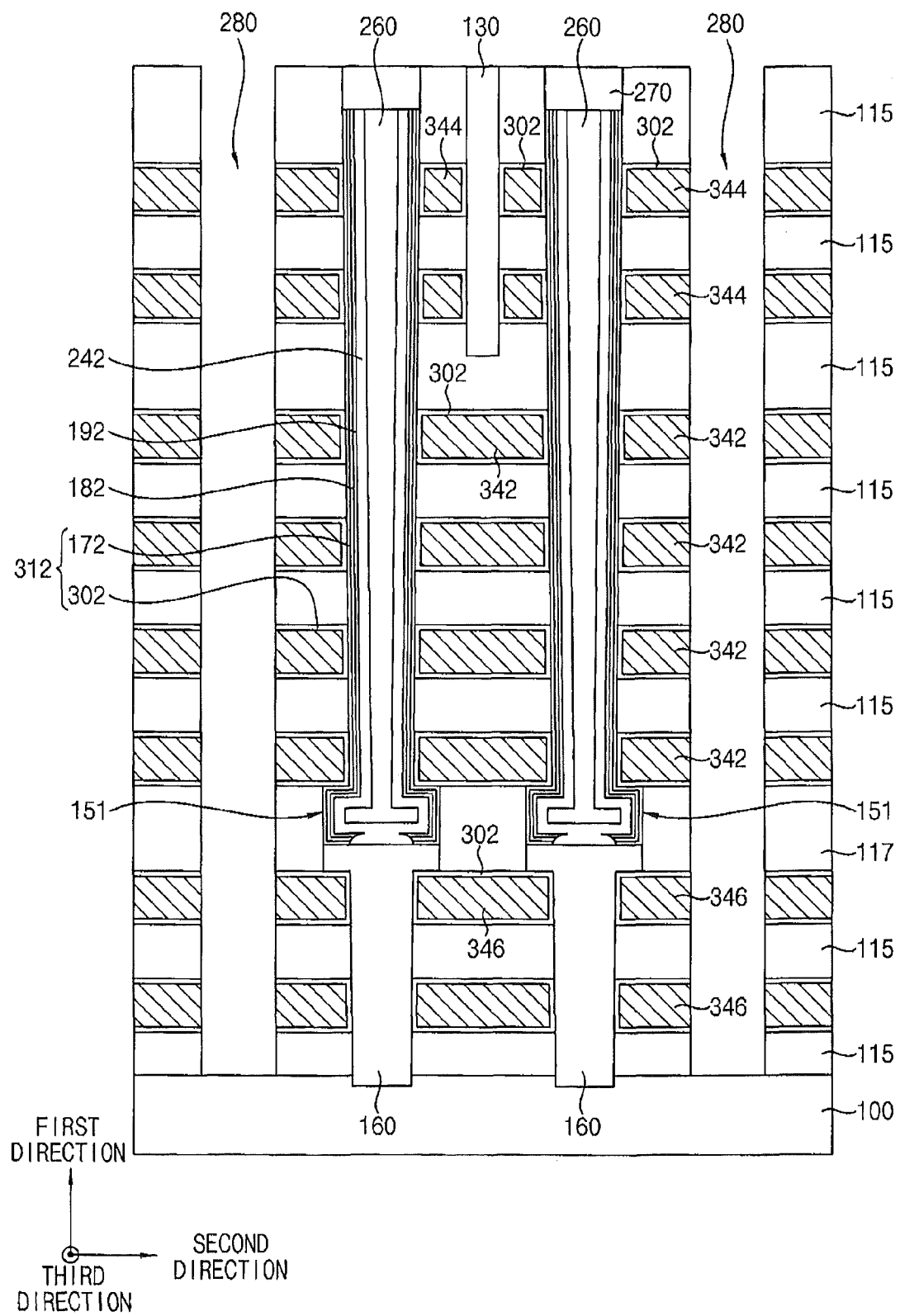

The number of the first and the second insulation layers 110 and 112 and the number of the sacrificial layer 120 stacked on the substrate 100 may vary according to the desired stacked number of a GSL 346 (refer to FIG. 21), a word line 342 (refer to FIG. 21) and an SSL 344 (refer to FIG. 21). According to at least one example embodiment, each of the GSL 346 and the SSL 344 may be formed at 2 levels, and the word line 342 may be formed at 4 levels. Thus, the sacrificial layer 120 may be formed at 8 levels, and the first and second insulation layer 110 and 112 may be formed at 9 levels. However, the number of the first and the second insulation layers 110 and 112 and the number of the sacrificial layer 120 stacked on the substrate 100 may not be limited thereto, and, for example, each of the GSL 346 and the SSL 344 may be formed at a single level, and the word line 342 may be formed at 2, 8 or 16 levels. In this case, the sacrificial layers 120 may be formed at 4, 10 or 18 levels, and the first and second insulation layer 110 and 112 may be formed at 5, 11 or 19 levels.

In the present embodiment, FIG. 6 illustrates the single second insulation layer 112 formed between the GSL 346 and the word line 342, however, may not be limited thereto, and other cases in which the second insulation layer 112 formed at other locations will be described afterwards.

Figure 7:
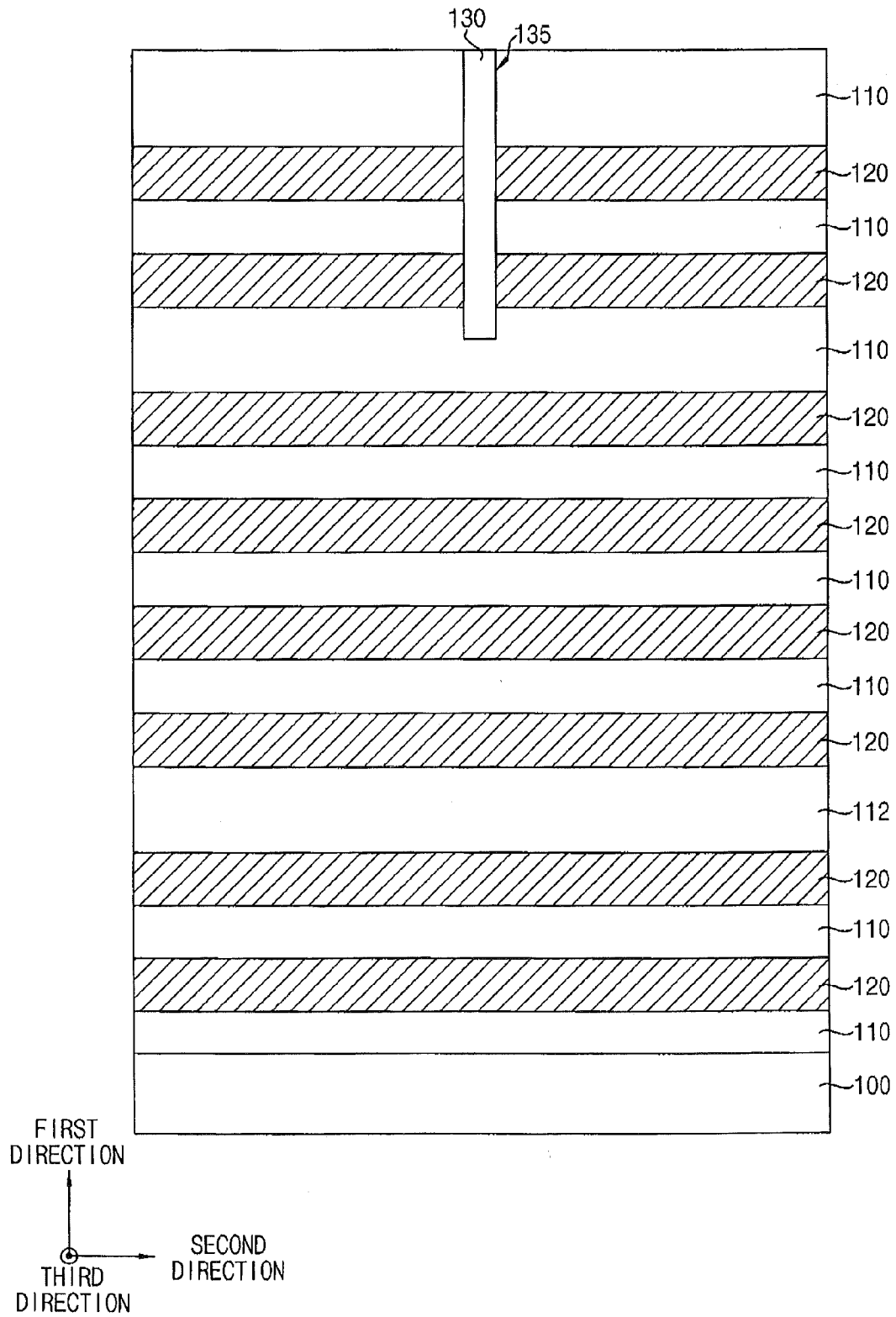

Referring to FIG. 7, a trench 135 may be formed partially through the first insulation layers 110 and the sacrificial layers 120, and a division layer pattern 130 filling the trench 135 may be formed.

In example embodiments, the trench 135 may be formed by a photolithography process. The trench 135 may be formed through the sacrificial layers 120 in which the SSL 344 may be formed in a subsequent process and the first insulation layers 110 thereon, and further partially through the first insulation layer 110 therebeneath. In example embodiments, the trench 135 may be formed to extend in the third direction.

A division layer may be formed on the first insulation layer 110 to sufficiently fill the trench 135, and may be planarized until a top surface of an uppermost first insulation layer 110 may be exposed to form the division layer pattern 130. The division layer may be formed to include a material with an etch selectivity to the sacrificial layers 120, e.g., a silicon oxide. The planarization process may be performed by a chemical mechanical polishing (CMP) process and/or an etch back process.

The division layer pattern 130 may not be formed in some cases.

Figure 8:
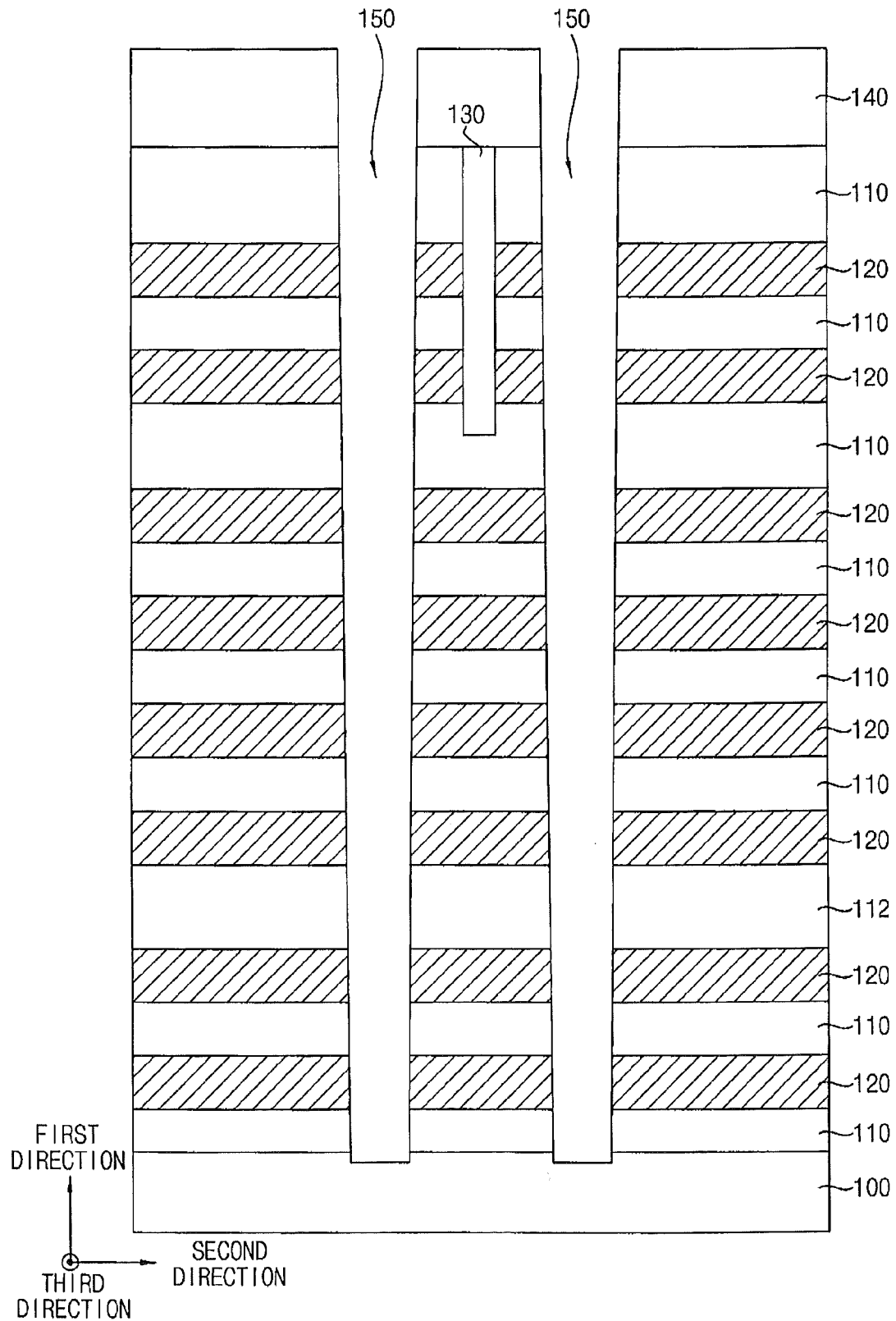

Referring to FIG. 8, a plurality of holes 150 may be formed through the first and second insulation layers 110 and 112 and the sacrificial layers 120 to expose a top surface of the substrate 100.

In this case, a portion of the first insulation layer 110 directly on the substrate 100 may be overetched to expose the top surface of the substrate 100 sufficiently, and thus an upper portion of the substrate 100 may be removed together to form a first recess (not shown).

In example embodiments, after forming a hard mask 140 on the uppermost first insulation layer 110, the first and second insulation layers 110 and 112 and the sacrificial layers 120 may be dry etched using the hard mask 140 as an etch mask to form the holes 150. Thus, the holes 150 may be formed to extend in the first direction. In other words, each of the holes 150 may be formed to include a sidewall profile substantially perpendicular to the top surface of the substrate 100. Due to the characteristics of a dry etch process, the holes 150 may be of a width that becomes gradually smaller from a top portion to a bottom portion thereof, and thus the sidewall profile may not be completely perpendicular to the top surface of the substrate 100, which is not shown.

In example embodiments, the hard mask 140 may be formed to include a material with an etch selectivity to silicon oxide and silicon nitride that may be included in the first and second insulation layers 110 and 112 and the sacrificial layers 120, respectively, e.g., polysilicon or amorphous silicon by a CVD process, a PECVD process, an ALD process, and the like.

In example embodiments, the holes 150 may be formed in both of the second and third directions to define a hole array. In example embodiments, the hole array may be formed to have a first hole column including a plurality of first holes arranged in the third direction, and a second hole column including a plurality of second holes, which may be arranged in the third direction and spaced apart from the first hole column at a given distance. The first holes may be positioned in a fourth direction, which may be an acute angle to the second or third direction from the second holes. Accordingly, the first and second holes may be arranged in a zigzag pattern with respect to the third direction, and thus more holes 150 may be arranged in a given area.

Additionally, the hole array may be formed to include third and fourth hole columns that may be spaced apart from the first and second hole columns, respectively, at a given distance. In example embodiments, the third and fourth hole columns may be arranged symmetrically with respect to an imaginary face between the first and second hole columns defined by the first and third directions, e.g., an elongated face of a division layer pattern 130 along the first direction, and may include a plurality of third and fourth holes, respectively. Thus, a distance between the first and third hole columns may be shorter than a distance between the second and fourth hole columns.

The first to fourth hole columns may define a hole set with the division layer pattern 130 at a center thereof, and a plurality of hole sets may be repeatedly arranged in the second direction to form the hole array.

Figure 9:
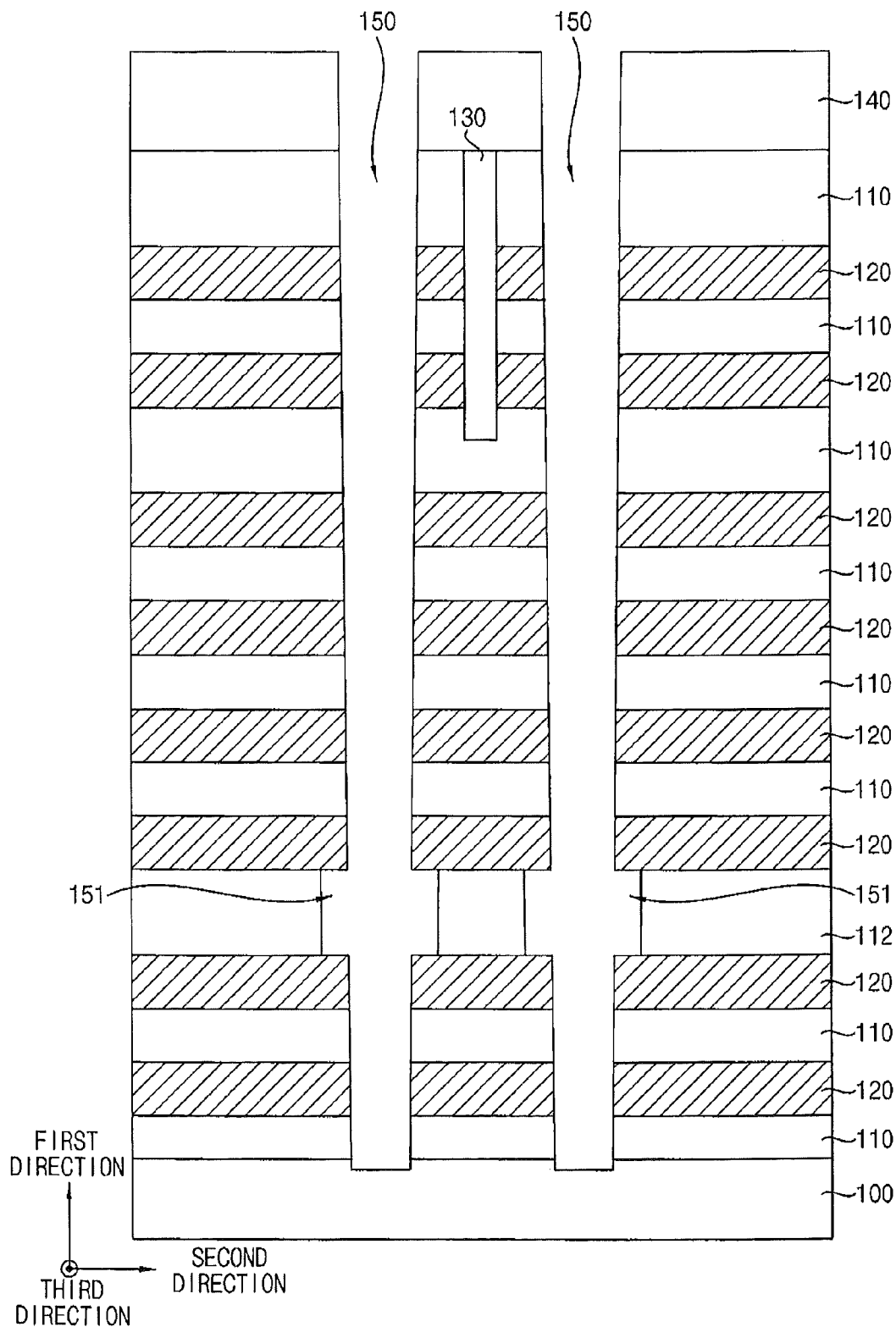

Referring to FIG. 9, a portion of the second insulation layer 112 exposed by each of the holes 150 may be removed to form a first hole extension 151.

In example embodiments, the first hole extension 151 may be formed by a wet etch process using hydrofluoric acid as an etch solution. Thus, the second insulation layer 112 having an etch rate with respect to the hydrofluoric acid higher than the first insulation layer 110 or the first sacrificial layer 120 may be easily etched, and therefore the first hole extension 151 through the second insulation layer 112 may have a larger horizontal area than those of the other regions of the holes 150 through the first insulation layer 110 or the first sacrificial layer 120.

Figure 10:
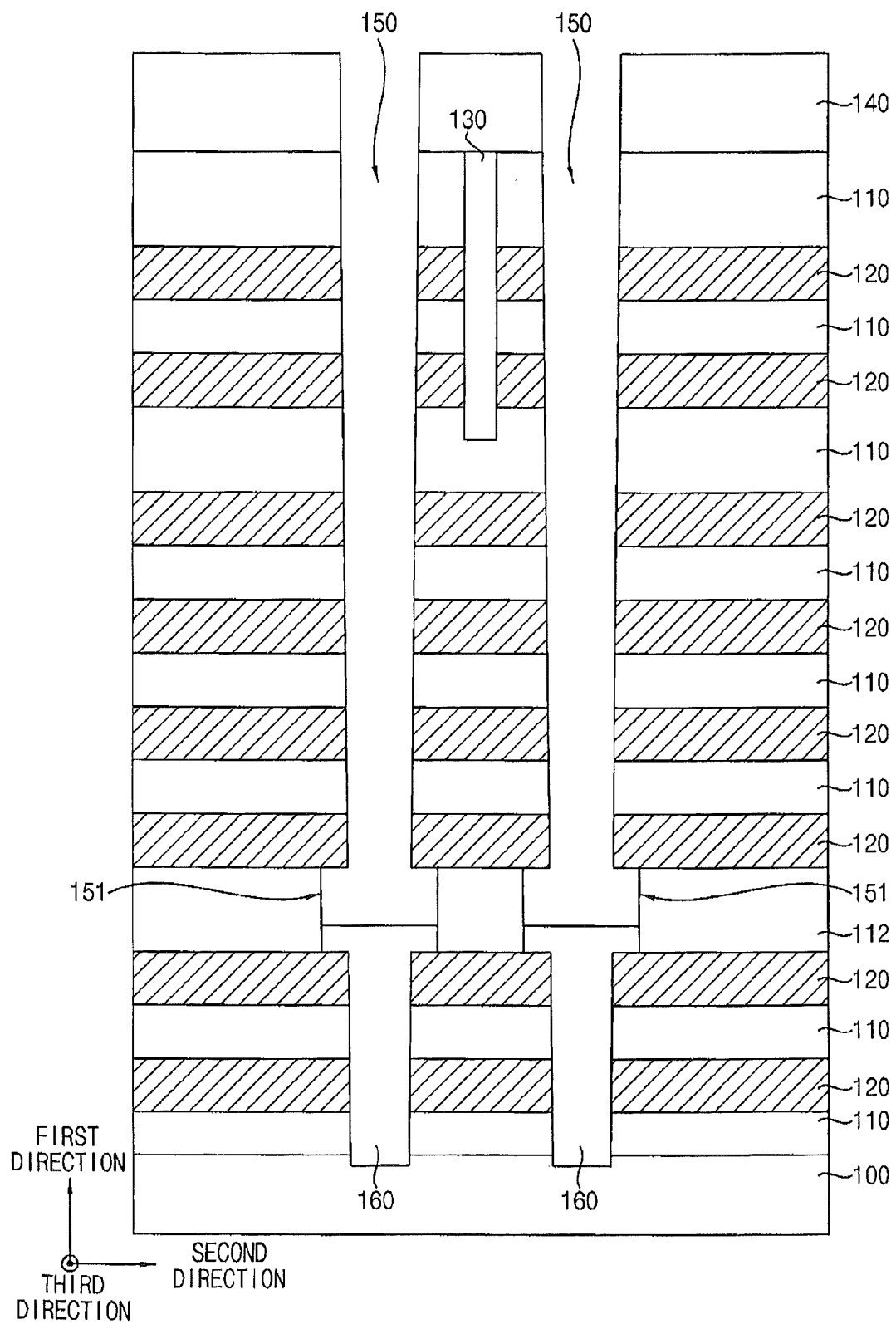

Referring to FIG. 10, a semiconductor pattern 160 may be formed to partially fill each of the holes 150.

Particularly, a selective epitaxial growth (SEG) process may be performed using the exposed top surface of the substrate 100 as a seed to form the semiconductor pattern 160 partially filling the holes 150. Thus, the semiconductor pattern 160 may be formed to include single crystalline silicon or single crystalline germanium according to the material of the substrate 100, and in some cases, impurities may be doped hereinto. Alternatively, an amorphous silicon layer may be formed to fill the holes 150, and a laser epitaxial growth (LEG) process or a solid phase epitaxy (SPE) process may be performed on the amorphous silicon layer to form the semiconductor pattern 160.

In example embodiments, the semiconductor pattern 160 may be formed to have a top surface located in the first hole extension 151. Thus, the semiconductor pattern 160 may be formed to have the top surface higher than that of the sacrificial layer 120 in which the GSL 346 may be formed subsequently.

In an example embodiment, an oxide layer may be further formed on the hard mask 140 including silicon so that the semiconductor pattern 160 may not be formed thereon.

Figure 11:
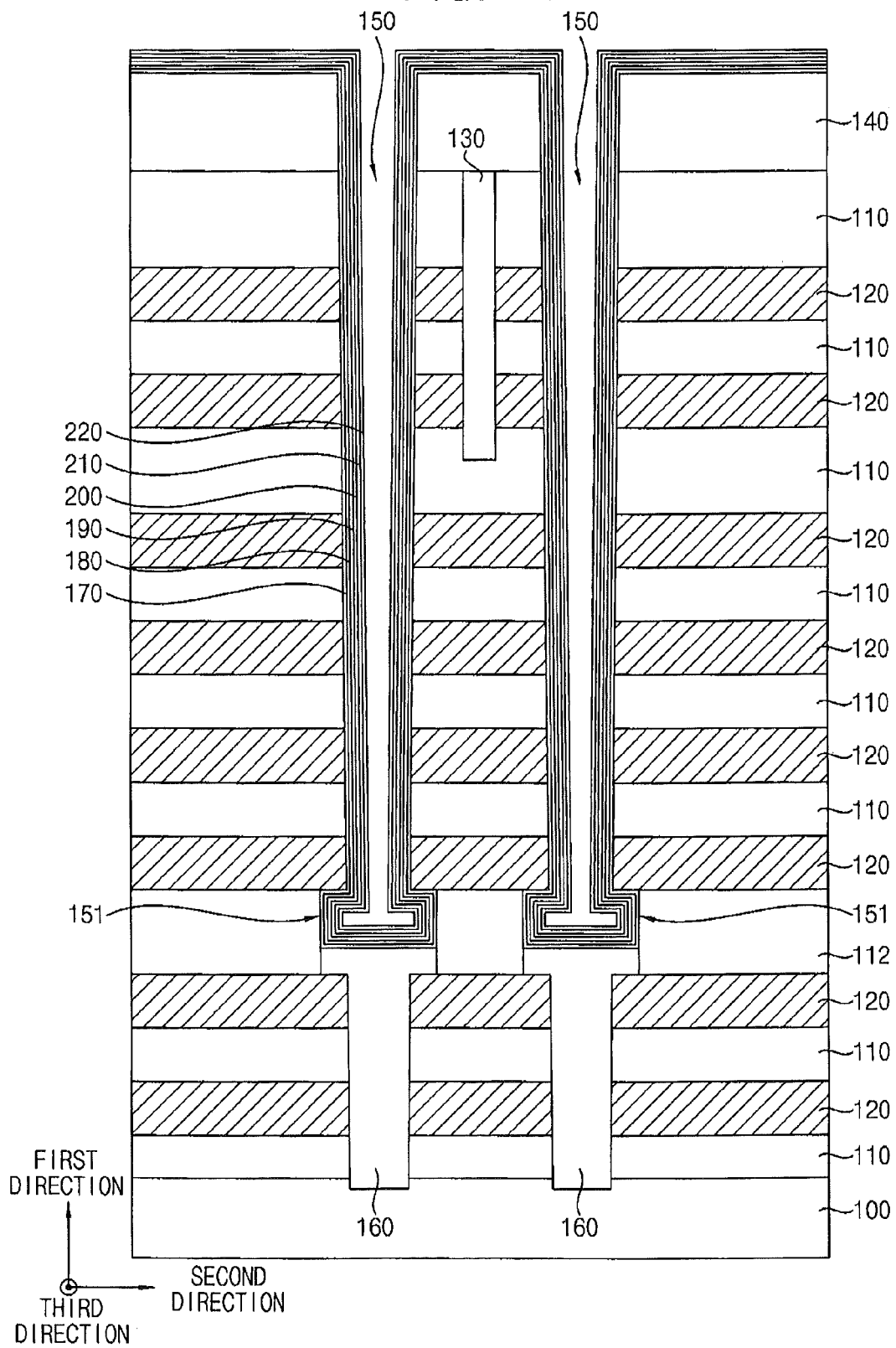

Referring to FIG. 11, a first blocking layer 170, a charge storage layer 180, a tunnel insulation layer 190, a first channel layer 200, an etch stop layer 210 and a spacer layer 220 may be sequentially formed on sidewalls of the holes 150, the top surface of the semiconductor pattern 160, and a top surface of the hard mask 140.

In example embodiments, the first blocking layer 170 may be formed to include an oxide, e.g., silicon oxide, the charge storage layer 180 may be formed to include a nitride, e.g., silicon nitride, and the first tunnel insulation layer 190 may be formed to include an oxide, e.g., silicon oxide.

In example embodiments, the first channel layer 200 may be formed to include doped or undoped polysilicon or amorphous silicon. When the first channel layer 220 is formed to include amorphous silicon, an LEG process or an SPE process may be further performed so that the amorphous silicon layer may be changed to a crystalline silicon layer.

In example embodiments, the etch stop layer 210 may be formed to include substantially the same material as the first blocking layer 170, e.g., silicon oxide, and the spacer layer 220 may be formed to include substantially the same material as the charge storage layer 180, e.g., silicon nitride.

Before forming the first blocking layer 170, a protection layer (not shown) may be formed on the sidewalls of the holes 150, the top surface of the semiconductor pattern 160 and the top surface of the hard mask 140. The protection layer may be formed to include, e.g., silicon oxide, and may prevent the first blocking layer 170 from being damaged during the removal of the sacrificial layers 120 in a subsequent process (refer to FIG. 19).

Even though an area of the holes 150 may become smaller from a top portion toward a bottom portion thereof adjacent to the substrate 100, the space within the holes may be enlarged by the first hole extension 151 so that the first blocking layer 170, the charge storage layer 180, the tunnel insulation layer 190, the first channel layer 200, the etch stop layer 210 and the spacer layer 220 may be easily formed on the top surface of the semiconductor pattern 160.

Figure 12:
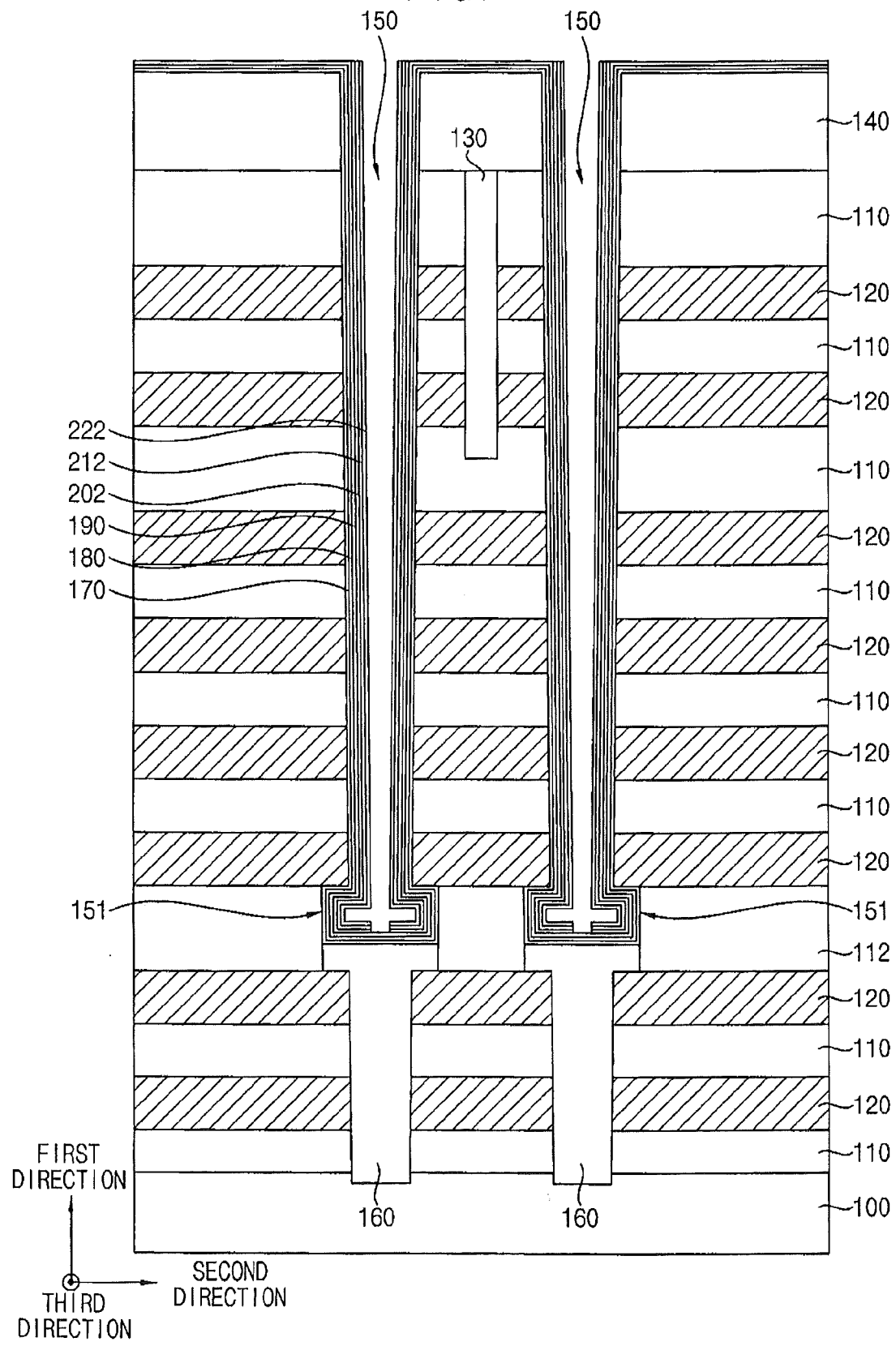

Referring to FIG. 12, a portion of the spacer layer 220 on the top surface of the semiconductor pattern 160 may be removed by etching the spacer layer 220 anisotropically to form a spacer 222 on the sidewall of each of the holes 150, and the etch stop layer 210 and the first channel layer 200 may be etched using the spacer 222 as an etch mask to form an etch stop layer pattern 212 and a first channel 202, respectively, exposing a portion of the tunnel insulation layer 190. In other words, portions of the etch stop layer 210 and the first channel layer 200 formed on the central top surface of the semiconductor pattern 160 and a top surface of the hard mask 140 may be removed.

The top surface of the semiconductor pattern 160 may have a relatively larger area due to the first hole extension 151 so that the portions of the etch stop layer 210 and the first channel layer 200 on the central top surface of the semiconductor pattern 160 may be etched easily. Especially, when the width of each of the holes 150 becomes narrower toward the bottom portion because of the large aspect ratio, and when the first channel layer 200 and the etch stop layer 210 are etched using the spacer 222 formed on the sidewall of each of the holes 150 as an etch mask, the portions of the etch stop layer 210 and the first channel layer 220 may be etched in a difficult way because of an extremely small space opened by the spacer layer 222. In example embodiments, however, the first hole extension 151 may be formed so that the etch process may be performed easily because of a relatively larger space opened by the spacer layer 222. The effect may be significantly increased in the holes 150 having second and third hole extensions 152 and 153 (refer to FIGS. 26 and 28) that may have a larger space in the vertical direction.

Figure 13:
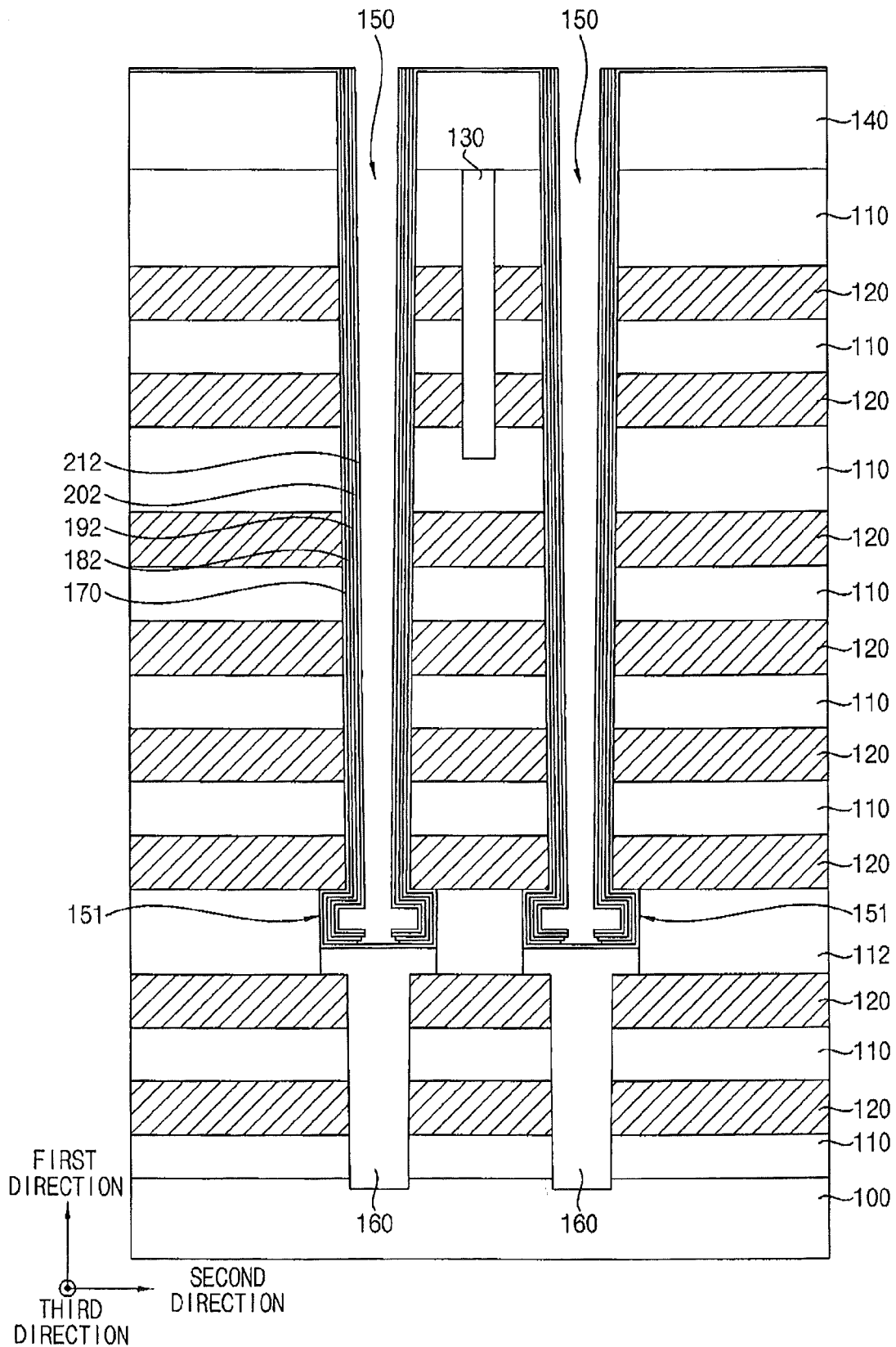

Referring to FIG. 13, an exposed portion of the tunnel insulation layer 190 and the charge storage layer 180 thereebeneath may be removed to form a channel insulation layer pattern 192 and a charge storage layer pattern 182, and thus a portion of the first blocking layer 170 may be exposed.

In example embodiments, the tunnel insulation layer 190 and the charge storage layer 180 may be etched by a wet etch process. In other words, the tunnel insulation layer 190 including a silicon oxide may be etched using hydrofluoric acid as an etching solution, and the charge storage layer 180 including a silicon nitride may be etched using phosphoric acid or sulfuric acid as an etching solution. The spacer 222 including a silicon nitride may be also etched to expose the first channel 202.

As mentioned above, the portions of the etch stop layer 210 and the first channel layer 200 may be removed easily to form the etch stop layer pattern 212 and the first channel 202, respectively, so that the portions of the tunnel insulation layer 190 and the charge storage layer 180 exposed thereby may be also easily removed.

Figure 14:
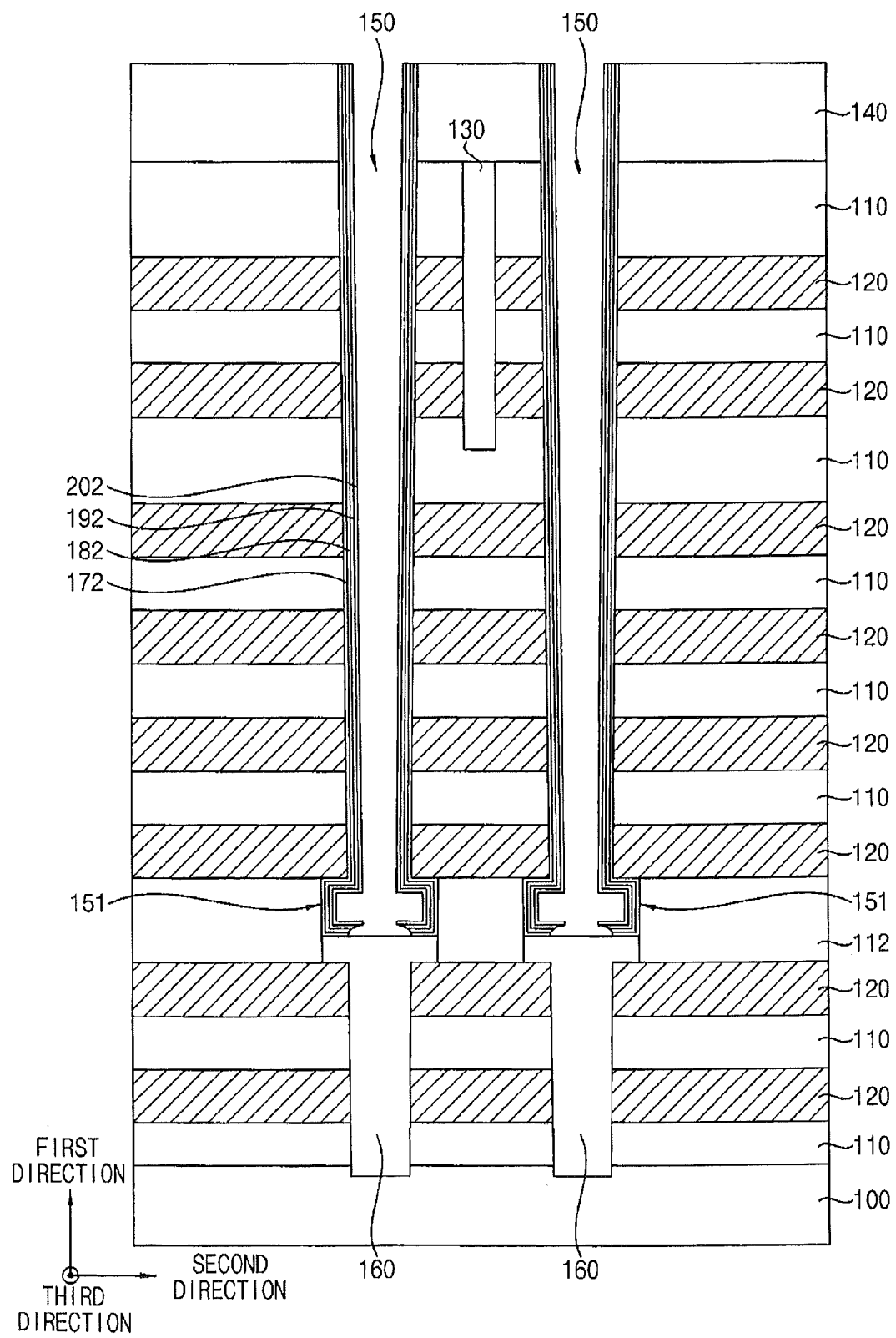

Referring to FIG. 14, an exposed portion of the first blocking layer 170 may be removed to form a first blocking layer pattern 172, and thus a central top surface of the semiconductor pattern 160 and a top surface of the hard mask 140 may be exposed. As mentioned above, the portions of the tunnel insulation layer 190 and the charge storage layer 180 may be easily removed to form the channel insulation layer pattern 192 and the charge storage layer pattern 182, respectively, so that the portion of the first blocking layer 170 exposed thereby may be also easily removed.

In example embodiments, the first blocking layer 170 including a silicon oxide may be etched by a wet etch process using an etch solution including hydrofluoric acid. The first channel 202 may include a different material from the first blocking layer 170, and therefore portions of the tunnel insulation layer pattern 192, the charge storage layer pattern 182 and the first blocking layer 170 formed underneath may be protected by the first channel 202.

Figure 15:
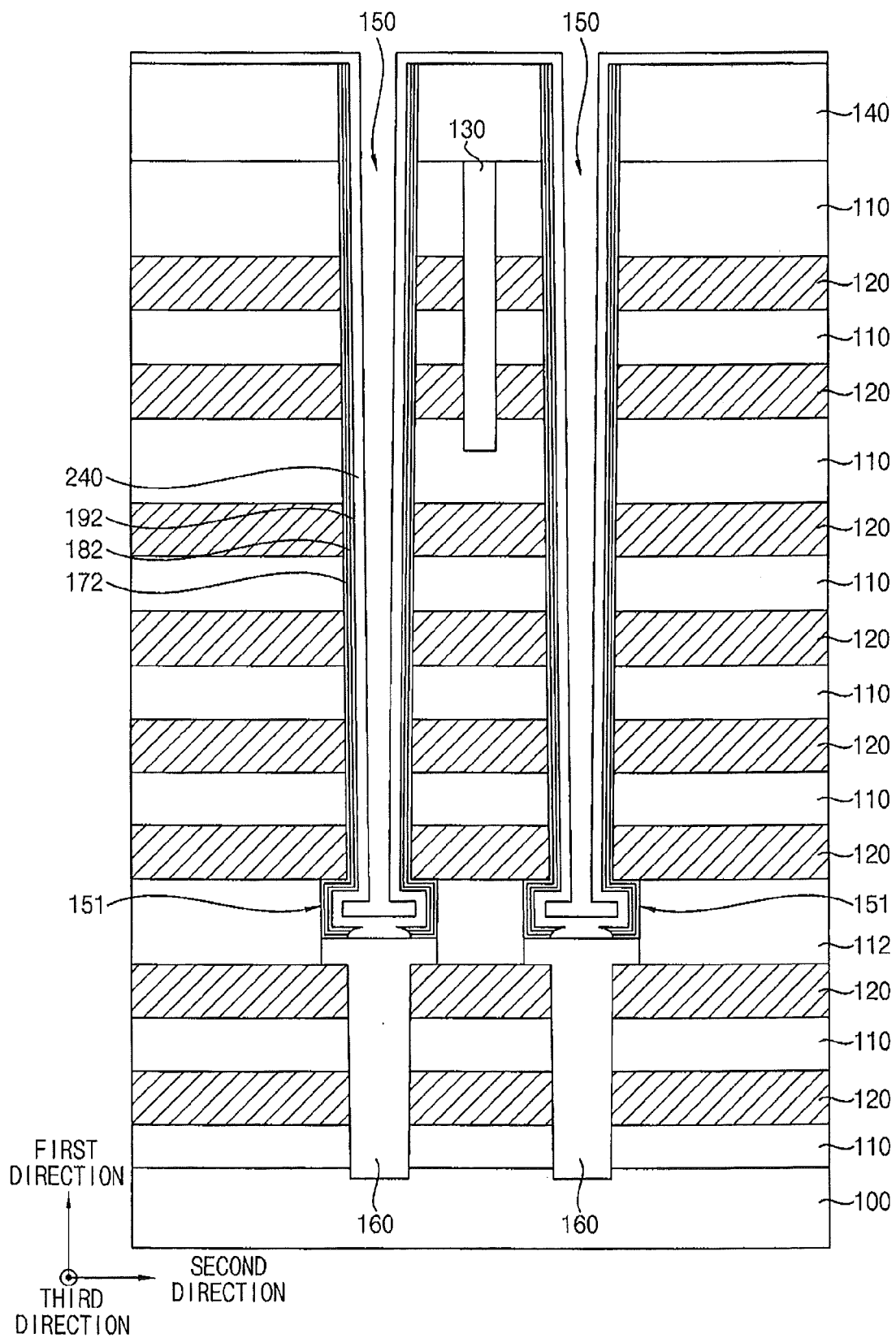

Referring to FIG. 15, a second channel layer may formed on the first channel 202, the exposed central top surface of the semiconductor pattern 160 and the hard mask 140.

In example embodiments, the second channel layer may be formed using the substantially the same material as the first channel 202, and thus the first channel 202 and the second channel layer may be merged into one layer, which may be simply referred to as a second channel layer 240 hereinafter.

As mentioned above, the first blocking layer 170, the charge storage layer 180 and the tunnel insulation layer 190 stacked on the top surface of the semiconductor pattern 160 may be easily removed due to the first hole extension 161 to form the first blocking layer pattern 172, the charge storage layer pattern 182 and the tunnel insulation layer pattern 192, respectively, and therefore the second channel layer 240 may sufficiently contact the top surface of the semiconductor pattern 160.

Figure 16:
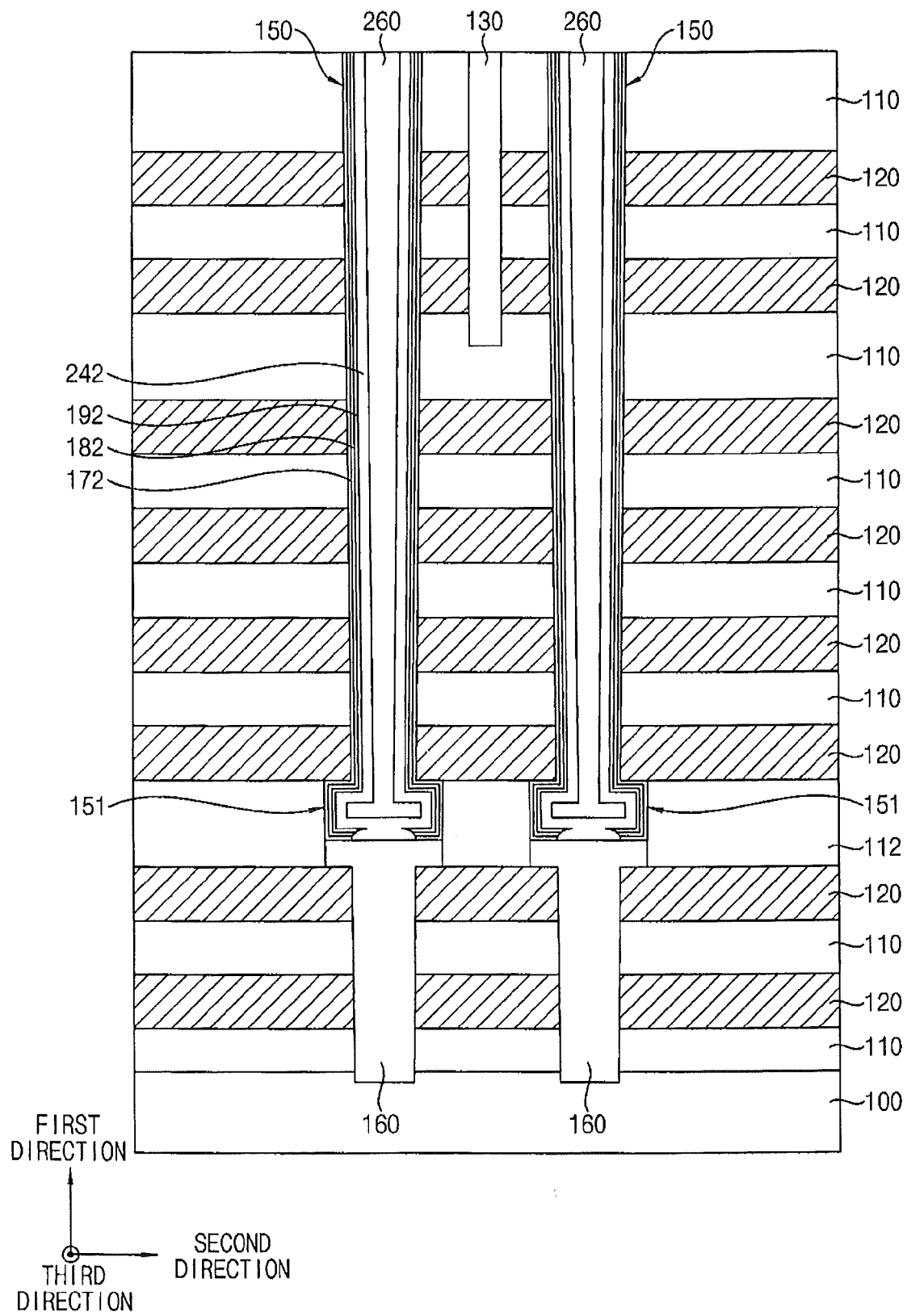

Referring to FIG. 16, after a third insulation layer filling a remaining portion of the holes 150 sufficiently may be formed on the second channel layer 240, the third insulation layer, the second channel layer 240, the tunnel insulation layer pattern 192, the charge storage layer pattern 182, the first blocking layer pattern 172 and the hard mask 140 may be planarized until a top surface of an uppermost first insulation layer pattern 110 may be exposed to form a third insulation layer pattern 260 filling the remaining portion of the holes 150, and the second channel layer 240 may be transformed into a channel 242.

Thus, the first blocking layer pattern 172, the charge storage layer pattern 182, the tunnel insulation layer pattern 192, the channel 242 and the third insulation layer pattern 260 may be formed sequentially on the top surface of the semiconductor pattern 160 in each hole 150. The first blocking layer pattern 172, the charge storage layer pattern 182 and the tunnel insulation layer pattern 192 may have a cup shape of which a central lower portion is opened, the channel 242 may have a cup-like shape, and the third insulation layer pattern 260 may have a pillar shape. Portions of the first blocking layer pattern 172, the charge storage layer pattern 182, the tunnel insulation layer pattern 192 and the channel 242 in the first hole extension 151 may have larger diameters than those of upper portions thereof, respectively.

According as the holes 150 in which the channel 242 may be formed may define the hole set including the first to fourth holes, and further the hole array, the channel 242 may also define a channel set including first to fourth channels, and further channel array including a plurality of channel sets.

Figure 17:
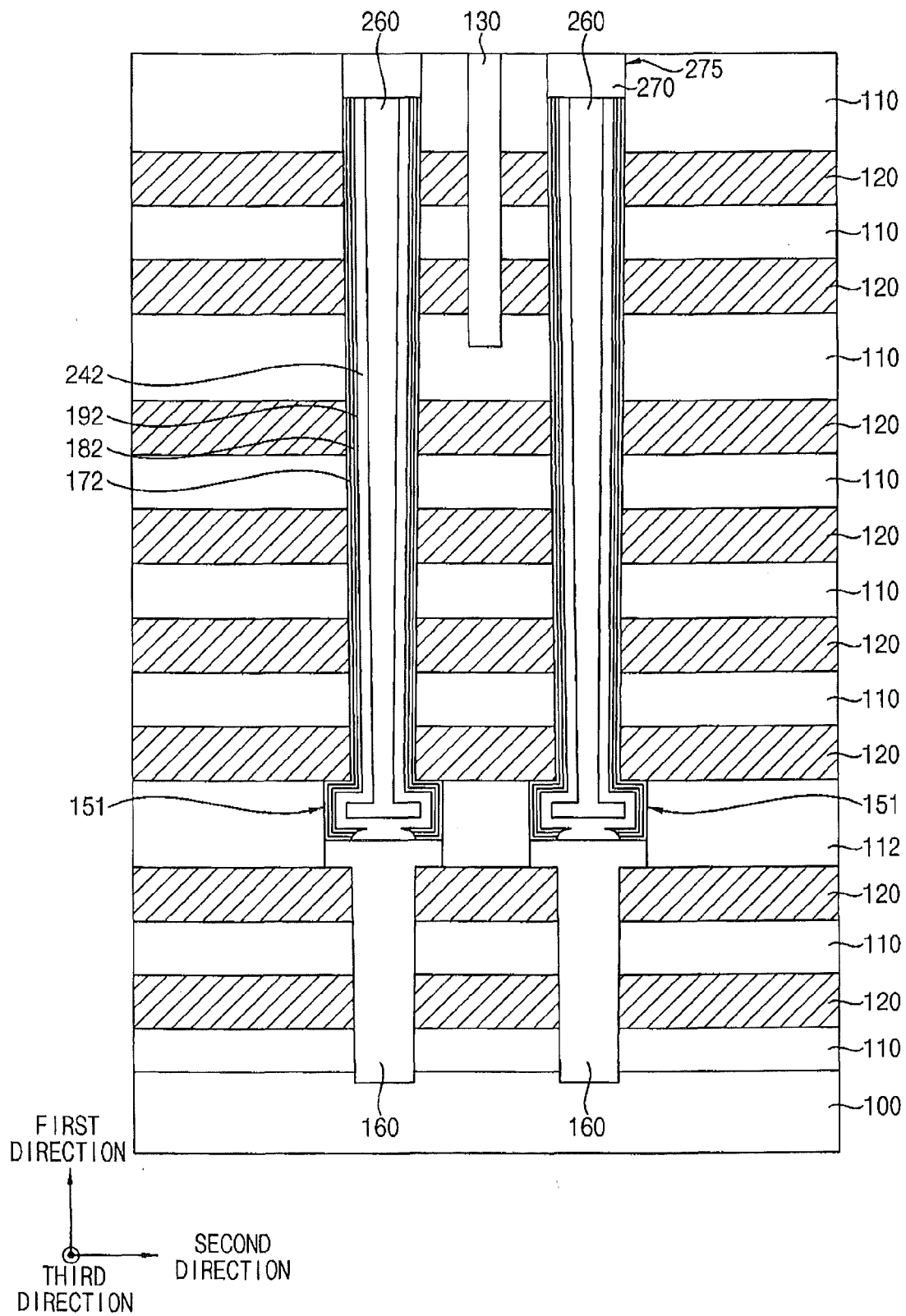

Referring to FIG. 17, an upper portion of the first structure, i.e., upper portions of the third insulation layer pattern 260, the channel 242, the tunnel insulation layer pattern 192, the charge storage layer pattern 182 and the first blocking layer pattern 172 may be removed to form a second recess 275, and a pad 270 may be formed to fill the second recess 275.

Particularly, the upper portion of the first structure may be removed by an etch back process to form the second recess 275. A pad layer may be formed on the first structure and the uppermost first insulation layer 110 to fill the second recess 275, and an upper portion of the pad layer may be planarized until a top surface of the uppermost first insulation layer 110 may be exposed to form the pad 270. In example embodiments, the pad layer may be formed to include doped or undoped polysilicon or amorphous silicon. When the pad layer is formed to include amorphous silicon, a crystallization process may be further performed thereon.

The pad 270 may be formed on each channel 242, and thus may form a pad array in accordance with the channel array.

The first structure, the semiconductor pattern 160 and the pad 270 in each of the holes 150 may form a second structure.

Figure 18:
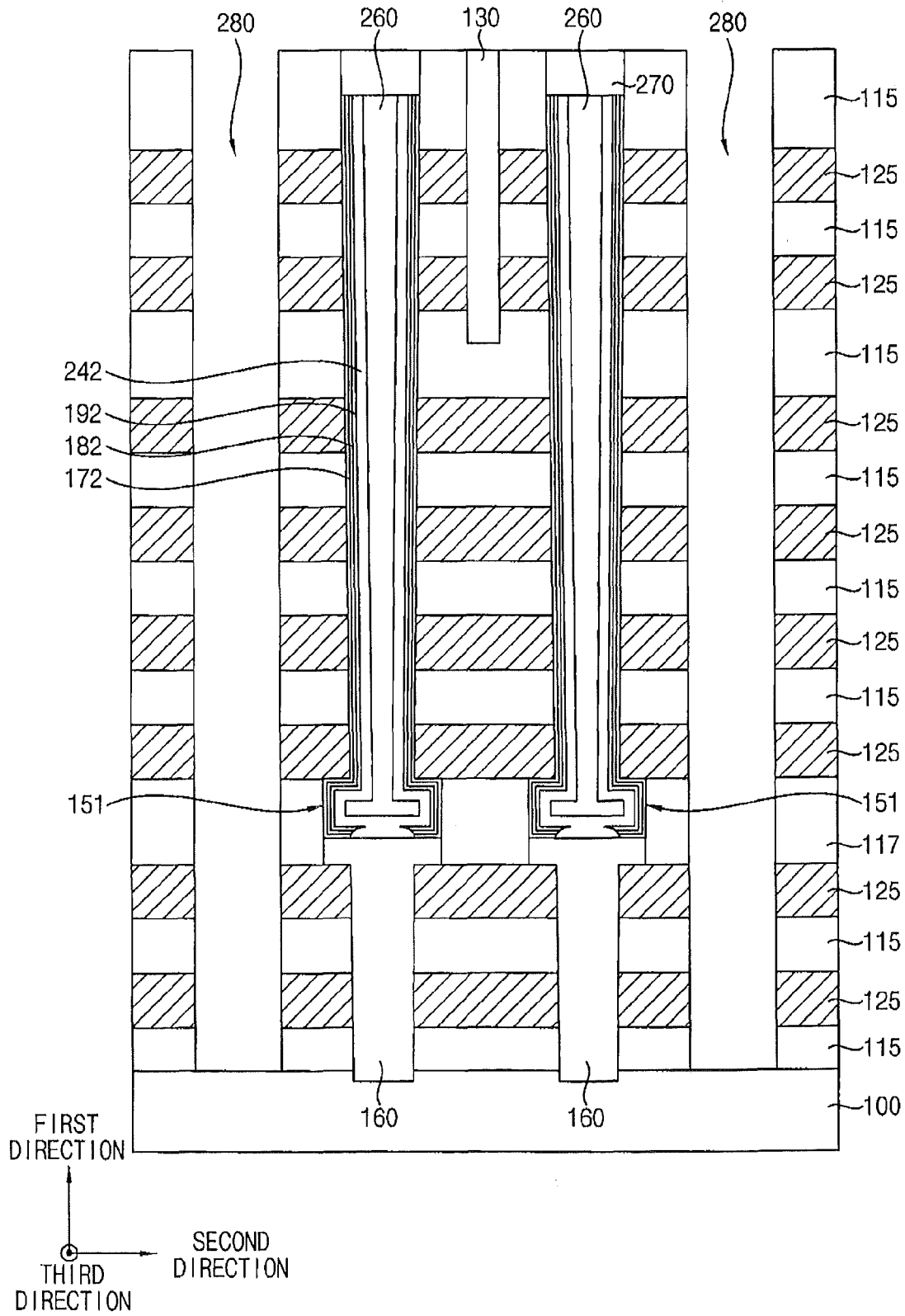

Referring to FIG. 18, a first opening 280 may be formed through the first and second insulation layers 110 and 112 and the sacrificial layers 120 to expose a top surface of the substrate 100.

In example embodiments, after forming a hard mask (not shown) on the uppermost first insulation layer 110, the insulation layers 110 and 112 and the sacrificial layers 120 may be, for example, dry etched using the hard mask as an etch mask to form the first opening 280. The first opening 280 may be formed to extend in the first direction.

In example embodiments, a plurality of first openings 280 may be formed in the second direction, and each first opening 280 may be extended in the third direction. The first and the second insulation layer 110 and 112 and the sacrificial layer 120 may be transformed into first and second insulation layer pattern 115 and 117 and a sacrificial layer pattern 125, respectively. A plurality of first and second insulation layer patterns 115 and 117 and a plurality of sacrificial layer patterns 125 may be formed in the second direction at each level, and each first and second insulation layer pattern 115 and 117 and each sacrificial layer pattern 125 may be extended in the third direction.

In example embodiments, the first opening 280 may be formed between the hole sets.

Figure 19:
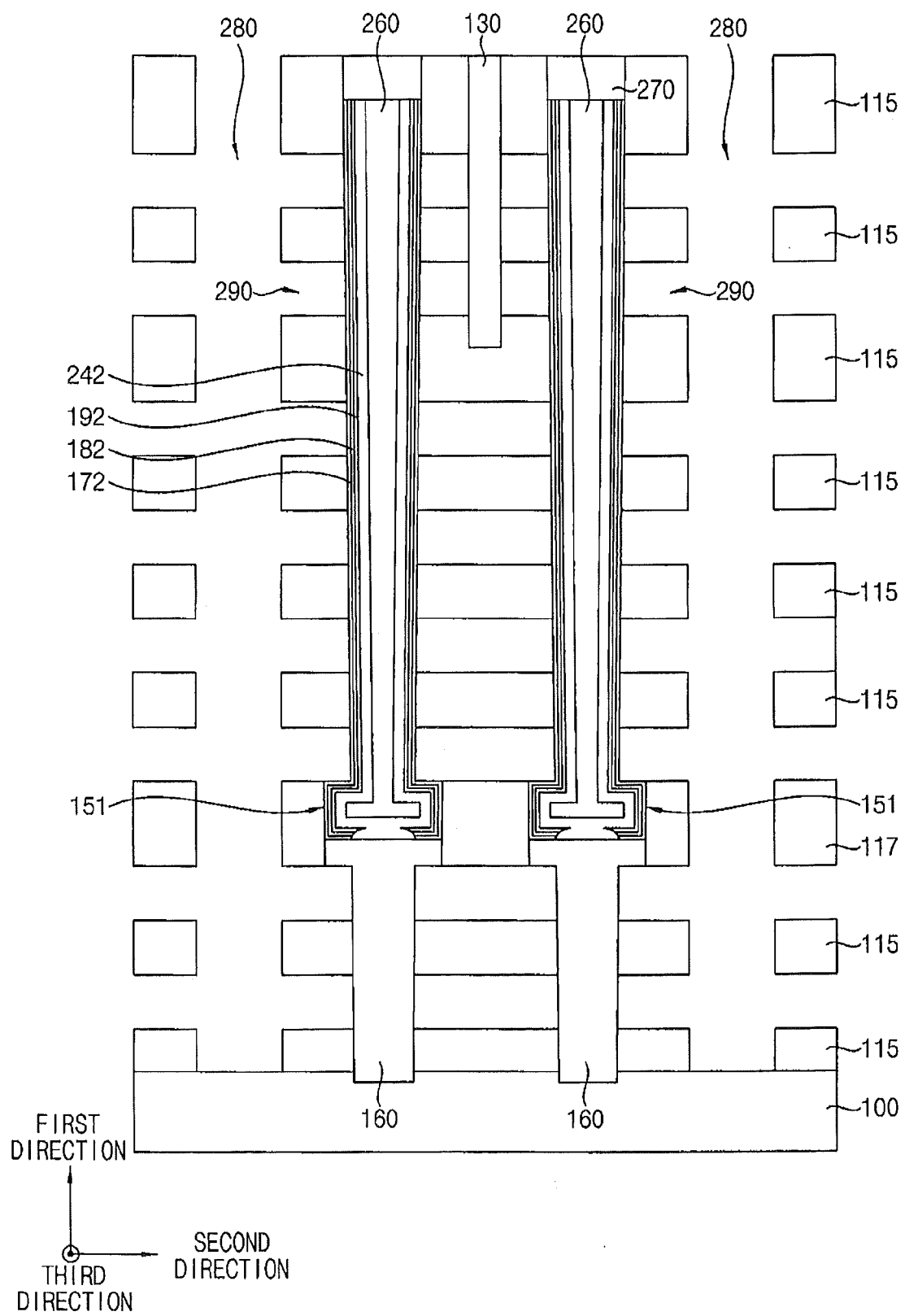

Referring to FIG. 19, the sacrificial layer patterns 125 may be removed to form a gap 290 between the first and the second insulation layer patterns 115 and 117 at adjacent levels, and portions of an outer sidewall of the first blocking layer pattern 172 and a sidewall of the semiconductor pattern 160 may be exposed by the gap 290. In example embodiments, the sacrificial layer patterns 125 exposed by the first opening 280 may be removed by, for example, a wet etch process using an etching solution including phosphoric acid and/or sulfuric acid.

Figure 20:
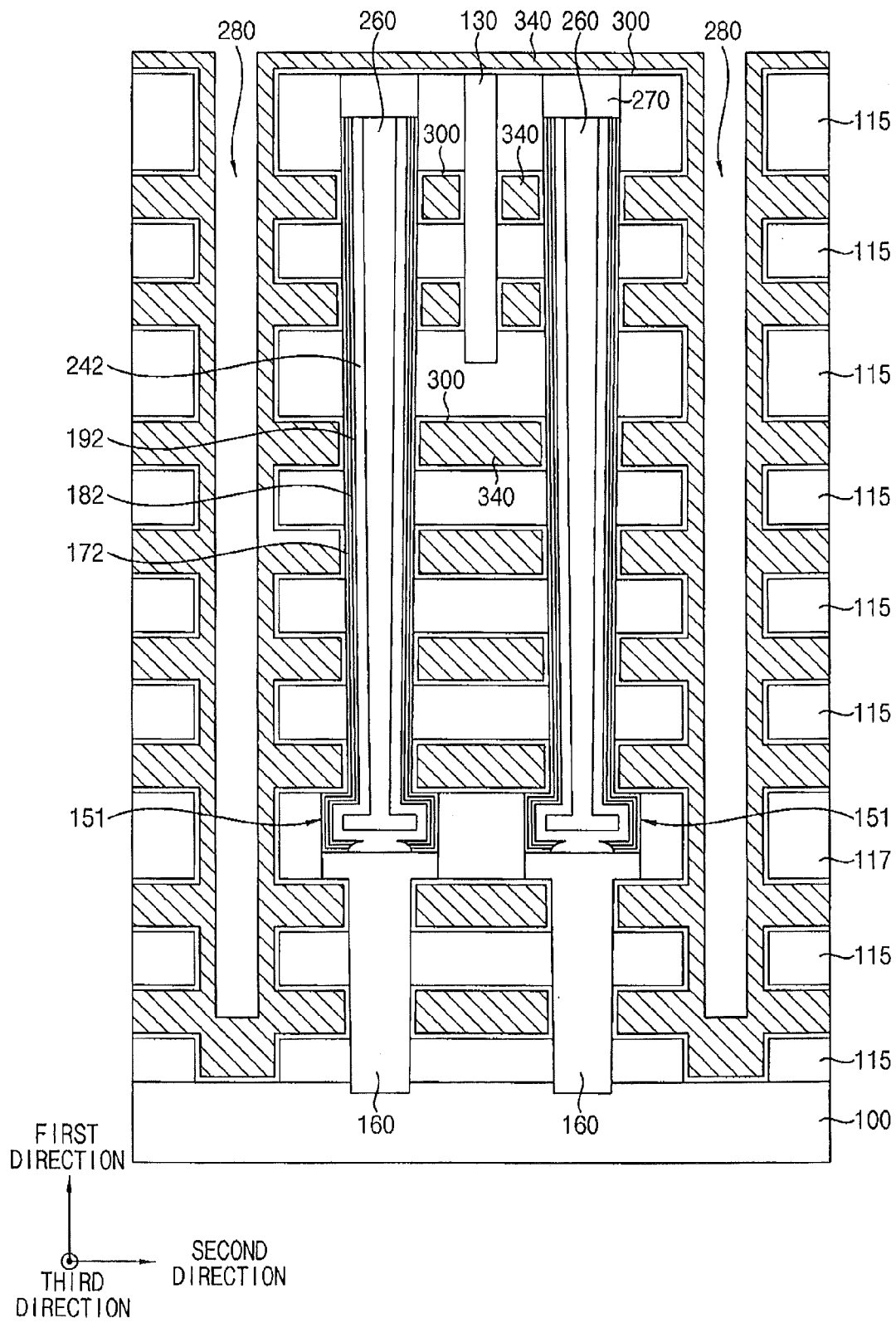

Referring to FIG. 20, a second blocking layer 300 may be formed on the exposed portion of the outer sidewall of the first blocking layer pattern 172, the exposed portion of the sidewall of the semiconductor pattern 160, an inner wall of the gap 290, a surface of the first and the second insulation layer pattern 115 and 117, the exposed top surface of the substrate 100, a top surface of the pad 270 and a top surface of the division layer pattern 130, and a gate electrode layer 340 may be formed on the second blocking layer 300 to sufficiently fill remaining portions of the gap 290.

In example embodiments, the second blocking layer 300 may be formed to include, for example, a metal oxide. For example, the metal oxide may include aluminum oxide, hafnium oxide, lanthanum oxide, lanthanum aluminum oxide, lanthanum hafnium oxide, hafnium aluminum oxide, titanium oxide, tantalum oxide and/or zirconium oxide.

In example embodiments, the gate electrode layer 340 may be formed to include a metal and/or a metal nitride. For example, the gate electrode layer 340 may be formed using a metal having a low electric resistance, e.g., tungsten, titanium, tantalum, platinum, etc., and a metal nitride, e.g., titanium nitride, tantalum nitride, etc.

Referring to FIG. 21, the gate electrode layer 340 may be partially removed to form gate electrodes 342, 344 and 346 in the gap 290. In example embodiments, the gate electrode layer 340 may be partially removed through a wet etch process.

In example embodiments, the gate electrodes 342, 344 and 346 may be formed to extend in the third direction, and include the GSL 346, the word line 342 and the SSL 344 sequentially formed in the first direction from the a top surface of the substrate 100. Each of the GSL 346, the word line 342 and the SSL 344 may be formed at a single level or at a plurality of levels. In the present example embodiment, each of the GSL 346 and the SSL 344 may be formed at 2 levels, and the word line 342 may be formed at 4 levels between the GSL 346 and the SSL 344. The GSL 346 may be formed adjacent to the semiconductor pattern 160, and the word line 342 and the SSL 344 may be formed adjacent to the channels 242, and particularly, the SSL 344 may be formed adjacent to the division layer pattern 130.

When the gate electrode layer 340 is partially removed, portions of the second blocking layer 300 on the surface of the first and the second insulation layer pattern 115 and 117 and on the top surfaces of the substrate 100, the pad 270 and the division layer pattern 130 may also be removed to form a second blocking layer pattern 302. The first and second blocking layer patterns 172 and 302 may define a blocking layer pattern structure 312.

In a process in which the gate electrode layer 340 and the second blocking layer 300 are partially removed, the first opening 280 exposing a top surface of the substrate 100 and being extended in the third direction may be formed again, and impurities may be implanted into the exposed top surface of the substrate 100 to form an impurity region 105. In example embodiments, the impurities may include n-type impurities, e.g., phosphorus, arsenic, etc. In example embodiments, the impurity region 105 may be formed to extend in the third direction and serve as a common source line (CSL).

A metal silicide pattern (not shown), e.g., a cobalt silicide pattern or a nickel silicide pattern may be further formed on the impurity region 105.

Figure 22:
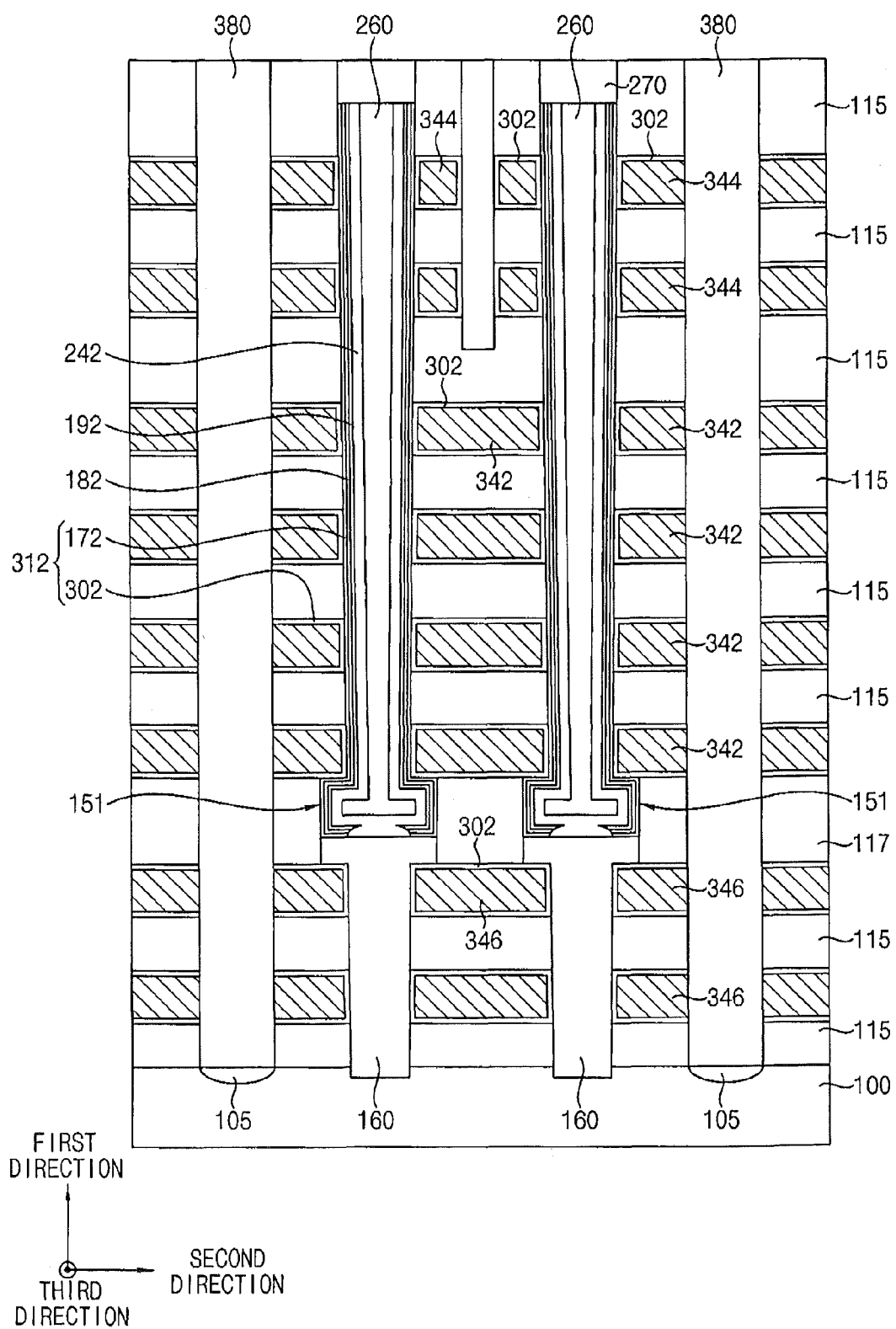

Referring to FIG. 22, a fourth insulation layer pattern 380 filling the first opening 280 may be formed. In example embodiments, after the fourth insulation layer 380 filling the first opening 280 is formed on the substrate 100 and the uppermost first insulation layer pattern 115, the fourth insulation layer may be planarized until a top surface of the uppermost first insulation layer pattern 115 may be exposed to form a fourth insulation layer pattern 380.

Referring to FIG. 2 again, a fifth insulation layer 390 may be formed on the first and fourth insulation layer patterns 115 and 380, the pad 270 and the division layer pattern 130, and a second opening 405 may be formed to expose a top surface of the pad 270. In example embodiments, a plurality of second openings 405 corresponding to the pads 270 may be formed to define a second opening array.

A bit line contact 400 may be formed on the pad 270 to fill the second opening 405, and a bit line 410 electrically connected to the bit line contact 400 may be formed to complete the vertical memory device. The bit line 400 and the bit line contact 410 may be formed to include, for example, a metal, a metal nitride and/or doped polysilicon.

In example embodiments, a plurality of bit line contacts 405 corresponding to the pads 270 may be formed to define a bit line contact array, and a plurality of bit lines 410 may be formed in the third direction, and each bit line 410 may be formed to extend in the second direction.

Figure 23:
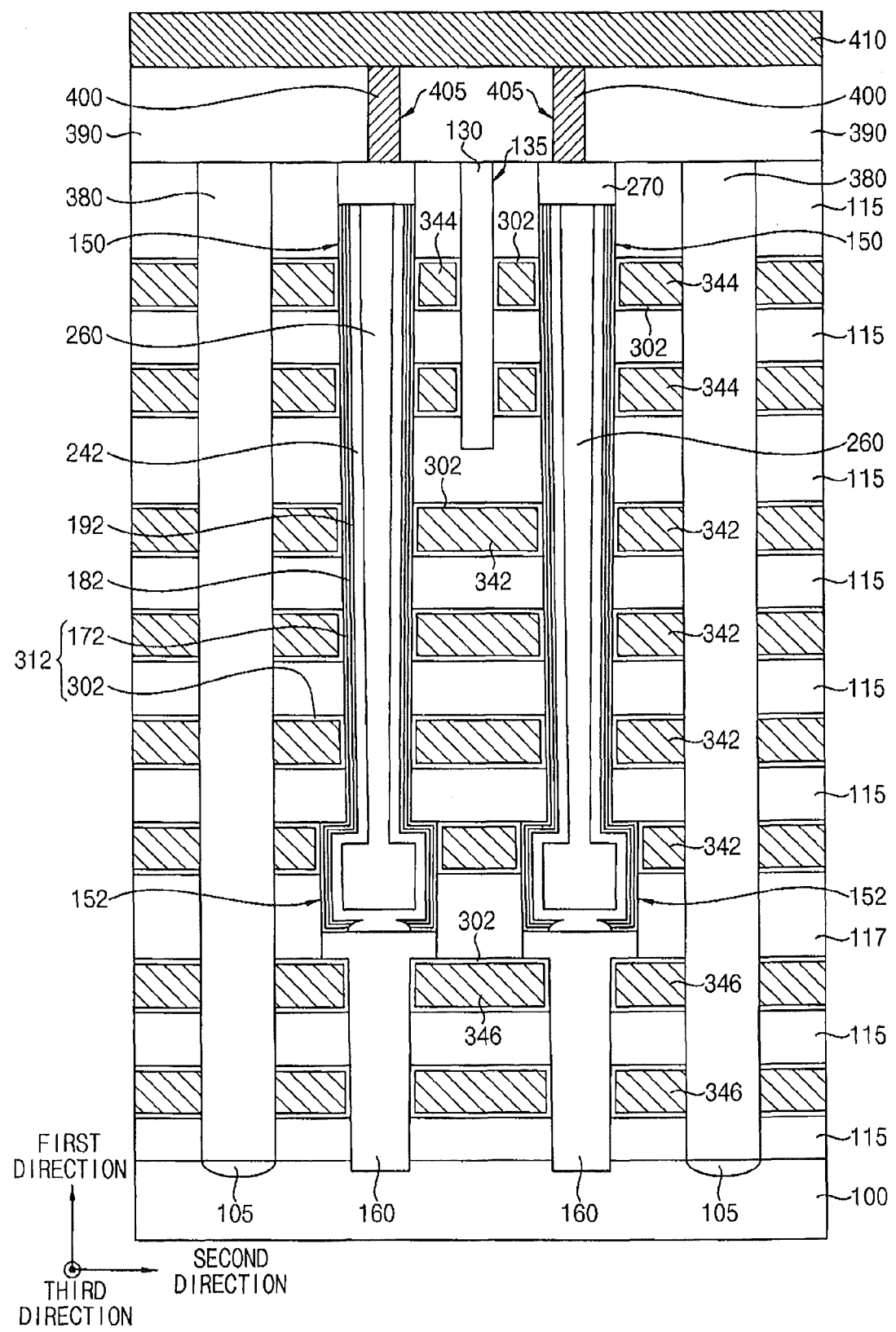

FIG. 23 is a vertical cross-sectional view illustrating a vertical memory device in accordance with example embodiments. The vertical memory device may be substantially the same as that of FIGS. 1 to 3, except for a shape of a hole extension and a shape of a gate electrode corresponding thereto. Thus, like reference numerals refer to like elements, and repetitive explanations thereon may be omitted herein.

Referring to FIG. 23, the vertical memory device may include a plurality of first and second insulation layer patterns 115 and 117 and a plurality of gate electrodes 342, 344 and 346 alternately and repeatedly stacked on a substrate 100, a semiconductor pattern 160 filling a lower portion of a hole 150, which may be formed through the first and the second insulation layer patterns 115 and 117 and the gate electrodes 342, 344 and 346 and have a portion extended horizontally i.e., a second hole extension 152, and having a top surface located in the second extension hole 152, a first blocking layer pattern 172, a charge storage layer pattern 182 and a tunnel insulation layer pattern 192 sequentially stacked on a portion of the top surface of the semiconductor pattern 160 and a sidewall of the hole 150, and a channel 242 on the tunnel insulation layer pattern 192 contacting a portion of the top surface or the semiconductor pattern 160 in the hole 150.

Each of the holes 150 may include the second hole extension 152. The second hole extension 152 may have a space horizontally extended when compared to other regions. In example embodiments, the second hole extension 152 may penetrate through the second insulation layer pattern 117 and a portion of the gate electrodes 342, 344 and 346. In the present embodiment, the second insulation layer pattern 117 may be formed at a single level, and the second hole extension 152 may be formed through the single level of the word line 342 among the gate electrodes 342, 344 and 346. Therefore, the second hole extension 152 may have a vertical length corresponding to the sum of thicknesses of one second insulation layer pattern 117 and one first word line 342. The word line 342 through which the second hole extension 152 is formed may have a shorter horizontal length when compared to the word lines 342 at other levels.

The second hole extension 152 may be formed to have a vertical length longer than that of the first hole extension 151 illustrated with reference to FIGS. 1 to 3. Thus, when the hole 150 have an inclined sidewall profile, the semiconductor pattern 160 including the top surface located in a lower portion of the second hole extension 151 may contact the channel 242 at a wider area, therefore, the semiconductor device may have electrically good characteristics.

Figure 24:
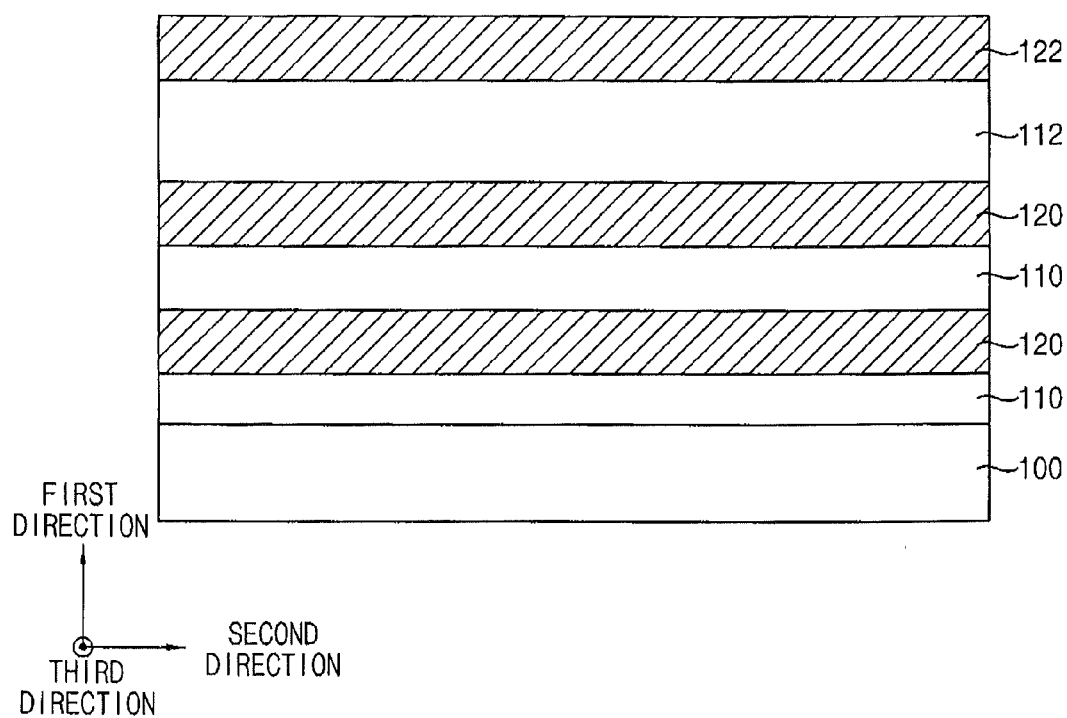
Figure 25:
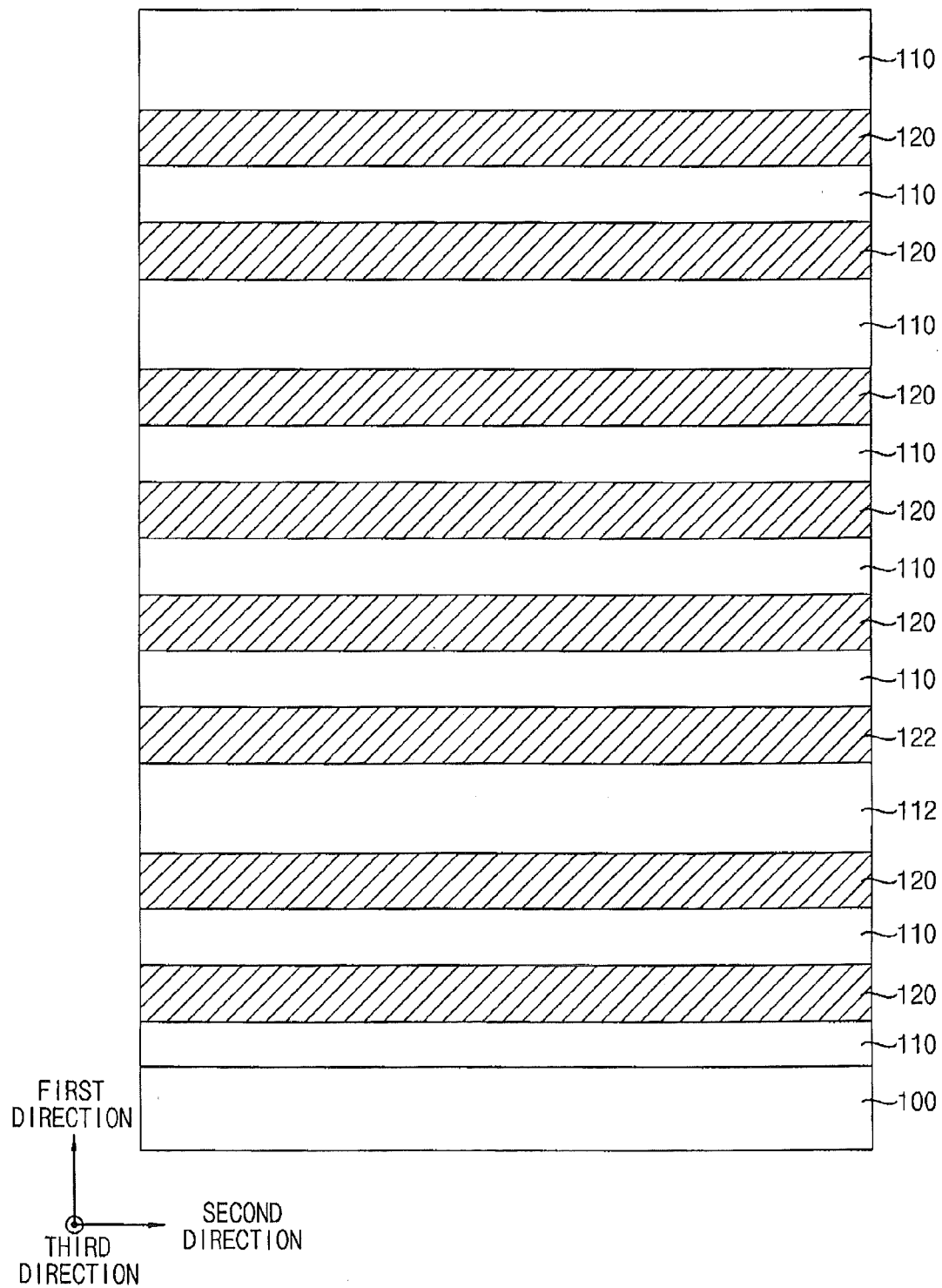
Figure 26:
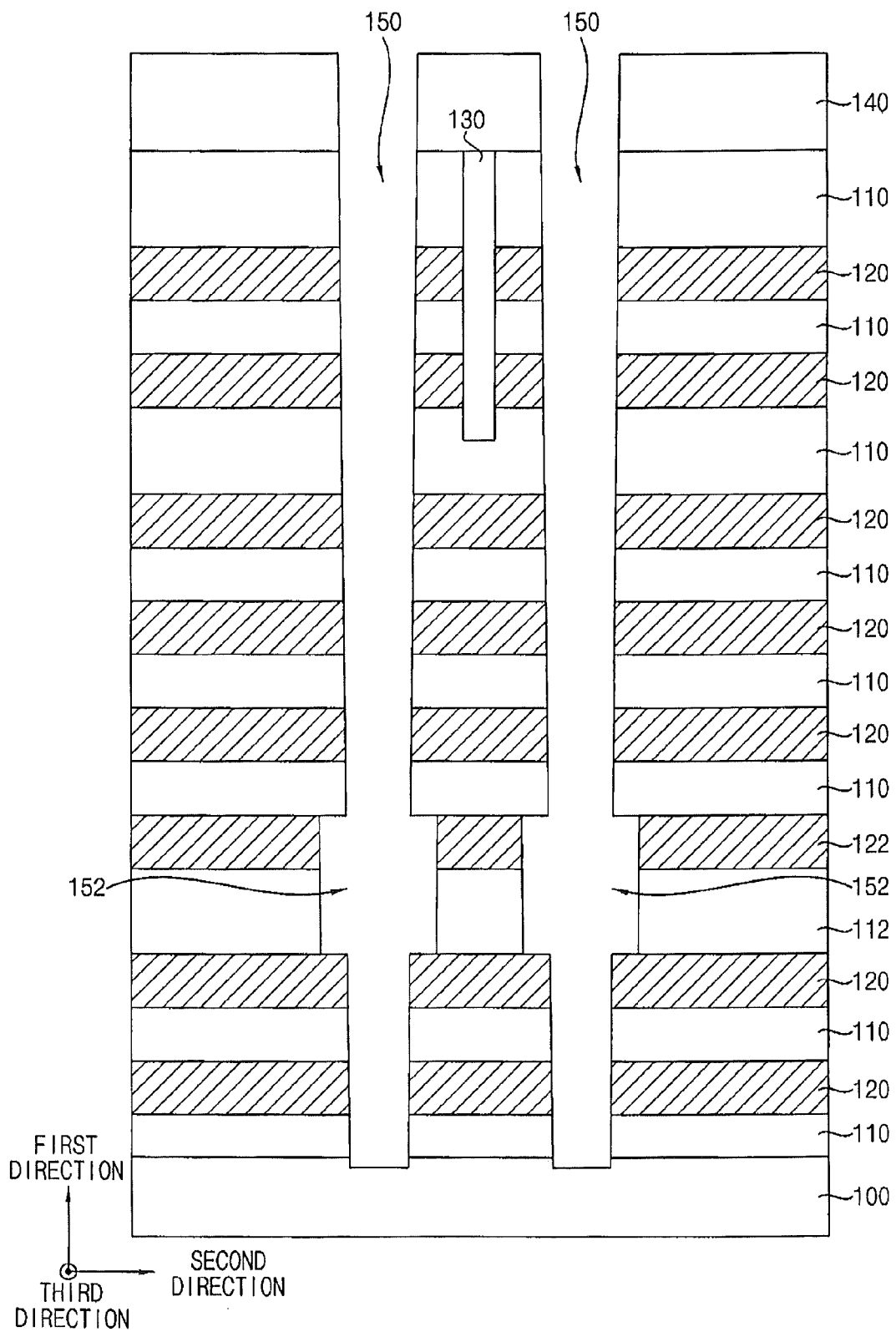

FIGS. 24 to 26 are vertical cross-sectional views illustrating stages of a method of manufacturing a vertical memory device in accordance with example embodiments. The figures illustrate a method of manufacturing the vertical memory device illustrated with reference to FIG. 23, however, may not be limited thereto. This method may include processes substantially the same as or similar to those illustrated with reference to FIGS. 4 to 22, and thus like reference numerals refer to like elements, and repetitive explanations thereon may be omitted herein.

Referring to FIG. 24, first, processes substantially the same as or similar to those illustrated with reference to FIGS. 4 to 5 may be performed to form a first insulation layer 110 and a sacrificial layer 120 at a plurality of levels, and a second insulation layer 112 may be formed on an uppermost of the first sacrificial layer 120 at a single level.

A second sacrificial layer 122 may be formed on the second insulation layer 112.

In example embodiments, the second sacrificial layer 122 may formed to include silicon nitride having an etch rate higher than the first sacrificial layer 120. In other words, the second sacrificial layer 122 may be formed using silicon nitride having a relatively high etch rate with respect to hydrofluoric acid or phosphoric acid serving as an etching solution for etching the first and the second sacrificial layers 120 and 122. Thus, the second sacrificial layer 122 may be formed using silicon nitride having a concentration of nitride higher than that of the first sacrificial layer 120, or silicon nitride that is substantially the same as that of the first sacrificial layer 120, however, further includes impurities. Alternatively, the second sacrificial layer 122 may be formed using a material substantially the same as the first sacrificial layer 120, however, may have an etch rate higher than the first sacrificial layer 120 because the second sacrificial layer 122 may be formed as a porous layer deposited at a relatively low temperature.

Referring to FIG. 25, processes substantially the same as or similar to those illustrated with reference to FIG. 6 may be performed to form the first insulation layer 110 and the first sacrificial layer 120 alternately and repeatedly on the second sacrificial layer 122.

Referring to FIG. 26, processes substantially the same as or similar to those illustrated with reference to FIGS. 7 to 9 may be performed to form a division layer pattern 130 and a hole 150 including a second hole extension 152.

The second hole extension 152 may be formed by removing portions of the second insulation layer 112 and the second sacrificial layer 122 exposed by each of the holes 150.

In example embodiments, the second insulation layer 112 may be wet etched using hydrofluoric acid as an etching solution, and the second sacrificial layer 122 may be wet etched using phosphoric acid or hydrofluoric acid as an etching solution. The second sacrificial layer 122 may have an etch rate with respect to the hydrofluoric acid or the phosphoric acid higher than the first sacrificial layer 120, and therefore may be easily etched. The second hole extension 152 through the second insulation layer 112 and the second sacrificial layer 122 may have a space horizontally extended compared to those of other regions of the holes 150 through the first insulation layer 110 or the first sacrificial layer 120.

Referring to FIG. 23 again, processes substantially the same as or similar to those illustrated with reference to FIGS. 10 to 22 and FIGS. 1 to 3 may be performed to complete the vertical memory device.

The second hole extension 152 may be formed to have the vertical length greater than that of the first hole extension 151, and the semiconductor pattern 160 may be formed to have a top surface located in a lower portion of the second hole extension 152. Thus, when the hole 150 have the inclined sidewall profile, an area opened by a spacer 222 in the second hole extension 152 may be larger than that of the first hole extension 151. Therefore, portions of a first blocking layer pattern 170, a charge storage layer 180 and a tunnel insulation layer 190 formed on the top surface of the semiconductor pattern 160 may be removed more easily, and thus, the channel 242 formed on the tunnel insulation layer pattern 192 may contact the top surface of the semiconductor pattern 160 at a wider region.

Figure 27:
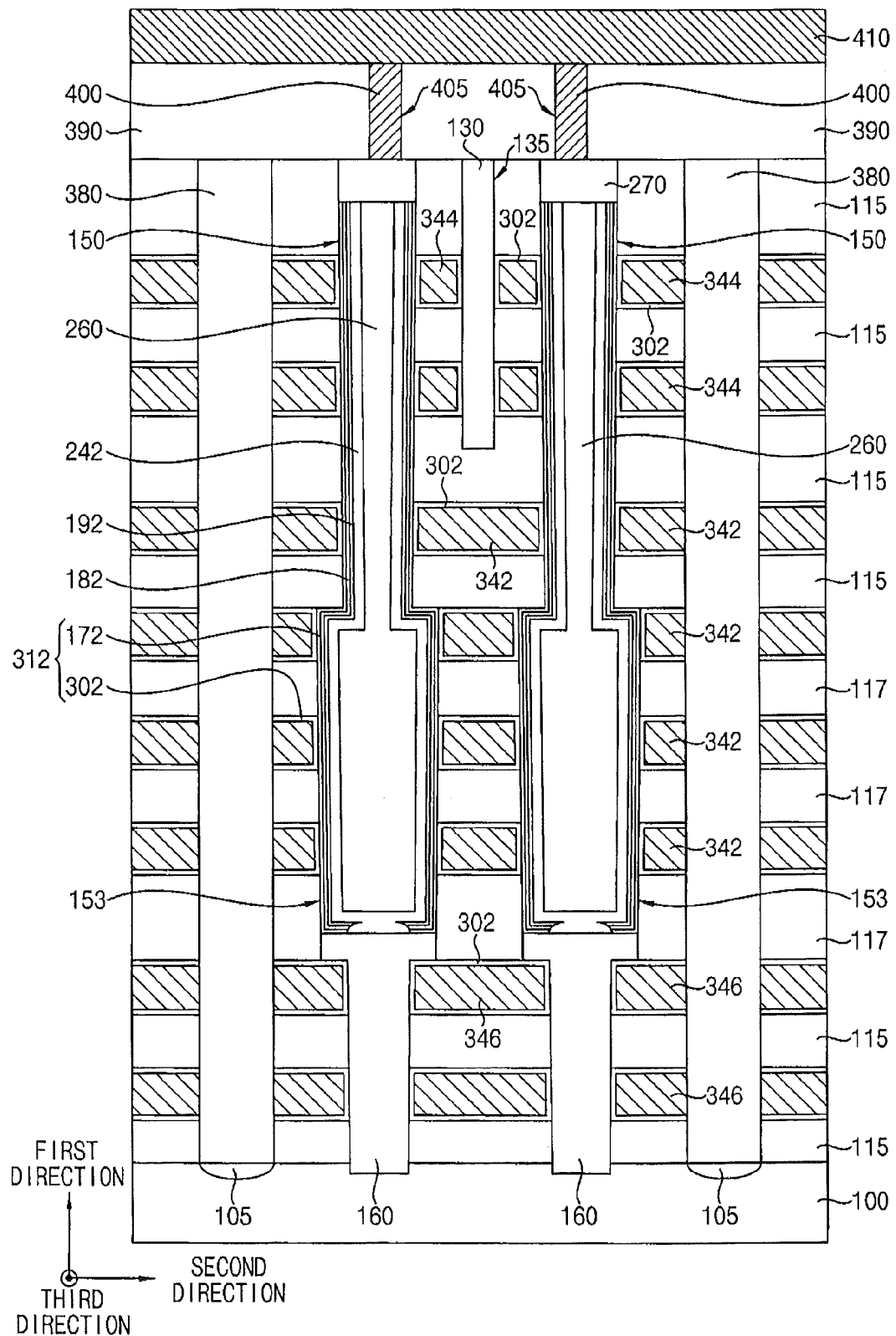

FIG. 27 is a vertical cross-sectional view illustrating a vertical memory device in accordance with example embodiments. The vertical memory device may be substantially the same as that of FIG. 23, except for a shape of a hole extension and a shape of a gate electrode corresponding thereto. Thus, like reference numerals refer to like elements, and repetitive explanations thereon may be omitted herein.

Referring to FIG. 27, the vertical memory device may include a plurality of first and the second insulation layer patterns 115 and 117 and a plurality of gate electrodes 342, 344 and 346 alternately and repeatedly stacked on a substrate 100, a semiconductor pattern 160 filling a lower portion of a hole 150, which may be formed through the first and the second insulation layer patterns 115 and 117 and the gate electrodes 342, 344 and 346 and have a portion extended horizontally i.e., a third hole extension 153, and having a top surface located in the third hole extension 153, a first blocking layer pattern 172, a charge storage layer pattern 182 and a tunnel insulation layer pattern 192 sequentially stacked on a portion of the top surface of the semiconductor pattern 160 and a sidewall of the hole 150, and a channel 242 on the tunnel insulation layer pattern 192, which may contact a portion of the top surface of the semiconductor pattern 160 in the hole 150.

Each of the holes 150 may include the third hole extension 153. The third hole extension 153 may have a space horizontally extended when compared to other regions. In example embodiments, the third hole extension 153 may penetrate through the second insulation layer pattern 117 and portions of the gate electrodes 342, 344 and 346. In the present embodiment, the second insulation layer pattern 117 may be formed at a plurality of levels (3 levels in FIG. 27), and the third hole extension 153 may be formed through the word line 342 at three levels among the gate electrodes 342, 344 and 346. Thus, the third hole extension 153 may have a vertical length corresponding to the sum of thicknesses of three second insulation layer patterns 117 and three word lines 342. The word lines 342 through which the third hole extension 153 is formed may have a horizontal length shorter than those of the word lines 342 at other levels.

The third hole extension 153 may be formed to have a vertical length longer than that of the second hole extension 152 illustrated with reference to FIG. 23. Thus, when the hole 150 has an inclined sidewall profile, the semiconductor pattern 160 including the top surface located in a lower portion of the third hole extension 153 may contact the channel 242 at a wider area, therefore, the semiconductor device may have electrically good characteristics.

FIG. 27 illustrates the third extension hole 153 through the second insulation layer patterns 117 at 3 levels and the word line 342 at 3 levels, however, the present inventive concept may not be limited thereto, and therefore, the third hole extension 153 may be also formed through the second insulation layer patterns 117 and the word lines 342 at a plurality of levels other than 3 levels.

Figure 28:
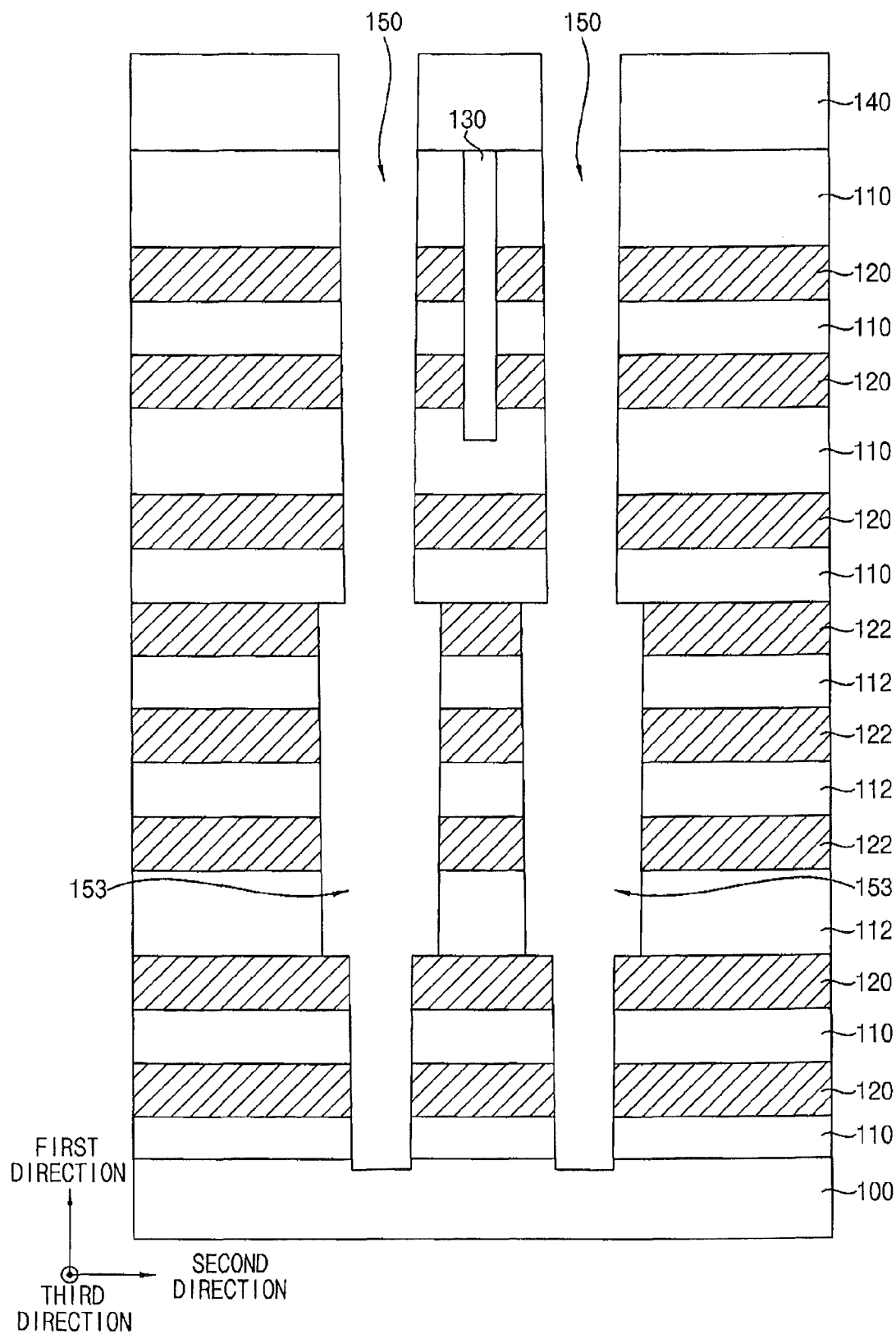

FIG. 28 is a vertical cross-sectional view illustrating a stage of a method of manufacturing a vertical memory device in accordance with example embodiments. The figure illustrates a method of manufacturing the vertical memory device illustrated with reference to FIG. 27, however, may not be limited thereto. This method may include processes substantially the same as or similar to those illustrated with reference to FIGS. 24 to 26, and thus like reference numerals refer to like elements, and repetitive explanations thereon may be omitted herein.

First, processes substantially the same as or similar to those illustrated with reference to FIGS. 24 to 25 may be performed. However, the first insulation layer 110 and the first sacrificial layer 120 may be formed at 2 levels, respectively, and the second sacrificial layer 122 and the second insulation layer 112 may be formed at a plurality of levels, respectively. The first insulation layer 110 and the first sacrificial layer 120 may be formed at a plurality of levels thereon, respectively.

Referring to FIG. 28, processes substantially the same as or similar to those illustrated with reference to FIG. 26 may be performed to form a division layer pattern 130 and a hole 150 including a third hole extension 153.

The third hole extension 153 may be formed by removing portions of the second insulation layer 112 and the second sacrificial layer 122 exposed by each of the holes 150.

Referring to FIG. 27 again, processes substantially the same as or similar to those illustrated with reference to FIG. 23 may be performed to complete the vertical memory device.

The third hole extension 153 may be formed to have a vertical length longer than that of the second hole extension 152, and the semiconductor pattern 160 may be formed to have a top surface located in a lower portion of the third hole extension 153. Thus, when the hole 150 have an inclined sidewall profile, an opened space by a spacer 222 in the third hole extension 153 may be wider than that of the second hole extension 152. Therefore, portions of a first blocking layer pattern 170, a charge storage layer 180 and a tunnel insulation layer 190 formed on the top surface of the semiconductor pattern 160 may be removed more easily, and thus, the channel 242 formed on the tunnel insulation layer pattern 192 may contact the top surface of the semiconductor pattern 160 at a wider area.

Figure 29:
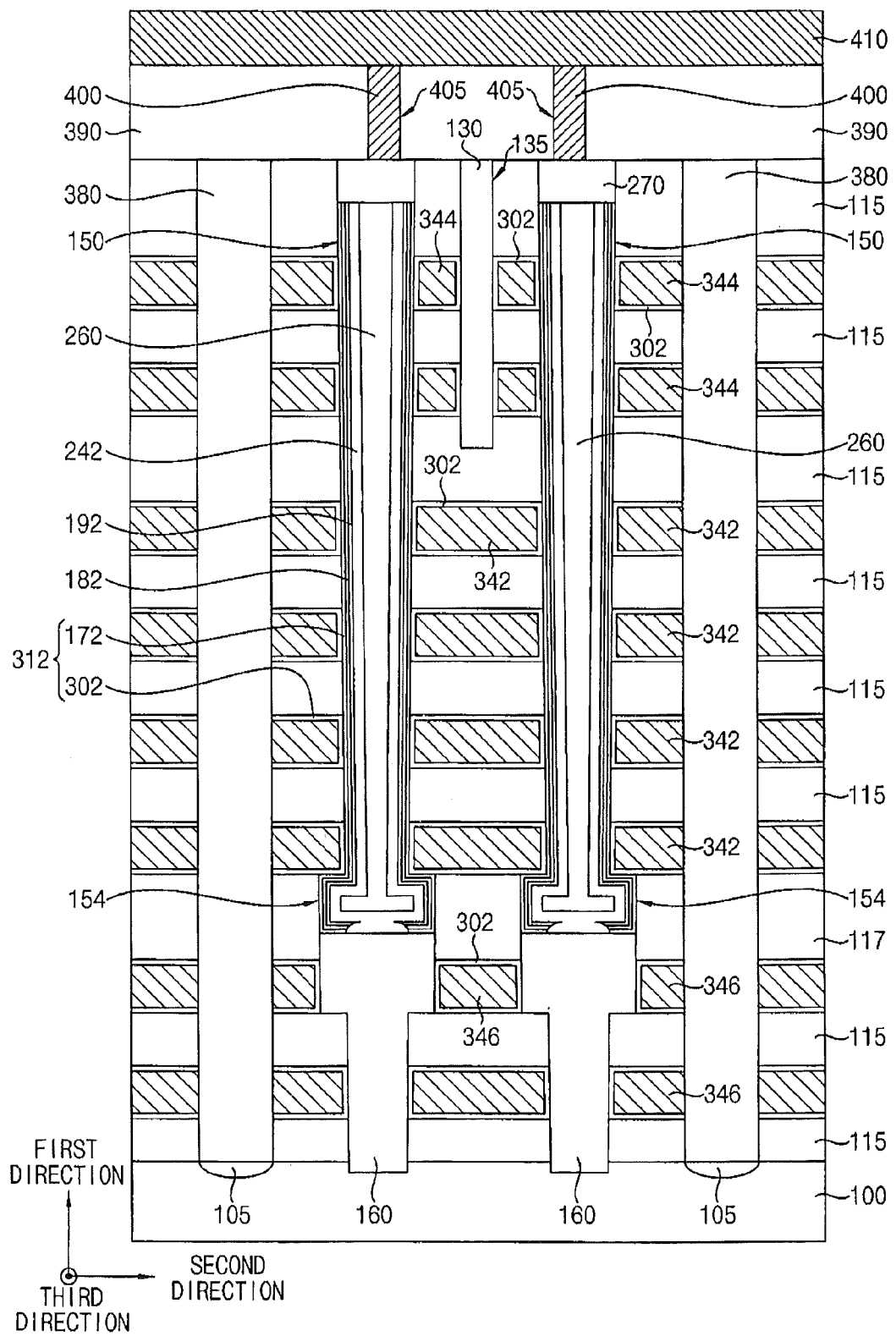

FIG. 29 is a vertical cross-sectional view illustrating a vertical memory device in accordance with example embodiments. The vertical memory device may be substantially the same as that of FIG. 23, except for a shape of a hole extension and a shape of a gate electrode corresponding thereto. Thus, like reference numerals refer to like elements, and repetitive explanations thereon may be omitted herein.

Referring to FIG. 29, the vertical memory device may include a plurality of first and second insulation layer patterns 115 and 117 and a plurality of gate electrodes 342, 344 and 346 alternately and repeatedly stacked on a substrate 100, a semiconductor pattern 160 filling a lower portion of a hole 150, which may be formed through the first and the second insulation layer patterns 115 and 117 and the gate electrodes 342, 344 and 346 and have a portion extended horizontally i.e., a fourth hole extension 155, and having a top surface located in the fourth hole extension 155, a first blocking layer pattern 172, a charge storage layer pattern 182 and a tunnel insulation layer pattern 192 sequentially stacked on a portion of the top surface of the semiconductor pattern 160 and a sidewall of the hole 150, and a channel 242 on the tunnel insulation layer pattern 192, which may contact a portion of the top surface of the semiconductor pattern 160 in the hole 150.

Each of the holes 150 may include the fourth hole extension 155. The fourth hole extension 155 may have a space horizontally extended when compared to other regions. In example embodiments, the fourth hole extension 155 may penetrate through the second insulation layer pattern 117 and a portion of the gate electrodes 342, 344 and 346. In the present embodiment, the second insulation layer pattern 117 may be formed at a single level and the fourth hole extension 154 may be formed through a GSL 346 at a single level, and thus the fourth hole extension 154 may have a vertical length corresponding to the sum of thicknesses of one second insulation layer pattern 117 and one GSL 346. The GSL 346 adjacent to the fourth hole extension 155 may have a horizontal length shorter than that of the GSL 346 at other levels.

The top surface of the semiconductor pattern 160 filling the lower portion of the hole 150 may be located in an upper portion of the fourth hole extension 155. Thus, in the present embodiment, the channel 242 may contact the semiconductor pattern 160 easily like the vertical memory device illustrated with reference to FIG. 23 however, the fourth hole extension 155 may be formed through the gate electrode beneath the second insulation layer pattern 117, i.e., the GSL 346, unlike the second hole extension 152.

Figure 30:
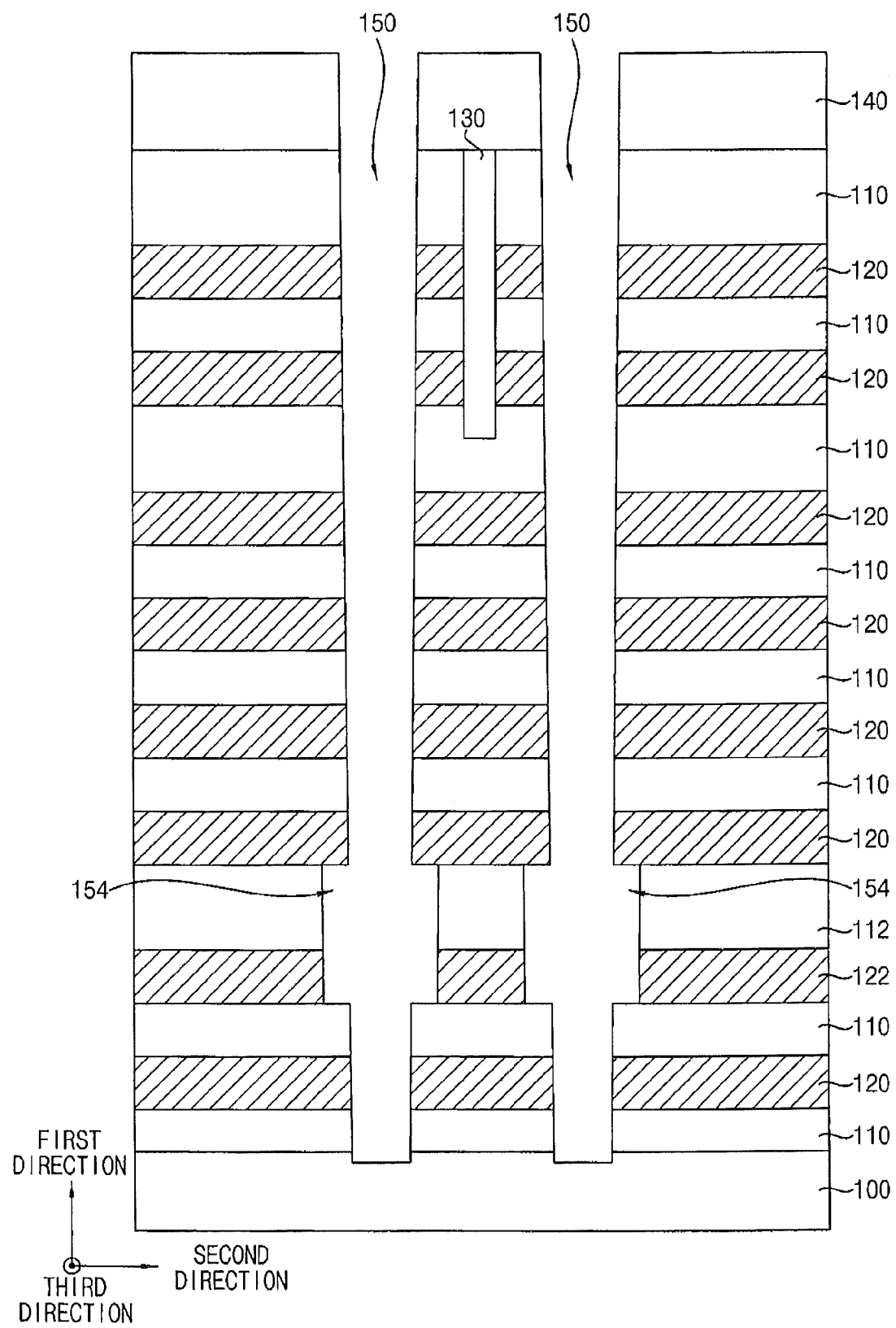

FIG. 30 is a vertical cross-sectional view illustrating a stage of a method of manufacturing a vertical memory device in accordance with example embodiments. The figure illustrates a method of manufacturing the vertical memory device with reference to FIG. 29, however, may not be limited thereto. This method may include processes substantially the same as or similar to those illustrated with reference to FIGS. 24 to 26, and thus like reference numerals refer to like elements, and repetitive explanations thereon may be omitted herein.

First, processes substantially the same as or similar to those illustrated with reference to FIGS. 24 to 25 may be performed. However, the first insulation layer 110 and the first sacrificial layer 120 may be formed at 2 levels, respectively, and the second sacrificial layer 122 and the second insulation layer 112 may be formed at a single level, respectively. The first insulation layer 110 and the first sacrificial layer 120 may be formed at a plurality of levels thereon, respectively.

Referring to FIG. 30, processes substantially the same as or similar to those illustrated with reference to FIG. 26 may be performed to form a division layer pattern 130 and a hole 150 including a fourth hole extension 155.

The fourth hole extension 155 may be formed by removing portions of the second insulation layer 112 and the second sacrificial layer 122 exposed by each of the holes 150.

Referring to FIG. 29 again, processes substantially the same as or similar to those illustrated with reference to FIG. 23 may be performed to complete the vertical memory device.

Figure 31:
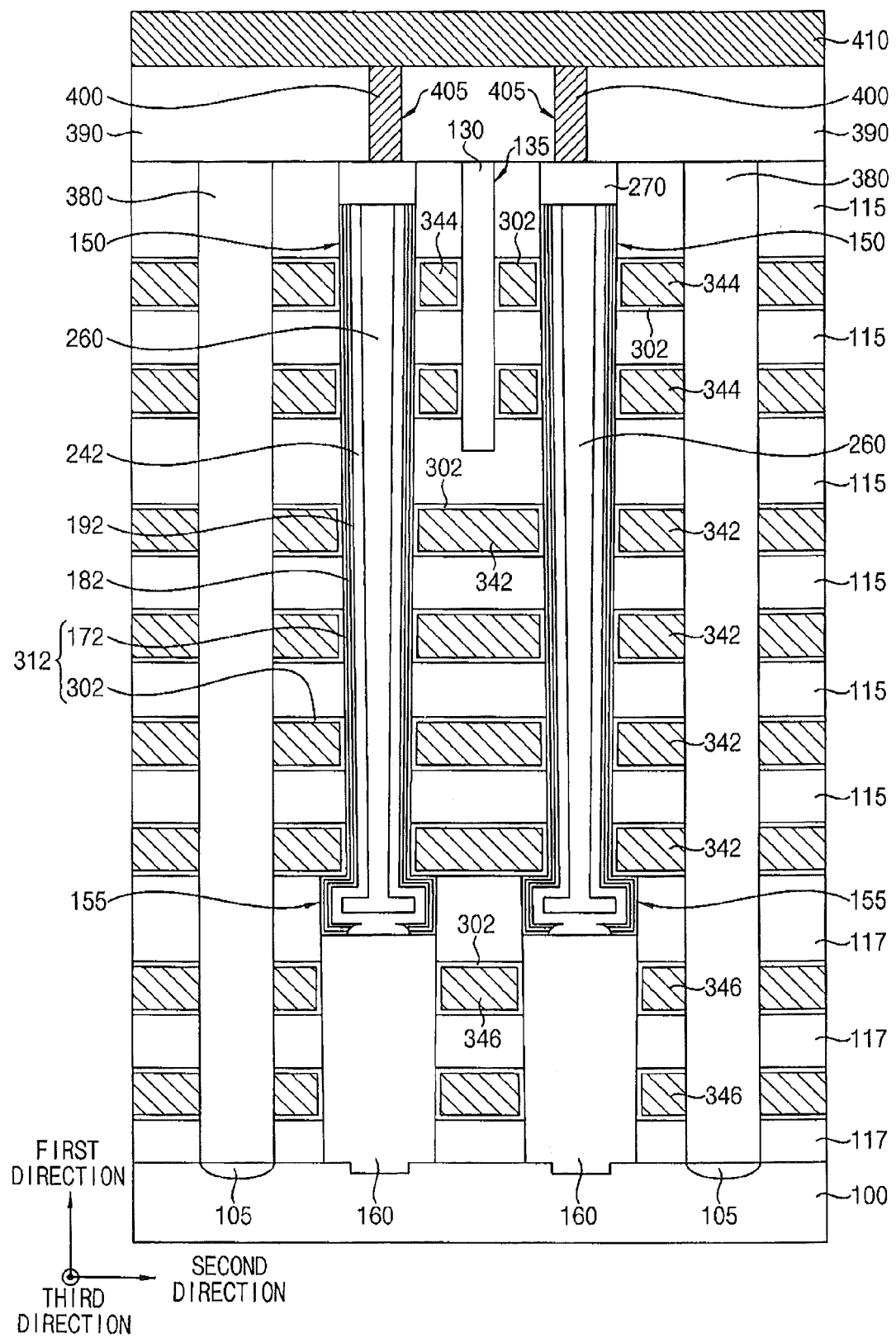

FIG. 31 is a vertical cross-sectional view illustrating a vertical memory device in accordance with example embodiments. The vertical memory device may be substantially the same as that of FIG. 23, except for a shape of a hole extension and a shape of a gate electrode corresponding thereto. Thus, like reference numerals refer to like elements, and repetitive explanations thereon may be omitted herein.

Referring to FIG. 31, the vertical memory device may include a plurality of first and the second insulation layer patterns 115 and 117 and a plurality of gate electrodes 342, 344 and 346 alternately and repeatedly stacked on a substrate 100, a semiconductor pattern 160 filling a lower portion of a hole 150, which may be formed through the first and the second insulation layer patterns 115 and 117 and the gate electrodes 342, 344 and 346 and have a portion extended horizontally i.e., a fifth hole extension 155, and having a top surface located in the fifth hole extension 155, a first blocking layer pattern 172, a charge storage layer pattern 182 and a tunnel insulation layer pattern 192 sequentially stacked on a portion of the top surface of the semiconductor pattern 160 and a sidewall of the hole 150, and a channel 242 on the tunnel insulation layer pattern 192 contacting a portion of the top surface of the semiconductor pattern 160 in the hole 150.

Each of the holes 150 may include the fifth hole extension 155. The fifth hole extension 155 may have a space horizontally extended when compared to other regions. In example embodiments, the fifth hole extension 155 may be formed through the second insulation layer pattern 117 and portions of the gate electrodes 342, 344 and 346. In the present embodiment, the second insulation layer pattern 117 may be formed at 3 levels and the fifth hole extension 155 may formed through a GSL 346 at 2 levels, and thus the fifth hole extension 155 may have a vertical length corresponding to the sum of thicknesses of three second insulation layer patterns 117 and two GSLs 346. The GSL 346 may be formed through the fifth hole extension 155, therefore, the fifth hole extension 155 may have a shorter horizontal length than that of a word line 342 or a SSL 344.

The top surface of the semiconductor pattern 160 filling the lower portion of the hole 150 may be located in an upper portion of the fifth hole extension 155. Thus, in the present embodiment, the channel 242 may contact the semiconductor pattern 160 easily like the vertical memory device illustrated with reference to FIG. 29, however, the fifth hole extension 155 may penetrate through the GSL 346 at all levels, unlike the fourth hole extension 154.

Figure 32:
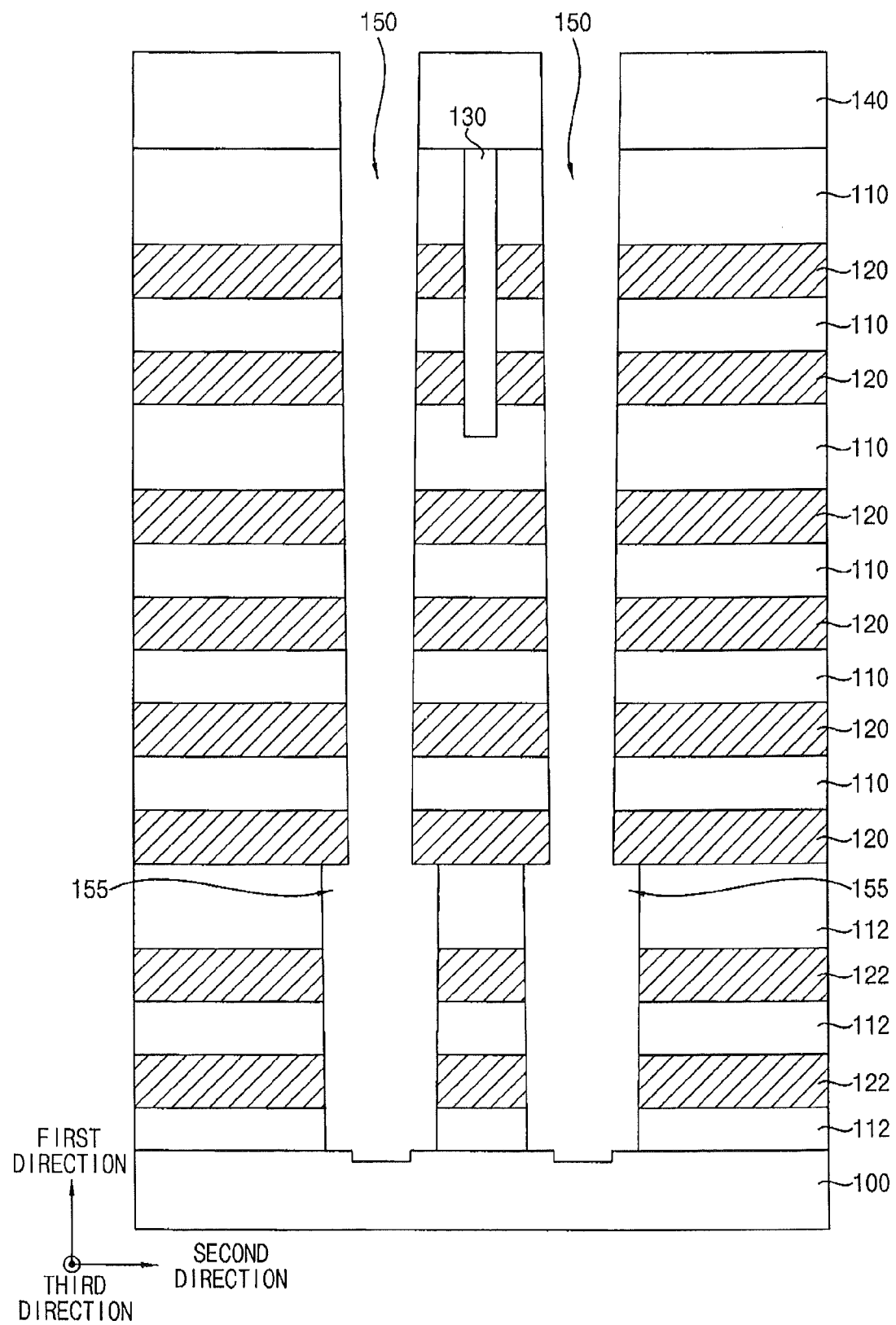

FIG. 32 is a vertical cross-sectional view illustrating a stage of a method of manufacturing a vertical memory device in accordance with example embodiments. The figure illustrates a method of manufacturing the vertical memory device with reference to FIG. 31, however, may not be limited thereto. This method may include processes substantially the same as or similar to those illustrated with reference to FIG. 30, and thus like reference numerals refer to like elements, and repetitive explanations thereon may be omitted herein.

First, processes substantially the same as or similar to those illustrated with reference to FIG. 30 may be performed to form an isolation layer pattern 130 and a hole 150 with a fifth hole extension 155. However, the second sacrificial layer 122 may be formed at 2 levels and the second insulation layer 112 may be formed at 3 levels, and the first insulation layer 110 and the first sacrificial layer 120 may be formed at a plurality of levels, respectively, thereafter.

Referring to FIG. 31 again, processes substantially the same as or similar to those illustrated with reference to FIG. 29 may be performed to complete the vertical memory device.

Figure 33:
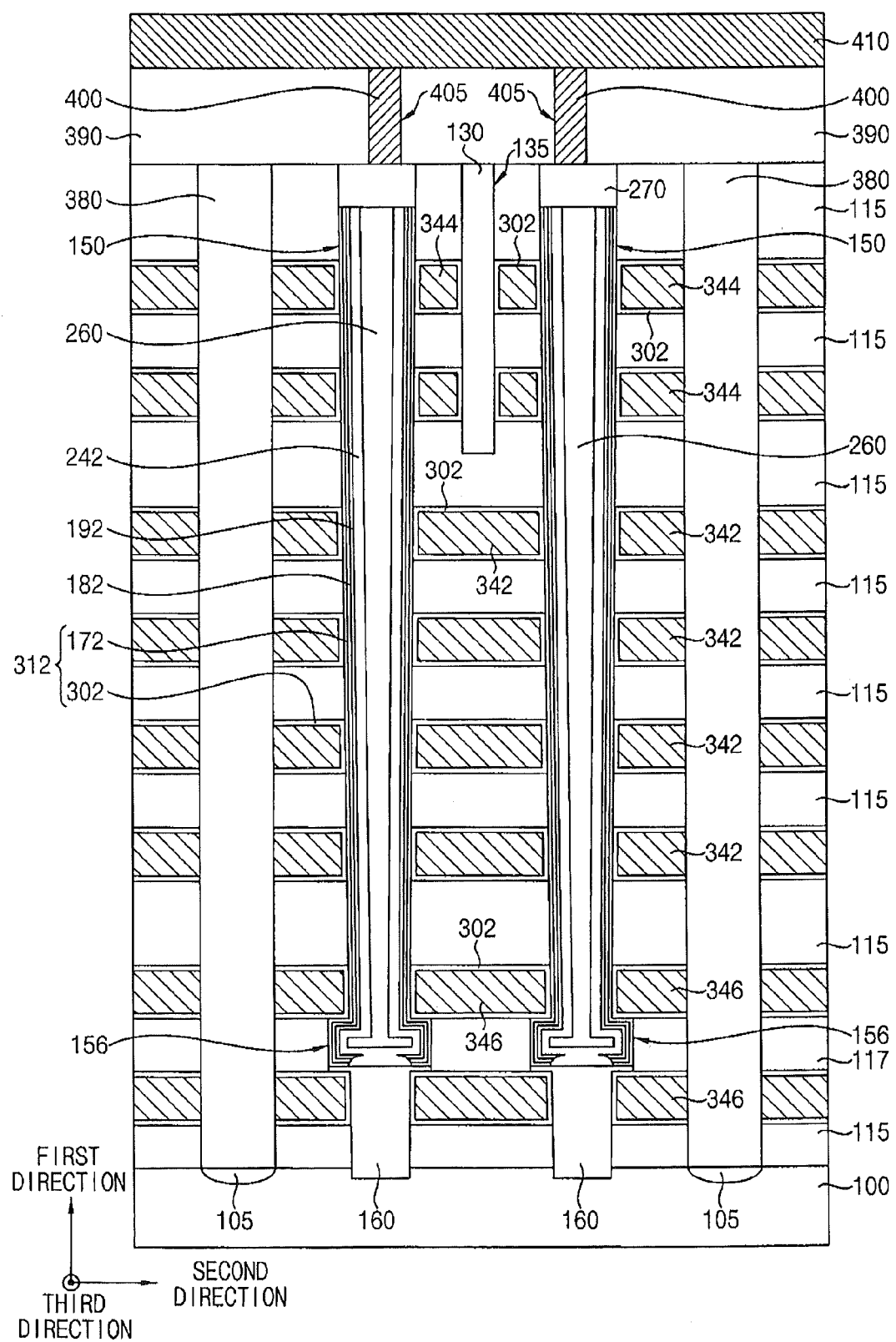

FIG. 33 is a vertical cross-sectional view illustrating a vertical memory device in accordance with example embodiments. The vertical memory device may be substantially the same as that of FIGS. 1 to 3, except for a shape of a hole extension and a shape of a semiconductor pattern. Thus, like reference numerals refer to like elements, and repetitive explanations thereon may be omitted herein.

Referring to FIG. 33, the vertical memory device may include a plurality of first and the second insulation layer patterns 115 and 117 and a plurality of gate electrodes 342, 344 and 346 alternately and repeatedly stacked on a substrate 100, a semiconductor pattern 160 filling a lower portion of a hole 150, which may be formed through the first and the second insulation layer patterns 115 and 117 and the gate electrodes 342, 344 and 346 and have a portion extended horizontally i.e., a sixth hole extension 156, and having a top surface located in the sixth extension hole 156, a first blocking layer pattern 172, a charge storage layer pattern 182 and a tunnel insulation layer pattern 192 sequentially stacked on a portion of the top surface of the semiconductor pattern 160 and a sidewall of the hole 150, and a channel 242 on the tunnel insulation layer pattern 192 contacting a portion of the top surface of the semiconductor pattern 160 in the hole 150.

Each of the holes 150 may include the sixth hole extension 156. The sixth hole extension 156 may have a space horizontally extended when compared to other regions. In example embodiments, the sixth hole extension 156 may be formed through the second insulation layer pattern 117. In the present embodiment, the second insulation layer pattern 117 may be formed between the GSL 345 at 2 levels, and thus the sixth hole extension 156 may have a vertical length corresponding to a thickness of one second insulation layer pattern 117.

The top surface of the semiconductor pattern 160 filling a lower portion of the hole 150 may be located in an upper portion of the sixth hole extension 156. Thus, the channel 242 may contact the semiconductor pattern 160 easily like the vertical memory device illustrated with reference to FIGS. 1 to 3, however, the top surface of the semiconductor pattern 160 may be formed at a lower location than that of the vertical memory device illustrated with reference to FIGS. 1 to 3.

Figure 34:
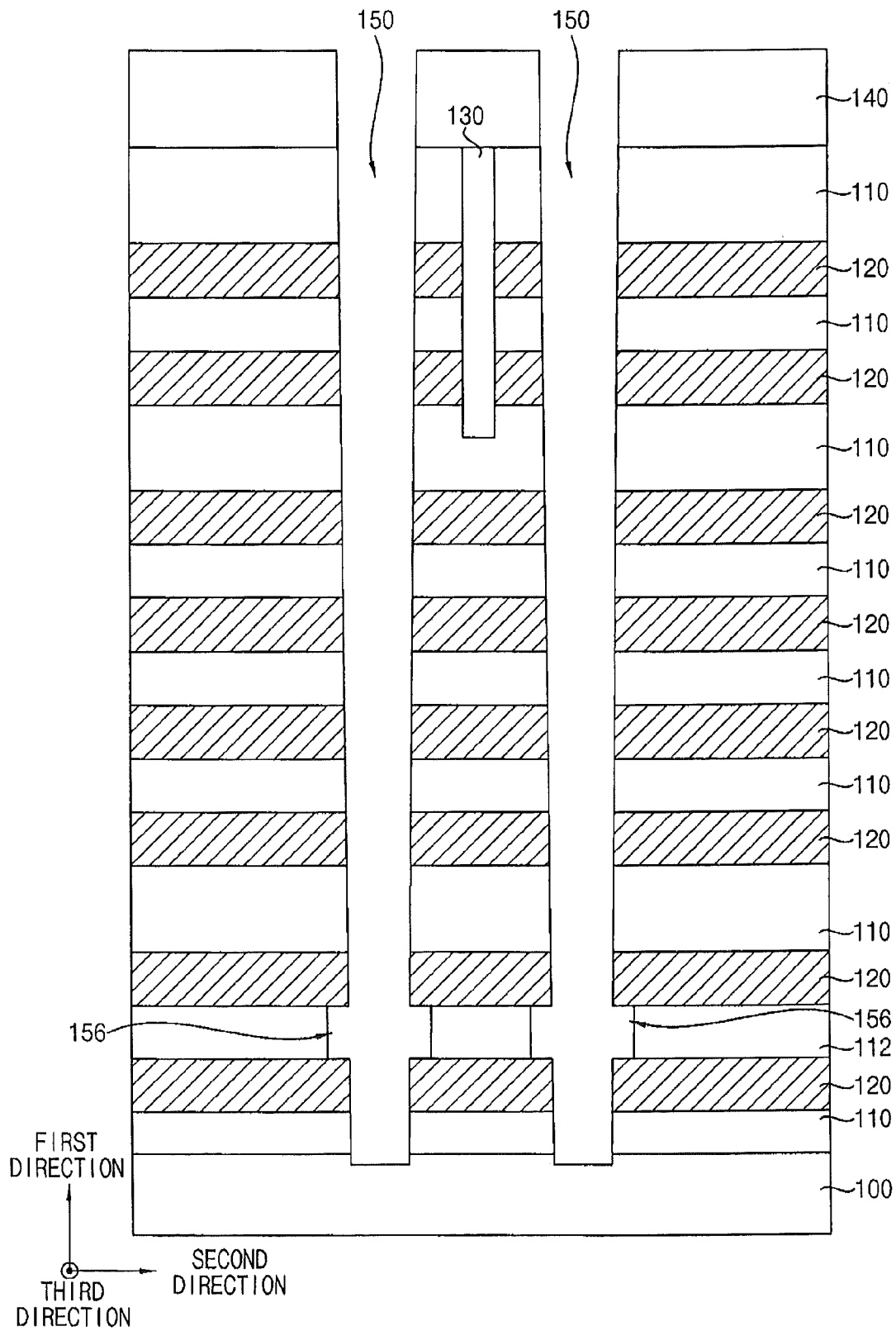

FIG. 34 is a vertical cross-sectional view illustrating a stage of a method of manufacturing a vertical memory device in accordance with example embodiments. The figure illustrates a method of manufacturing the vertical memory device with reference to FIG. 33, however, may not be limited thereto. This method may include processes substantially the same as or similar to those illustrated with reference to FIGS. 4 to 22, and thus like reference numerals refer to like elements, and repetitive explanations thereon may be omitted herein.

First, processes substantially the same as or similar to those illustrated with reference to FIG. 4 may be performed. In the present embodiment, however, a first insulation layer 110 and a sacrificial layer 120 may be formed at a single level, respectively.

Processes substantially the same as or similar to those illustrated with reference to FIG. 5 may be performed to form a second insulation layer 112 at a single level on the first sacrificial layer 120.

Processes substantially the same as or similar to those illustrated with reference to FIGS. 8 and 9 may be performed to form a hole 150 including a sixth hole extension 156.

Referring to FIG. 33 again, processes substantially the same as or similar to those illustrated with reference to FIGS. 10 to 22 and FIGS. 1 to 3 may be performed to complete the vertical memory device.

Figure 35:
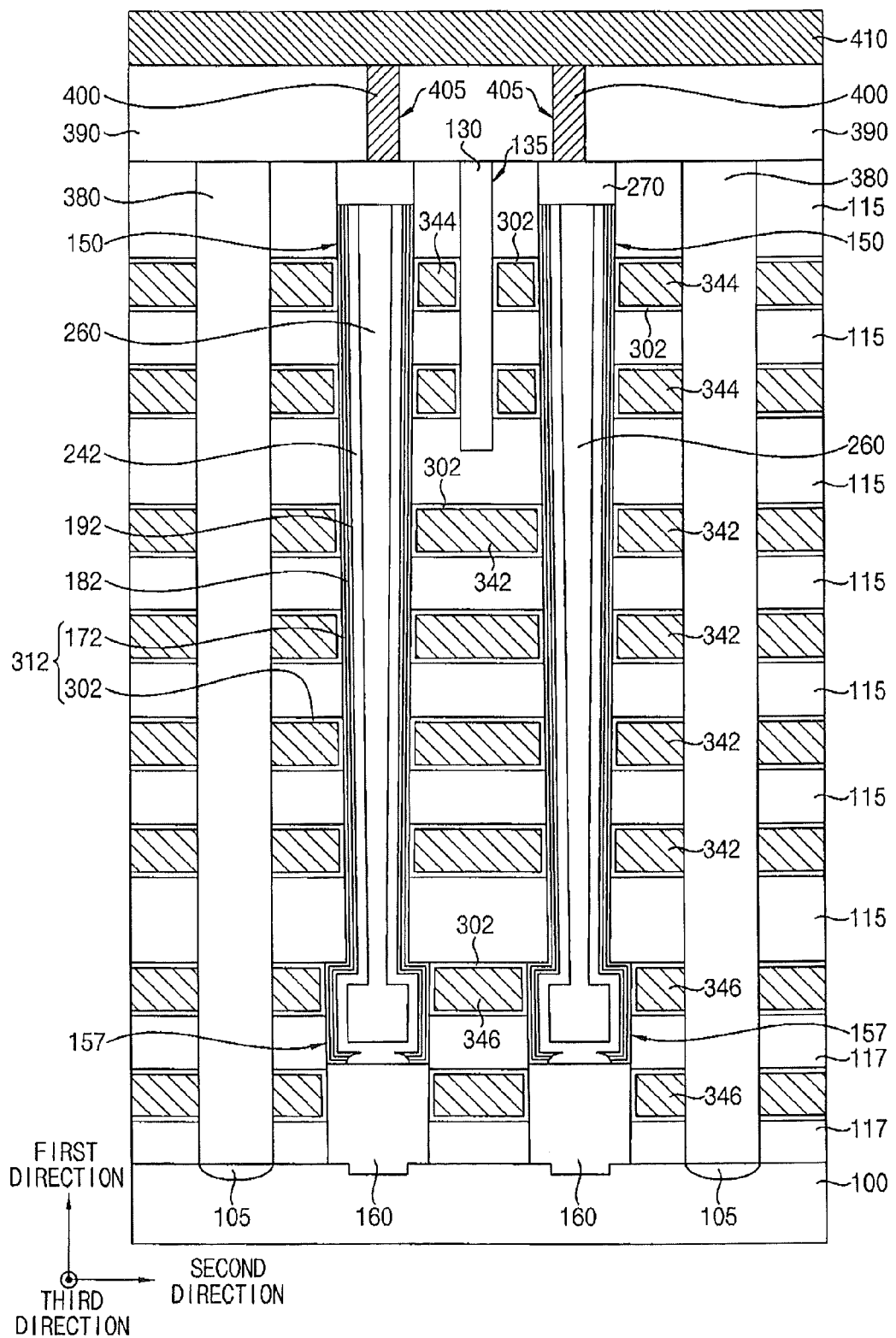

FIG. 35 is a vertical cross-sectional view illustrating a vertical memory device in accordance with example embodiments. The vertical memory device may be substantially the same as that of FIG. 33, except for a shape of a hole extension and a shape of a gate electrode corresponding thereto. Thus, like reference numerals refer to like elements, and repetitive explanations thereon may be omitted herein.

Referring to FIG. 35, the vertical memory device may include a plurality of first and the second insulation layer patterns 115 and 117 and a plurality of gate electrodes 342, 344 and 346 alternately and repeatedly stacked on a substrate 100, a semiconductor pattern 160 filling a lower portion of a hole 150, which may be formed through the first and the second insulation layer patterns 115 and 117 and the gate electrodes 342, 344 and 346 and have a portion extended horizontally i.e., a seventh hole extension 157, and having a top surface located in the seventh extension hole 157, a first blocking layer pattern 172, a charge storage layer pattern 182 and a tunnel insulation layer pattern 192 sequentially stacked on a portion of a top surface of the semiconductor pattern 160 and a sidewall of the hole 150, and a channel 242 on the tunnel insulation layer pattern 192 contacting a portion of the top surface of the semiconductor pattern 160 in the hole 150.

Each of the holes 150 may include the seventh hole extension 157. The seventh hole extension 157 may have a space horizontally extended when compared to other regions. In example embodiments, the seventh hole extension 157 may be formed through the second insulation layer pattern 117 and portions of the gate electrodes 342, 334 and 346. In the present embodiment, the seventh hole extension 157 may be formed through the second insulation layer pattern 117 at 2 levels and GSL 345 at 2 levels, and thus the seventh hole extension 157 may have a vertical length corresponding to the sum of thicknesses of two second insulation layer patterns 117 and two GSLs 346.

The seventh hole extension 157 may be formed through the second insulation layer pattern 117 at 2 levels and the GSL 346 at 2 levels, unlike the sixth hole extension 156.

Figure 36:
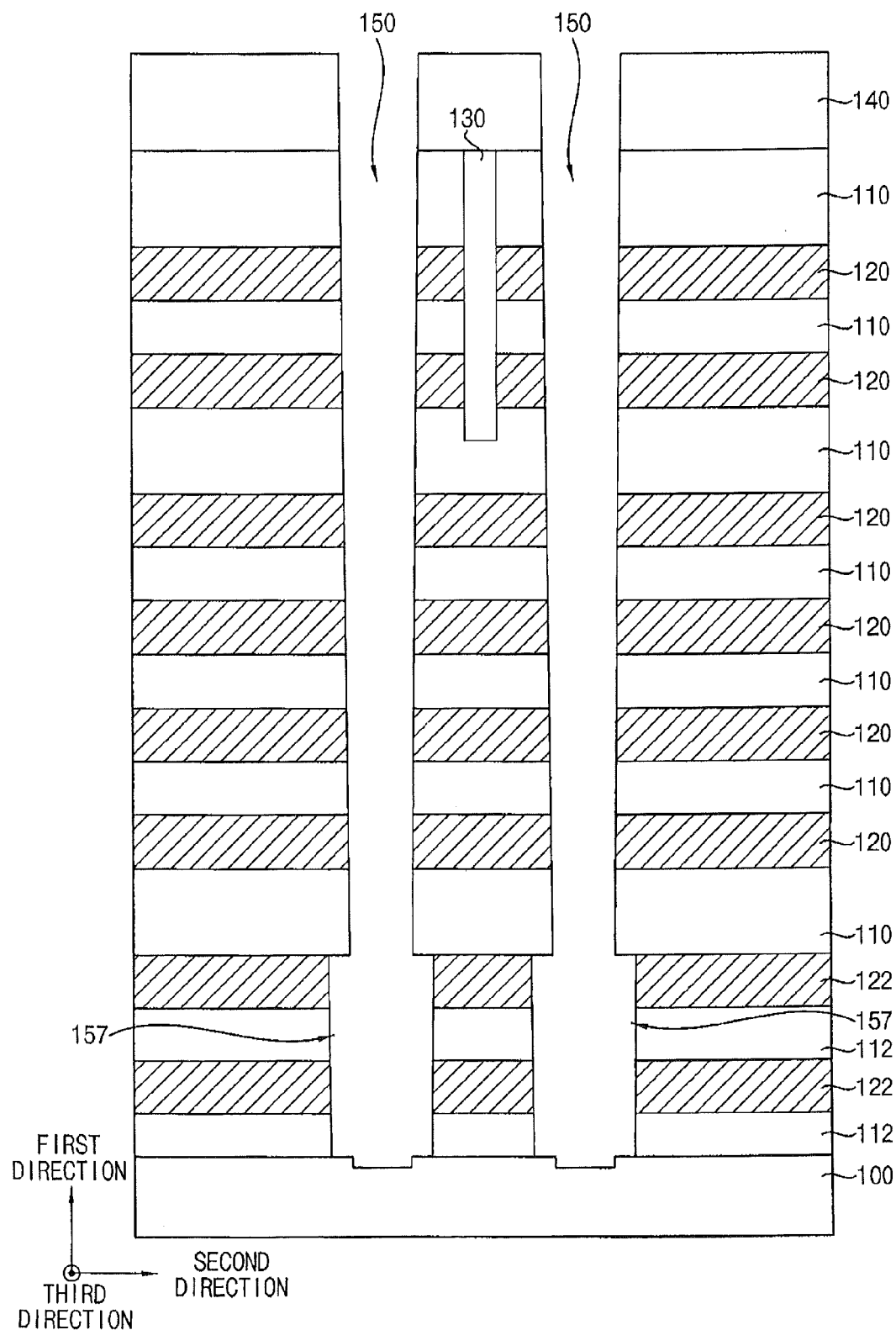

FIG. 36 is a vertical cross-sectional view illustrating a stage of a method of manufacturing a vertical memory device in accordance with example embodiments. The figure illustrates a method of manufacturing the vertical memory device with reference to FIG. 36, however, may not be limited thereto. This method may include processes substantially the same as or similar to those illustrated with reference to FIGS. 32 to 34, and thus like reference numerals refer to like elements, and repetitive explanations thereon may be omitted herein.

First, processes substantially the same as or similar to those illustrated with reference to FIG. 32 may be performed. In the present embodiment, however, a second insulation layer 112 may be formed at 2 levels and a second sacrificial layer 122 may be formed at 2 levels, and a first insulation layer 110 and a first sacrificial layer 120 may be formed at a plurality levels, respectively.

Processes substantially the same as or similar to those illustrated with reference to FIG. 34 may be performed to form a hole 150 including a seventh hole extension 157.

Referring to FIG. 35 again, processes substantially the same as or similar to those illustrated with reference to FIG. 33 may be performed to complete the vertical memory device.

Figure 37:
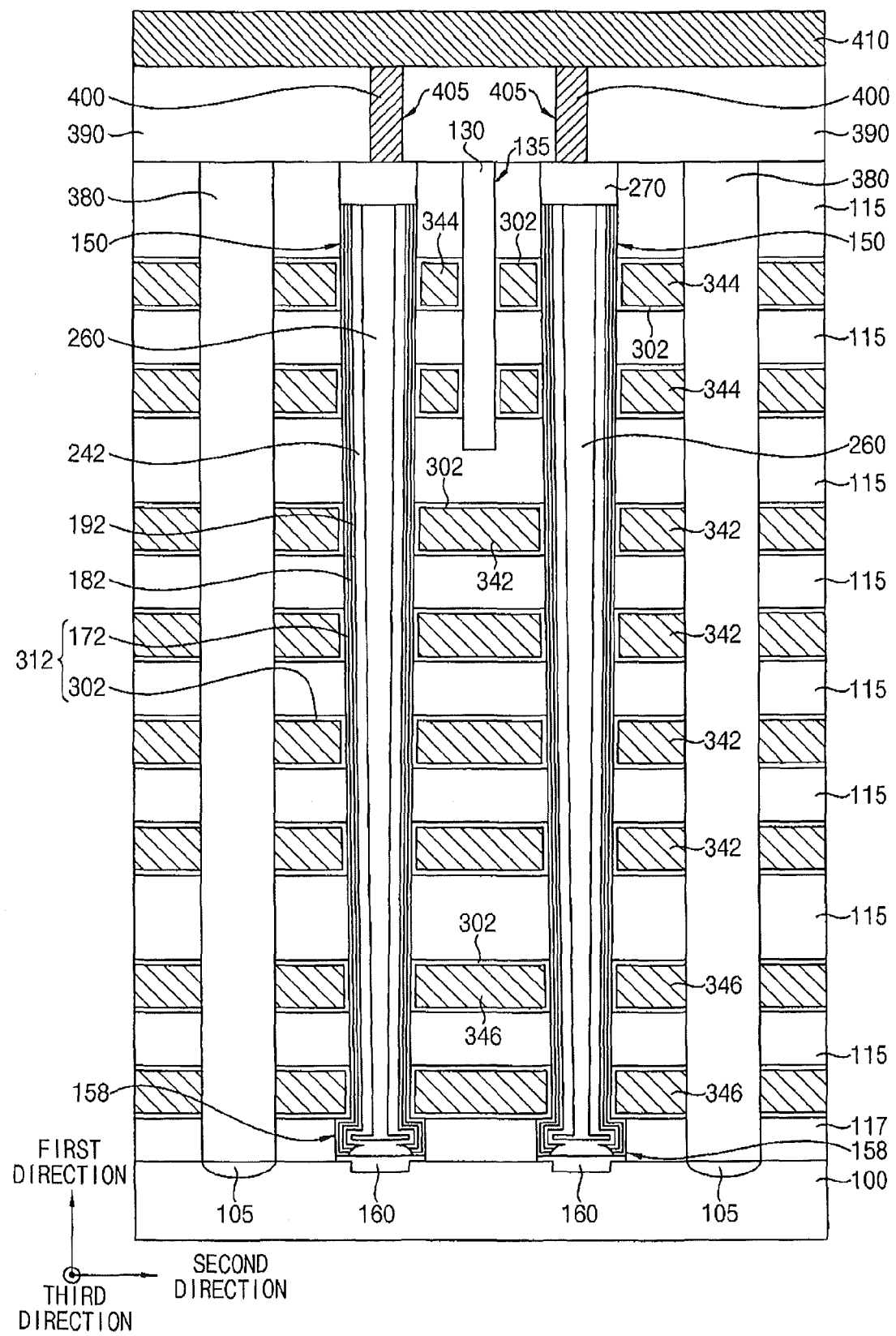

FIG. 37 is a vertical cross-sectional view illustrating a vertical memory device in accordance with example embodiments. The vertical memory device may be substantially the same as that of FIG. 33, except for a shape of a hole extension and a shape of the gate electrode corresponding thereto. Thus, like reference numerals refer to like elements, and repetitive explanations thereon may be omitted herein.

Referring to FIG. 37, the vertical memory device may include a plurality of first and the second insulation layer patterns 115 and 117 and a plurality of gate electrodes 342, 344 and 346 alternately and repeatedly stacked on a substrate 100, a semiconductor pattern 160 filling a lower portion of a hole 150, which may be formed through the first and the second insulation layer patterns 115 and 117 and the gate electrodes 342, 344 and 346, and have a portion extended horizontally i.e., an eighth hole extension 158, and having a portion of a top surface located in the eighth extension hole 157, a first blocking layer pattern 172, a charge storage layer pattern 182 and a tunnel insulation layer pattern 192 sequentially stacked on a portion of the top surface of the semiconductor pattern 160 and a sidewall of the hole 150, and a channel 242 on the tunnel insulation layer pattern 192 contacting a portion of the top surface of the semiconductor pattern 160 in the hole 150.

Each of the holes 150 may include the eighth hole extension 158. The eighth hole extension 158 may have a space horizontally extended when compared to other regions. In example embodiments, the eighth hole extension 158 be formed through the second insulation layer pattern 117 at a single level, and thus, the eighth hole extension 158 may have a vertical length corresponding to a thickness of the second insulation layer pattern 117.

The eighth hole extension 158 may be formed through the second insulation layer pattern 117 at a singe level beneath a GSL 346, unlike the sixth hole extension 156.

Figure 38:
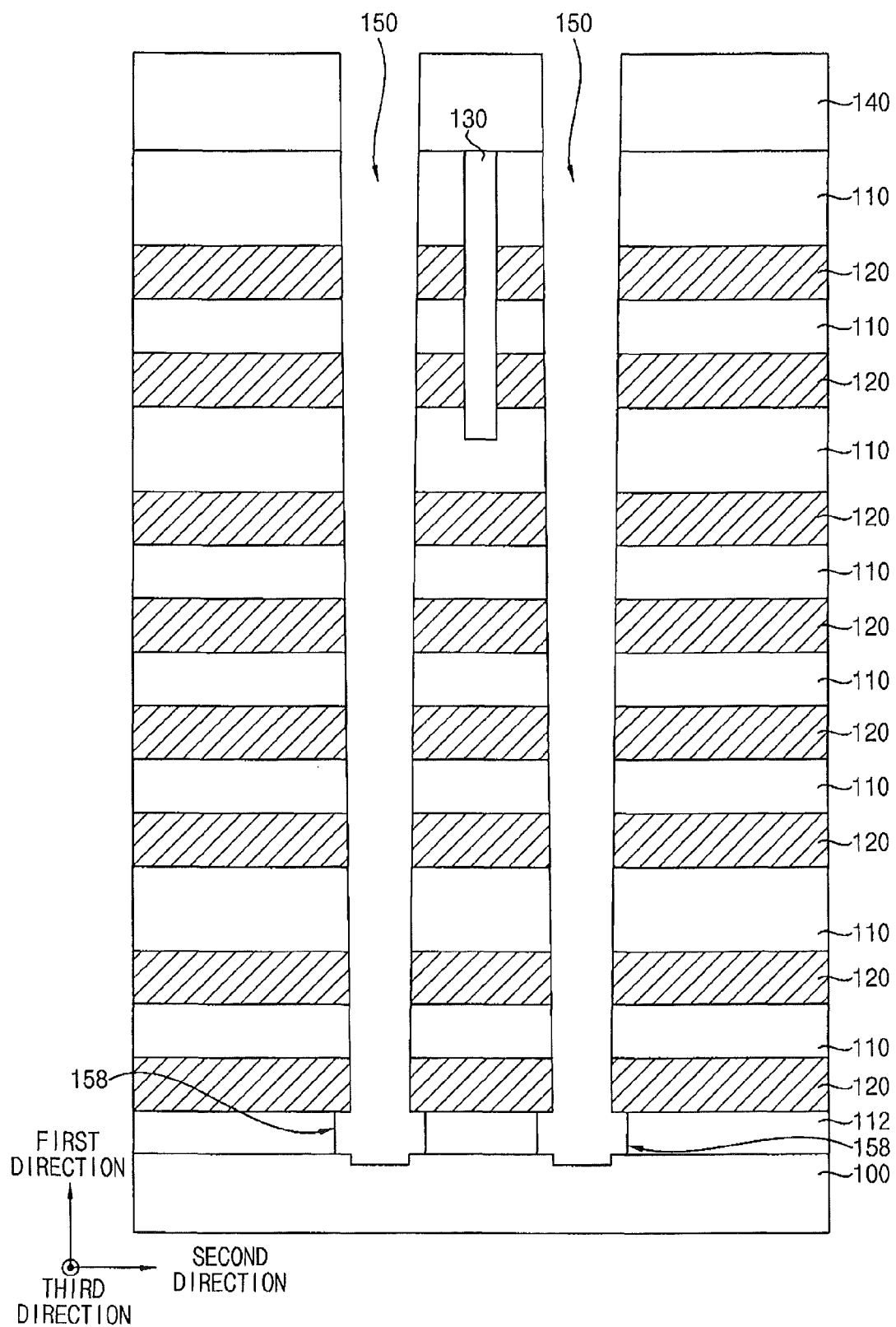

FIG. 38 is a vertical cross-sectional view illustrating a stage of a method of manufacturing a vertical memory device in accordance with example embodiments. The figure illustrates a method of manufacturing the vertical memory device with reference to FIG. 37, however, may not be limited thereto. This method may include processes substantially the same as or similar to those illustrated with reference to FIG. 34, and thus like reference numerals refer to like elements, and repetitive explanations thereon may be omitted herein.

First, processes substantially the same as or similar to those illustrated with reference to FIG. 34 may be performed to form a hole 150 including an eighth hole extension 158. In the present embodiment, however, a second insulation layer 112 may be formed at a singe level on a substrate, and a first insulation layer 110 and a first sacrificial layer 120 may be formed at a plurality levels, respectively.

Referring to FIG. 37 again, processes substantially the same as or similar to those illustrated with reference to FIG. 33 may be performed to complete the vertical memory device.

Figure 39:
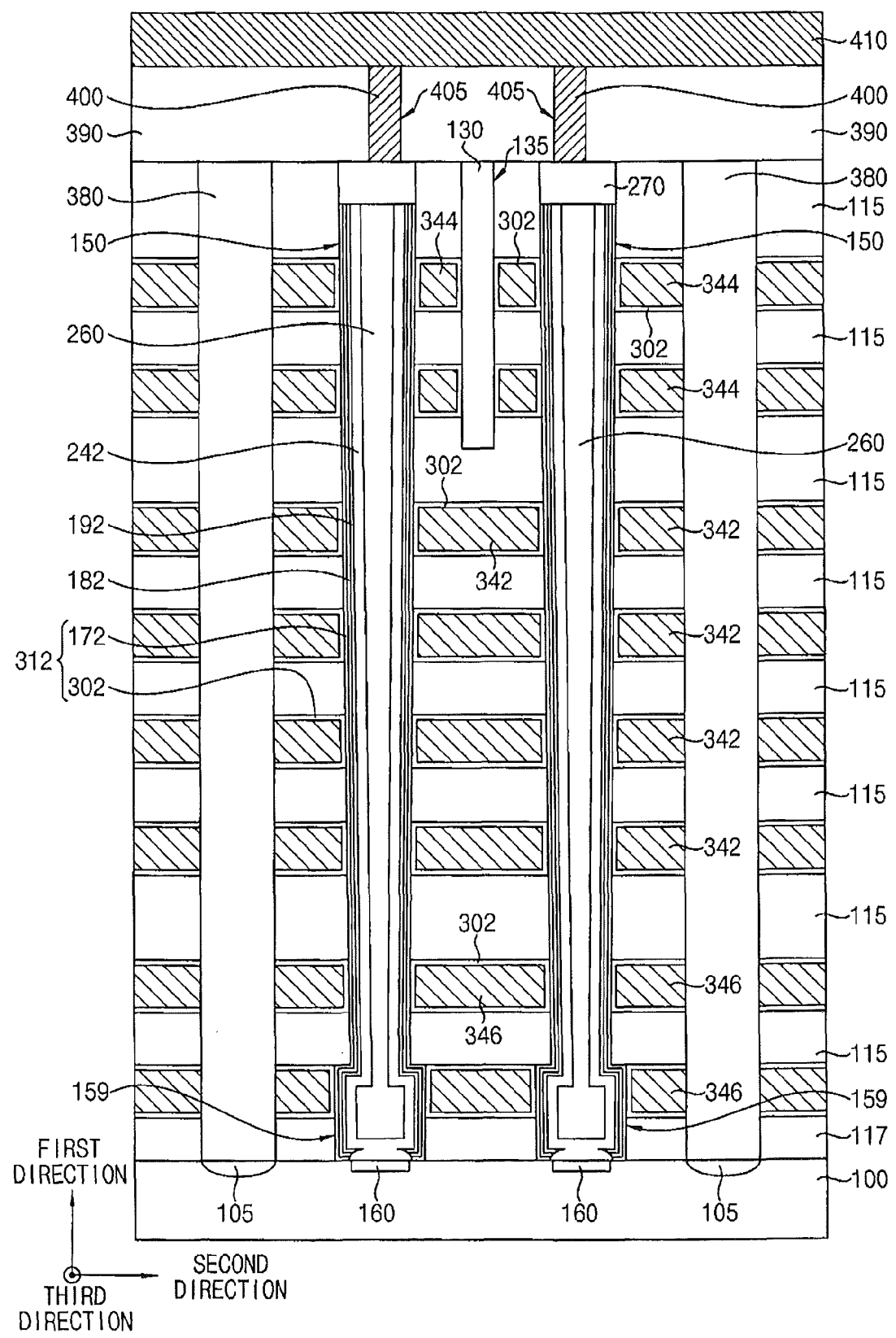

FIG. 39 is a vertical cross-sectional view illustrating a vertical memory device in accordance with example embodiments. The vertical memory device may be substantially the same as that of FIG. 23, except for a shape of a hole extension and a shape of the gate electrode corresponding thereto. Thus, like reference numerals refer to like elements, and repetitive explanations thereon may be omitted herein.

Referring to FIG. 39, the vertical memory device may include a plurality of first and the second insulation layer patterns 115 and 117 and a plurality of gate electrodes 342, 344 and 346 alternately and repeatedly stacked on a substrate 100, a semiconductor pattern 160 filling a lower portion of a hole 150, which may be formed through the first and the second insulation layer patterns 115 and 117 and the gate electrodes 342, 344 and 346 and have a portion extended horizontally i.e., a ninth hole extension 152, and having a top surface located in the ninth extension hole 159, a first blocking layer pattern 172, a charge storage layer pattern 182 and a tunnel insulation layer pattern 192 sequentially stacked on a portion of the top surface of the semiconductor pattern 160 and a sidewall of the hole 150, and a channel 242 on the tunnel insulation layer pattern 192 contacting a portion of the top surface of the semiconductor pattern 160 in the hole 150.

Each of the holes 150 may include the ninth hole extension 159. The ninth hole extension 159 may have a space horizontally extended when compared to other regions. In example embodiments, the ninth hole extension 159 may be formed through the second insulation layer pattern 117 at a single level and a GSL 346 at a single level, and thus, the ninth hole extension 159 may have a vertical length corresponding to the sum of thicknesses of one second insulation layer pattern 117 and one GSL 346.

The ninth hole extension 159 may be formed through the GSL 346 at a single level and the second insulation layer pattern 117 beneath the GSL 346, unlike the second hole extension 152.

Figure 40:
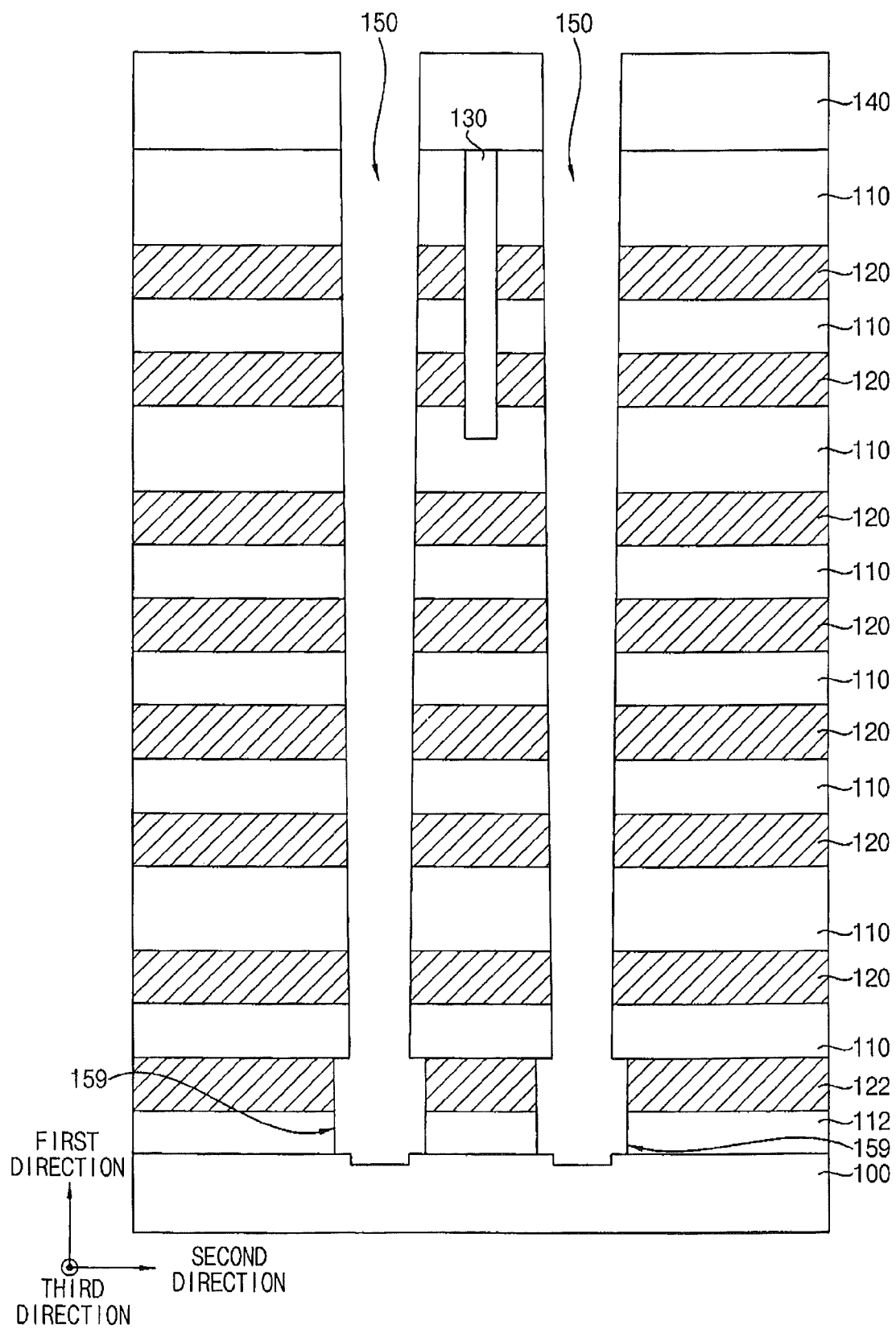

FIG. 40 is a vertical cross-sectional view illustrating a stage of a method of manufacturing a vertical memory device in accordance with example embodiments. The figure illustrates a method of manufacturing the vertical memory device illustrated with reference to FIG. 39, however, may not be limited thereto. This method may include processes substantially the same as or similar to those illustrated with reference to FIGS. 24 to 26, and thus like reference numerals refer to like elements, and repetitive explanations thereon may be omitted herein.

First, processes substantially the same as or similar to those illustrated with reference to FIGS. 24 to 26 may be performed to form a hole 150 including a ninth hole extension 159. In the present embodiment, however, a second insulation layer 112 and a second sacrificial layer 122 may be formed at a singe level, respectively, on the substrate 100, and a first insulation layer 110 and a first sacrificial layer 120 may be formed at a plurality levels, respectively.

Referring to FIG. 37 again, processes substantially the same as or similar to those illustrated with reference to FIG. 27 may be performed to complete the vertical memory device. In the present embodiment, however, the semiconductor pattern 160 may be formed to fill a recess (not shown) formed in a process for forming the hole 150, and a top surface of the semiconductor pattern 160 may be formed to be coplanar with a top surface of the substrate 100 where the recess may not be formed.

The vertical memory devices and the methods of manufacturing the same in accordance with example embodiments may be applied to vertical memory devices having tunnel insulation patterns, charge storage patterns and blocking layer patterns in holes for forming vertical channels.

The hole extension formed by enlarging a portion of the hole and the location of the semiconductor pattern have been illustrated with reference to figures regarding some embodiments, however, may not be limited thereto. For example, arbitrary portions of the insulation layer pattern and the sacrificial layer pattern sequentially stacked on the substrate may be removed to form the hole extension, and the semiconductor pattern may be formed to have the top surface at an arbitrary position in the hole extension.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a vertical memory device, comprising:
forming a plurality of alternating insulation layers and sacrificial layers on a substrate;
partially removing the insulation layers and the sacrificial layers to form a hole exposing a top surface of the substrate;
enlarging a portion of the hole;
forming a semiconductor pattern partially filling the enlarged portion of the hole;
forming a blocking layer, a charge storage layer and a tunnel insulation layer on a sidewall of the hole and the semiconductor pattern;
partially removing the tunnel insulation layer, the charge storage layer and the blocking layer to expose a top surface of the semiconductor pattern;
forming a channel on the exposed top surface of the semiconductor pattern and the tunnel insulation layer; and
replacing the sacrificial layers with gate electrodes.

2. The method of claim 1, wherein forming the insulation layers and the sacrificial layers comprises:
alternately and repeatedly forming a first plurality of first insulation layers and first sacrificial layers on the substrate;
forming at least one second insulation layer and at least one second sacrificial layer on an uppermost one of the first insulation layers and the first sacrificial layers; and
alternately and repeatedly forming a second plurality of first insulation, layers and first sacrificial layers on the second insulation layer and the second sacrificial layer.

3. The method of claim 2, wherein the first insulation layers and the first sacrificial layers comprise silicon oxide and silicon nitride, respectively, and the second insulation layer and the second sacrificial layer comprise doped silicon oxide and doped silicon nitride, respectively.

4. The method of claim 3, wherein the first insulation layers comprise one of plasma enhanced tetraethyl ortho silicate (PE-TEOS), a high density plasma (HDP) oxide and plasma enhanced oxide (PEOX), and the second insulation layer is formed to include one of boro tetraethyl orthosillicate (BTEOS), phosphorous tetraethyl orthosilicate (PTEOS), boro phospho tetraethyl orthosilicate (BPTEOS), boro silicate glass (BSG), phospho silicate glass (PSG) and boro phospho silicate glass (BPSG).

5. The method of claim 2, wherein the first and second insulation layers comprise silicon oxide doped with impurities, and the second insulation layer has a doping concentration higher than that of the first insulation layers.

6. The method of claim 2, wherein the first and second sacrificial layers comprise silicon nitride, and the second sacrificial layer has a nitride concentration higher than that of the first sacrificial layers.

7. The method of claim 2, wherein the first and second sacrificial layers comprise silicon nitride doped with impurities, and the second sacrificial layer has a doping concentration higher than that of the first sacrificial layers.

8. The method of claim 2, wherein the second insulation layer and the second sacrificial layer are formed at temperatures lower than temperatures at which the first insulation layers and the first sacrificial layers are formed.

9. The method of claim 2, wherein enlarging the portion of the hole comprises performing an wet etch process, and wherein the first insulation layers and the first sacrificial layers have wet etching rates higher than wet etching rates of the second insulation layer and the second sacrificial layer, respectively.

10. The method of claim 1, wherein partially removing the tunnel insulation layer, the charge storage layer and the blocking layer to expose the top surface of the semiconductor pattern comprises:

sequentially forming a first channel layer, an etch stop layer and a spacer layer on the tunnel insulation layer;

etching the spacer layer anisotropically to form a spacer;

etching the etch stop layer and the first channel layer using the spacer as an etch mask to expose a portion of the tunnel insulation layer;

wet etching the exposed portion of the tunnel insulation layer and a portion of the charge storage layer therebeneath to expose a portion of the blocking layer; and wet etching the exposed portion of the blocking layer to expose the top surface of the semiconductor pattern.

11. The method of claim 10, wherein wet etching the exposed portion of the tunnel insulation layer and the portion of the charge storage layer therebeneath includes removing the spacer to expose the etch stop layer, and wet etching the exposed portion of the blocking layer includes removing the exposed etch stop layer to expose the first channel layer.

12. The method of claim 11, wherein forming the channel on the exposed top surface of the semiconductor pattern and the tunnel insulation layer includes:

forming a second channel layer including a material substantially the same as that of the first channel layer on the exposed top surface of the semiconductor pattern and the exposed first channel layer.

13. The method of claim 1, wherein forming the insulation layers and the sacrificial layers on the substrate comprises:

forming a first plurality of first insulation layers and first sacrificial layers alternately and repeatedly on the substrate;

forming a second insulation layer on an uppermost one of the first sacrificial layers;

forming a second plurality of first sacrificial layers and first insulation layers alternately and repeatedly on the second insulation layer.

14. The method of claim 1, wherein forming the semiconductor pattern includes performing a selective epitaxial growth (SEG) process using the exposed top surface of the substrate as a seed to form the semiconductor pattern having a top surface located in the enlarged portion of the hole.

15. A method of manufacturing a vertical memory device, comprising:

forming a plurality of alternating insulation layers and sacrificial layers on a substrate;

forming a hole through the plurality of alternating insulation layers and sacrificial layers exposing a top surface of the substrate;

enlarging an interior portion of the hole;

forming a semiconductor pattern in the enlarged portion of the hole;

forming an insulation layer on a sidewall of the hole and the semiconductor pattern;

partially removing the insulation layer to expose a top surface of the semiconductor pattern; and forming a semiconductor region on the exposed top surface of the semiconductor pattern and the insulation layer.

* * * * *